US009383395B1

(12) United States Patent
Ogirko et al.

(10) Patent No.: US 9,383,395 B1
(45) Date of Patent: Jul. 5, 2016

(54) CHARGE BALANCING CONVERTER USING A PASSIVE INTEGRATOR CIRCUIT

(71) Applicant: Parade Technologies, Ltd., Santa Clara, CA (US)

(72) Inventors: Roman Ogirko, Lviv (UA); Andriy Maharyta, Lviv (UA); Viktor Kremin, Lviv (UA); Hans Klein, Pleasanton, CA (US); Volodymyr Bihday, Lviv (UA); Oleksandr Karpin, Lviv (UA)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 0 days.

(21) Appl. No.: 14/262,614

(22) Filed: Apr. 25, 2014

Related U.S. Application Data

(60) Provisional application No. 61/816,494, filed on Apr. 26, 2013, provisional application No. 61/866,693, filed on Aug. 16, 2013.

(51) Int. Cl.
*G01R 31/00* (2006.01)
*G01R 27/26* (2006.01)
(52) U.S. Cl.
CPC ................................. *G01R 27/2605* (2013.01)
(58) Field of Classification Search
CPC ......... G01R 27/2605; G01D 5/24; G01L 9/12

USPC .......................................................... 324/679
See application file for complete search history.

(56) References Cited

U.S. PATENT DOCUMENTS

| 5,132,631 | A | * | 7/1992 | Klopfenstein et al. | ......... 324/676 |
| 8,810,263 | B1 | * | 8/2014 | Wilson | ................... G01R 27/26 |
| | | | | | 324/658 |
| 2009/0002206 | A1 | * | 1/2009 | Kremin | ........................... 341/33 |
| 2011/0001492 | A1 | * | 1/2011 | Nys et al. | ...................... 324/658 |
| 2011/0261006 | A1 | * | 10/2011 | Joharapurkar et al. | ........ 345/174 |
| 2012/0256869 | A1 | * | 10/2012 | Walsh et al. | ................... 345/174 |
| 2013/0278538 | A1 | * | 10/2013 | Brunet et al. | ................... 345/174 |
| 2013/0307811 | A1 | * | 11/2013 | Hanssen et al. | ................ 345/174 |

* cited by examiner

*Primary Examiner* — Thomas F Valone
(74) *Attorney, Agent, or Firm* — Morgan, Lewis & Bockius LLP

(57) ABSTRACT

A method, apparatus, and system are described to perform, by a capacitance-sensing circuit, capacitance sensing of an electrode of a capacitive sense array of electrodes. Performing the capacitance sensing includes integrating, on a passive integrator circuit, charge from a sensed capacitance of the electrode of the capacitive sense array. The passive integrator circuit integrates the charge on a self-capacitance of the electrode as part of the integrating. The capacitance-sensing circuit converts the charge from the sensed capacitance of the electrode into a digital value representing the sensed capacitance of the electrode.

20 Claims, 44 Drawing Sheets

Transfer function of accumulating structure based on passive integrator

CHARGE BALANCING CONVERTER USING A PASSIVE INTEGRATOR CIRCUIT

RELATED APPLICATIONS

This application claims the benefit of U.S. Provisional Application No. 61/816,494, filed Apr. 26, 2013, and U.S. Provisional Application No. 61/866,693, filed Aug. 16, 2013, the entire contents of which are hereby incorporated by reference herein in their entirety.

TECHNICAL FIELD

The present disclosure relates generally to sensing systems, and more particularly to capacitance-sensing systems configurable to determine locations of touches on the capacitive-sensing systems, the capacitive-sensing system includes a charge balancing converter and a passive integrator circuit.

BACKGROUND

Capacitance sensing systems can sense electrical signals generated on electrodes that reflect changes in capacitance. Such changes in capacitance can indicate a touch event (e.g., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing user interface options in existing products. Capacitive sense elements can range from a single button to a large number arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit has access to both electrodes of the capacitor; 2) self-capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and Cypress' touch solutions sense both capacitances either uniquely or in hybrid form with its various sense modes.

BRIEF DESCRIPTION OF THE DRAWINGS

The present invention is illustrated by way of example, and not of limitation, in the figures of the accompanying drawings.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Figure 1:
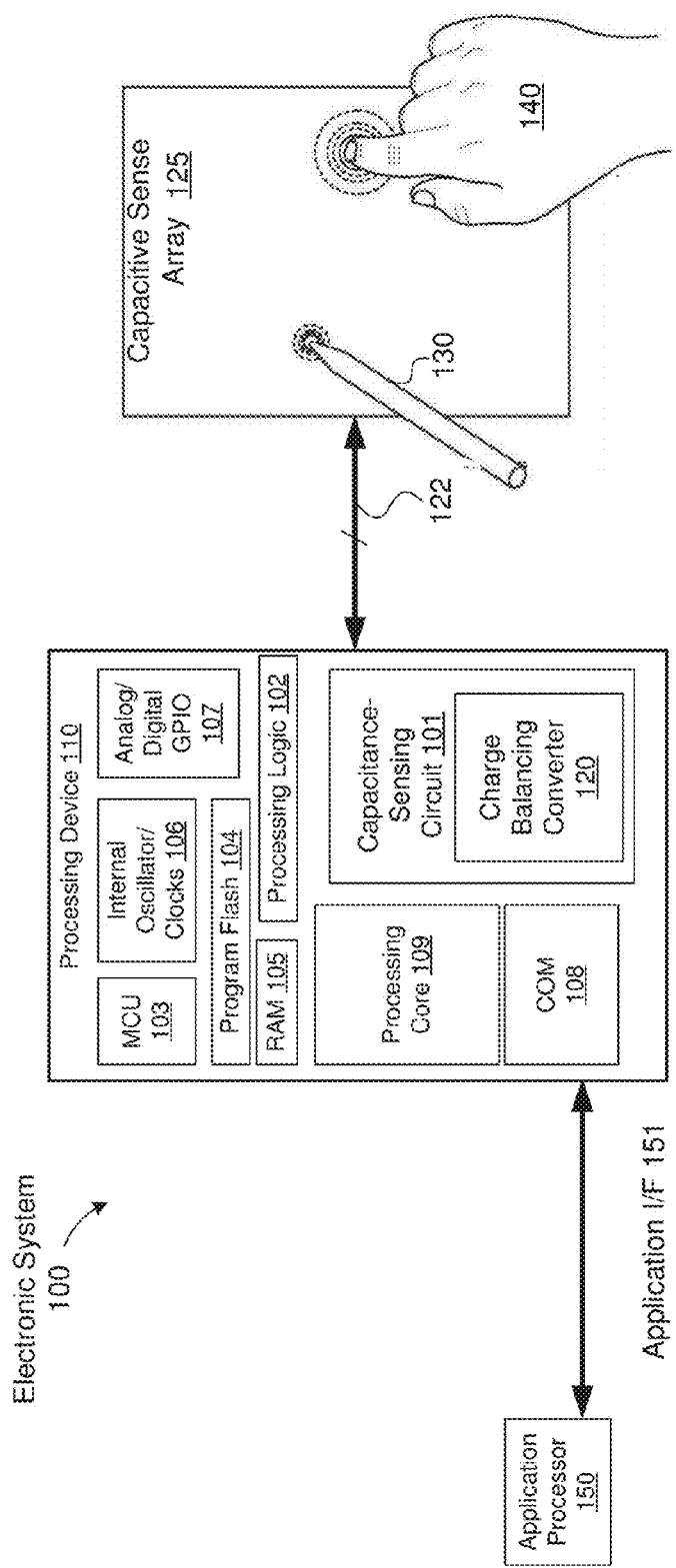
FIG. 1 is a block diagram illustrating one embodiment of an electronic system having a processing device, including a charge balancing converter.

FIG. 1 is a block diagram illustrating one embodiment of an electronic system having a processing device, including a charge balancing converter. Details regarding the charge balancing converter 120 are described in more detail with respect to FIGS. 3-43. The processing device 110 is configured to detect one or more touches detected proximate to a touch-sensing device, such as capacitive sense array 125. The processing device 110 can detect conductive objects, such as touch objects 140 (fingers or passive styluses, an active stylus 130, or any combination thereof). The capacitance-sensing circuit 101 can measure touch data created by a touch using the capacitive sense array 125. The touch may be detected by a single or multiple sensing cells, each cell representing an isolated sense element or an intersection of sense elements (e.g., electrodes) of the capacitive sense array 125. In one embodiment, when the capacitance-sensing circuit 101 measures mutual capacitance of the touch-sensing device (e.g., using capacitive sense array 125), the capacitance-sensing circuit 101 acquires a 2D capacitive image of the touch-sensing object and processes the data for peaks and positional information. In another embodiment, the processing device 110 is a microcontroller that obtains a capacitance touch signal data set from application processor 150, such as from capacitive sense array 125, and finger detection firmware executing on the microcontroller identifies data set areas that indicate touches, detects and processes peaks, calculates the coordinates, or any combination therefore. The microcontroller can report the precise coordinates to an application processor, as well as other information.

Electronic system 100 includes processing device 110, capacitive sense array 125, stylus 130, and application processor 150. The capacitive sense array 125 may include capacitive sense elements that are electrodes of conductive material, such as copper. The sense elements may also be part of an indium-tin-oxide (ITO) panel. The capacitive sense elements can be used to allow the capacitance-sensing circuit 101 to measure self-capacitance, mutual capacitance, or any combination thereof. In the depicted embodiment, the electronic system 100 includes the capacitive sense array 125 coupled to the processing device 110 via bus 122. The capacitive sense array 125 may include a multi-dimension capacitive sense array. The multi-dimension sense array includes multiple sense elements, organized as rows and columns. In another embodiment, the capacitive sense array 125 is non-transparent capacitive sense array (e.g., PC touchpad). The capacitive sense array 125 may be disposed to have a flat surface profile. Alternatively, the capacitive sense array 125 may have non-flat surface profiles. Alternatively, other configurations of capacitive sense arrays may be used. For example, instead of vertical columns and horizontal rows, the capacitive sense array 125 may have a hexagon arrangement, or the like, as would be appreciated by one of ordinary skill in the art having the benefit of this disclosure. In one embodiment, the capacitive sense array 125 may be included in an ITO panel or a touch screen panel.

The operations and configurations of the processing device 110 and the capacitive sense array 125 for detecting and tracking the touch object 140 and stylus 130 are described herein. In short, the processing device 110 is configurable to detect a presence of the touch object 140, a presence of a stylus 130 on the capacitive sense array 125, or any combination thereof. If the touching object is an active stylus, in one embodiment, the active stylus 130 is configurable to operate as the timing "master," and the processing device 110 adjusts the timing of the capacitive sense array 125 to match that of the active stylus 130 when the active stylus 130 is in use. In one embodiment, the capacitive sense array 125 capacitively couples with the active stylus 130, as opposed to conventional inductive stylus applications. It should also be noted that the same assembly used for the capacitive sense array 125, which is configurable to detect touch objects 140, is also used to detect and track a stylus 130 without an additional PCB layer for inductively tracking the active stylus 130.

In the depicted embodiment, the processing device 110 includes analog and/or digital general purpose input/output ("GPIO") ports 107. GPIO ports 107 may be programmable. GPIO ports 107 may be coupled to a Programmable Interconnect and Logic ("PIL"), which acts as an interconnect between GPIO ports 107 and a digital block array of the processing device 110 (not shown). The digital block array may be configurable to implement a variety of digital logic circuits (e.g., DACs, digital filters, or digital control systems) using, in one embodiment, configurable user modules ("UMs"). The digital block array may be coupled to a system bus. Processing device 110 may also include memory, such as random access memory ("RAM") 105 and program flash 104. RAM 105 may be static RAM ("SRAM"), and program flash 104 may be a non-volatile storage, which may be used to store firmware (e.g., control algorithms executable by processing core 109 to implement operations described herein). Processing device 110 may also include a memory controller unit ("MCU") 103 coupled to memory and the processing core 109. The processing core 109 is a processing element configured to execute instructions or perform operations. The processing device 110 may include other processing elements as would be appreciated by one of ordinary skill in the art having the benefit of this disclosure. It should also be noted that the memory may be internal to the processing device or external to it. In the case of the memory being internal, the memory may be coupled to a processing element, such as the processing core 109. In the case of the memory being external to the processing device, the processing device is coupled to the other device in which the memory resides as would be appreciated by one of ordinary skill in the art having the benefit of this disclosure.

In one embodiment, the processing device 110 further includes processing logic 102. Some or all of the operations of the processing logic 102 may be implemented in firmware, hardware, or software or some combination thereof. The processing logic 102 may receive signals from the capacitance-sensing circuit 101, and determine the state of the capacitive sense array 125, such as whether an object (e.g., a finger) is detected on or in proximity to the capacitive sense array 125 (e.g., determining the presence of the object), resolve where the object is on the sense array (e.g., determining the location of the object), tracking the motion of the object, or other information related to an object detected at the touch sensor. In another embodiment, processing logic 102 may include capacitance-sensing circuit 101. In another embodiment, processing logic 102 may perform some or all the functions of capacitance-sensing circuit 101 and/or processing device 110.

The processing device 110 may also include an analog block array (not shown) (e.g., field-programmable analog array). The analog block array is also coupled to the system bus. Analog block array may also be configurable to implement a variety of analog circuits (e.g., ADCs or analog filters) using, in one embodiment, configurable UMs. The analog block array may also be coupled to the GPIO 107.

As illustrated, capacitance-sensing circuit 101 may be integrated into processing device 110. Capacitance-sensing circuit 101 may include analog I/O for coupling to an external component, such as touch-sensor pad (not shown), capacitive sense array 125, touch-sensor slider (not shown), touch-sensor buttons (not shown), and/or other devices. The capacitance-sensing circuit 101 may be configurable to measure capacitance using mutual-capacitance sensing techniques, self-capacitance sensing technique, charge-coupling techniques, charge balancing techniques or the like. In one embodiment, capacitance-sensing circuit 101 operates using a charge accumulation circuit, a capacitance modulation circuit, or other capacitance sensing methods known by those skilled in the art. In an embodiment, the capacitance-sensing circuit 101 is of the Cypress TMA-3xx, TMA-4xx, or TMA-xx families of touch screen controllers. Alternatively, other capacitance-sensing circuits may be used. The mutual capacitive sense arrays, or touch screens, as described herein, may include a transparent, conductive sense array disposed on, in, or under either a visual display itself (e.g. LCD monitor), or a transparent substrate in front of the display. In an embodiment, the TX and RX electrodes are configured in rows and columns, respectively. It should be noted that the rows and columns of electrodes can be configured as TX or RX electrodes by the capacitance-sensing circuit 101 in any chosen combination. In one embodiment, the TX and RX electrodes of the sense array 125 are configurable to operate as a TX and RX electrodes of a mutual capacitive sense array in a first mode to detect touch objects, and to operate as electrodes of a coupled-charge receiver in a second mode to detect a stylus on the same electrodes of the sense array. The stylus, which generates a stylus TX signal when activated, is used to couple charge to the capacitive sense array, instead of measuring a mutual capacitance at an intersection of a RX electrode and a TX electrode (a sense element) as done during mutual-capacitance sensing. An intersection between two sense elements may be understood as a location at which one sense electrode crosses over or overlaps another, while maintaining galvanic isolation from each other. The capacitance associated with the intersection between a TX electrode and an RX electrode can be sensed by selecting every available combination of TX electrode and RX electrode. When a touch object, such as a finger or stylus, approaches the capacitive sense array 125, the object causes a decrease in mutual capacitance between some of the TX/RX electrodes. In another embodiment, the presence of a finger increases the capacitance of the electrodes to the environment (Earth) ground, typically referred to as self-capacitance change. Utilizing the change in mutual capacitance, the location of the finger on the capacitive sense array 125 can be determined by identifying the RX electrode having a decreased coupling capacitance between the RX electrode and the TX electrode to which the TX signal was applied at the time the decreased capacitance was measured on the RX electrode. Therefore, by sequentially determining the capacitances associated with the intersection of electrodes, the locations of one or more touch objects can be determined. It should be noted that the process can calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art having the benefit of this disclosure. In addition, various types of coordinate interpolation algorithms may be used to detect the center of the touch as would be appreciated by one of ordinary skill in the art having the benefit of this disclosure.

The capacitance-sensing circuit 101 includes the charge balancing converter 120. In addition, the charge balancing converter 120 may be used in conjunction with a passive integrator circuit (not shown). The passive integrator circuit may be off-chip discrete component, on-chip, part of capacitive sense array 125, or any combination of the above. Additional details of the charge balancing converter 120 and passive integrator circuit are described below with respect to FIGS. 3-43.

Processing device 110 may include internal oscillator/clocks 106 and communication block ("COM") 108. In another embodiment, the processing device 110 includes a spread-spectrum clock (not shown). The oscillator/clocks block 106 provides clock signals to one or more of the components of processing device 110. Communication block 108 may be used to communicate with an external component, such as an application processor 150, via application interface ("I/F") line 151.

Processing device 110 may reside on a common carrier substrate such as, for example, an integrated circuit ("IC") die substrate, a multi-chip module substrate, or the like. Alternatively, the components of processing device 110 may be one or more separate integrated circuits and/or discrete components. In one exemplary embodiment, processing device 110 is the Programmable System on a Chip (PSoC®) processing device, developed by Cypress Semiconductor Corporation, San Jose, Calif. Alternatively, processing device 110 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to an application processor, but may include a system that measures the capacitance on the sensing device and sends the raw data to a host computer where it is analyzed by an application. In effect, the processing that is done by processing device 110 may also be done in the application processor.

Capacitance-sensing circuit 101 may be integrated into the IC of the processing device 110, or alternatively, in a separate IC. Alternatively, descriptions of capacitance-sensing circuit 101 may be generated and compiled for incorporation into other integrated circuits. For example, behavioral level code describing the capacitance-sensing circuit 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe capacitance-sensing circuit 101.

It should be noted that the components of electronic system 100 may include all the components described above. Alternatively, electronic system 100 may include some of the components described above.

In one embodiment, the electronic system 100 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one embodiment, these sensing devices include one or more capacitive sensors or other types of capacitance-sensing circuitry. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

Figure 2:
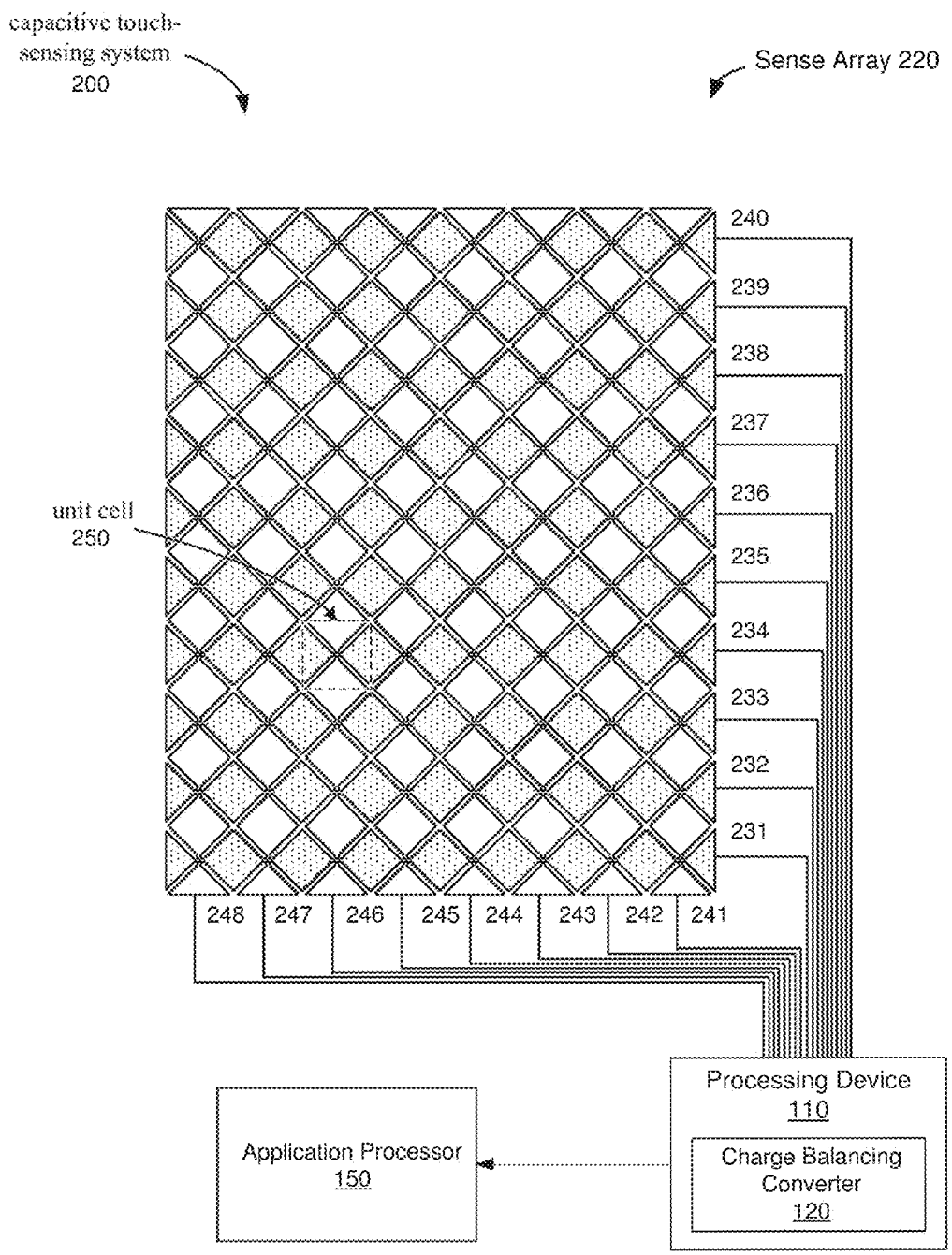
FIG. 2 illustrates a capacitive-sense touch-sensing system, according to one embodiment.

FIG. 2 illustrates a capacitive-sense touch-sensing system, according to one embodiment. Capacitive touch-sensing system 200 includes a sense array 220. Sense array 220 may be a capacitive-sense array. Sense array 220 includes multiple row electrodes 231-240 and multiple column electrodes 241-248. The row and column electrodes 231-248 are connected to a processing device 110, which may include the functionality of capacitance-sensing circuit 101, as illustrated in FIG. 1. In one embodiment, the processing device 110 may perform mutual capacitance measurement scans of the sense array 220 to measure a mutual capacitance value associated with each of the intersections between a row electrode and a column electrode in the sense array 220. The measured capacitances may be further processed to determine centroid locations of one or more contacts of conductive objects proximate to the sense array 220.

In one embodiment, the processing device 110 is connected to an application processor 150 which may receive the measured capacitances or calculated centroid locations from the processing device 110.

The sense array 220 illustrated in FIG. 2 includes electrodes arranged to create a pattern of interconnected diamond shapes. Specifically, the electrodes 231-248 of sense array 220 form a single solid diamond (SSD) pattern. In one embodiment, each intersection between a row electrode and a column electrode defines a unit cell. Each point within the unit cell is closer to the associated intersection than to any other intersection. For example, unit cell 250 contains the points that are closest to the intersection between row electrode 234 and column electrode 246.

In one embodiment, capacitive touch-sensing system 200 may collect data from the entire touch-sensing surface of sense array 220 by performing a scan to measure capacitances of the unit cells that comprise the touch-sensing surface, then process the touch data serially or in parallel with a subsequent scan. For example, one system that processes touch data serially may collect raw capacitance data from each unit cell of the entire touch-sensing surface, and filter the raw data. Based on the filtered raw data, the system may determine local maxima (corresponding to local maximum changes in capacitance) to calculate positions of fingers or other conductive objects, then perform post processing of the resolved positions to report locations of the conductive objects, or to perform other functions such as motion tracking or gesture recognition.

In one embodiment, capacitive touch-sensing system 200 may be configured to perform both of self-capacitance sensing and mutual capacitance sensing. In one embodiment, capacitive touch-sensing system 200 is configured to perform self-capacitance sensing, in sequence or in parallel, to measure the self-capacitance of each row and column electrode of the touch-sensing surface (e.g., sense array 220), such that the total number of sense operations is N+M, for a capacitive-sense array having N rows and M columns. In one embodiment, capacitive touch sensing system 200 may be capable of connecting individual electrodes together to be sensed in parallel with a single operation. For example, multiple row (e.g., electrodes 231-240) and or column electrodes (e.g., electrodes 241-248) may be coupled together and sensed in a single operation to determine whether a conductive object is touching or near the touch-sensing surface. In an alternate embodiment, the capacitive touch-sensing system 200 may be capable of connecting each row electrode to it is own sensing circuit such that all row electrodes may be sensed in parallel with a single operation. The capacitive touch-sensing system 200 may also be capable of connecting each column electrode to its own sensing circuit such that all column electrodes may be sensed in parallel with a single operation. The capacitive touch-sensing system 200 may also be capable of connecting all row and column electrodes to their own sensing circuits, such that all row and column electrodes may be sensed in parallel with a single operation.

In one embodiment, the capacitive touch-sensing system 200 may perform mutual capacitance sensing of the touch-sensing surface (e.g., sense array 220) by individually sensing each intersection between a row electrode and a column electrode. Thus, a total number of sense operations for a capacitive-sense array (e.g., sense array 220) having X rows and Y columns is X×Y. In one embodiment, performing a mutual capacitance measurement of a unit cell formed at the intersection of a row electrode and a column electrode includes applying a signal (TX) to one electrode and measuring characteristics of the signal on another electrode resulting from the capacitive coupling between the electrodes.

In one embodiment, multiple capacitance-sensing circuits may be used in parallel to measure a signal coupled to multiple column electrodes simultaneously, from a signal applied to one or more row electrodes. In one embodiment, for a capacitive-sense array (e.g., sense array 220) having X rows, Y columns, and N columns that can be sensed simultaneously, the number of mutual capacitance sensing operations is the smallest whole number greater than or equal to X×Y/N.

In one embodiment, each update of the touch locations may include a sensing portion and a non-sensing portion. The sensing portion may include measurement of capacitance associated with intersections between electrodes, while the non-sensing portion may include calculation of touch locations based on the capacitance measurements and reporting of the calculated touch locations to a host device.

In one embodiment, capacitive touch-sensing system 200 includes charge balancing converter 120. In addition capacitive touch-sensing system 200 may include an integrator circuit (not shown).

Figure 3:
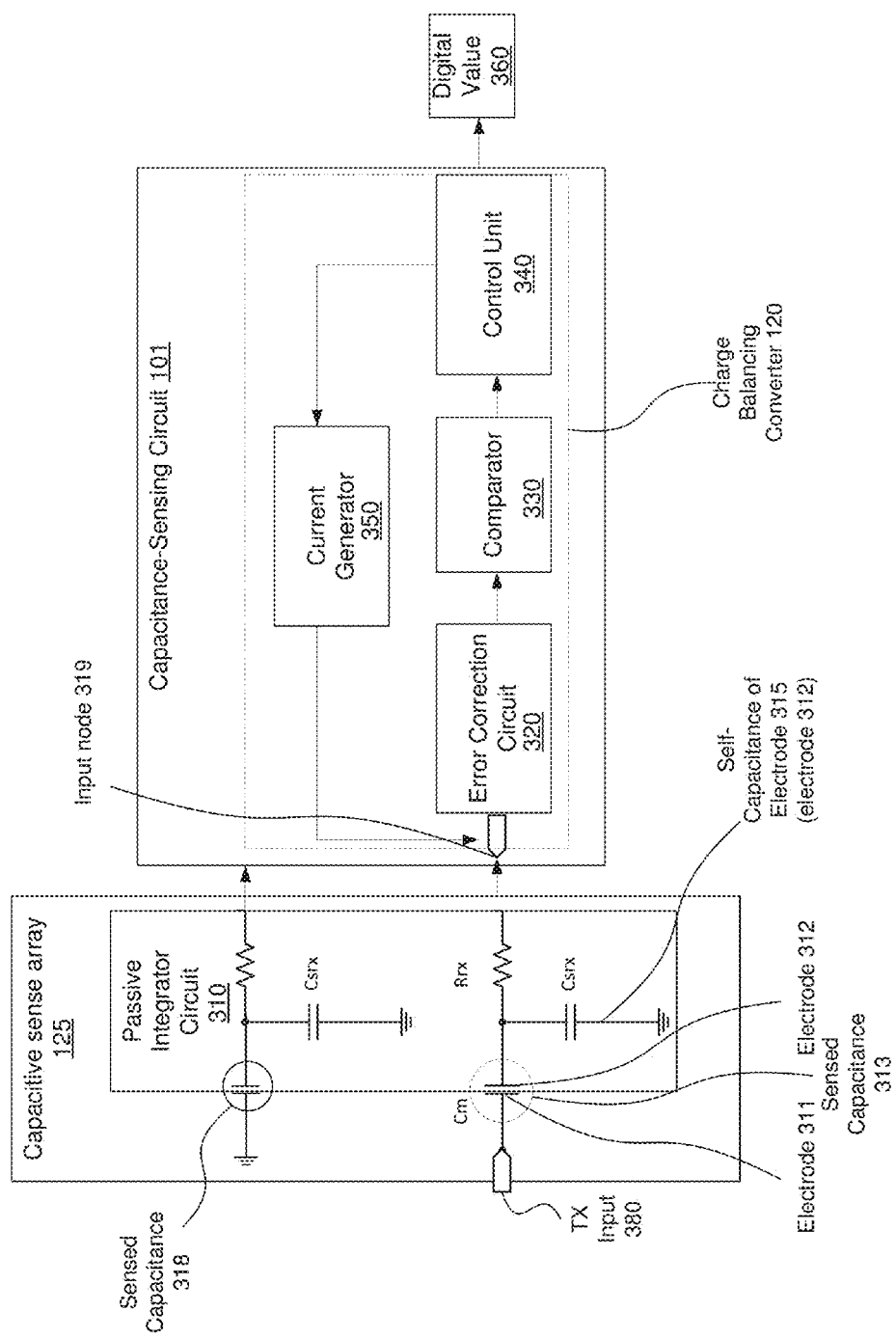
FIG. 3 is a block diagram of a charge balancing converter and a passive integrator circuit, according to one embodiment.

FIG. 3 is a block diagram of a charge balancing converter and a passive integrator circuit, according to one embodiment. The charge balancing converter 120 includes an error correction circuit 320, a comparator circuit 330, a control unit 340, and current generator 350. TX input 380 (e.g., transmission input) illustrates where a TX signal may be received. In one embodiment, control unit 340 generates a TX signal. In one embodiment, control unit 340 includes a counter (not shown) to convert a measured capacitance from capacitive sense array 125 into a digital value 360. Alternatively, other circuits may be used to convert an input signal into a digital value. The charge balancing converter 120 may be part of capacitance-sensing circuit 101. A touchscreen controller may be coupled to capacitive sense array 125. The sense array may be constructed of indium-tin-oxide (ITO). The touch screen controller measures input current from the capacitive sense array 125. The input current is used to create a digital value 360. The digital value 360 is used to calculate touch position.

In one embodiment, capacitance-sensing circuit 101 performs capacitance sensing of an electrode (e.g., electrode 312) of the capacitive sense array 125. A touch proximate capacitive sense array 125 causes charge to be integrated onto passive integrator circuit 310. The touch may be sensed when capacitance-sensing circuit 101 operates in self-capacitance sensing mode, illustrated by sensed capacitance 318, or mutual capacitance sensing mode, as illustrated by sensed capacitance 313. Charge integrated on passive integrator circuit 310 may be integrated on an integrating capacitor, such as self-capacitance of electrode 315. In another embodiment, the integrating capacitor may be an discrete capacitor or a capacitor internal to capacitance-sensing circuit 101. The passive integrator circuit 310 is coupled to the error correction circuit 320. The error correction circuit 320 controls the comparator 330 tripping voltage (a.k.a., reference voltage). Error correction circuit 320 senses the charge on the passive integrator circuit 310 and any accumulated charge error from conversions and provides comparator 330 with a tripping voltage at the comparator input. When comparator 330 is tripped, the output of comparator 330 is sensed by control unit 340. In response, control unit 340 sends a control signal to current generator 350. Current generator 350 sinks or sources current to balance charge at input node 319. Balancing charge at input 319 may include balancing charge on the integrating capacitor, such as self-capacitance of electrode 315. Balancing may mean the current generator 350 sinks or sources current at input node 319 until the voltage at input node 319 crosses the tripping voltage threshold (e.g., reference voltage threshold) of comparator 330. When the tripping voltage threshold hold is crossed, the output of comparator 330 changes state, which signals control unit 340 to turn off current generator 350. It should be noted that when a comparator changes state, the comparator trips. A comparator trips when an input voltage at one input of the comparator crosses, in either direction, a triggering voltage at another input of the comparator. A counter (not shown) measures the balancing period. The balancing period is the length of time input node 319 is charged and discharged during balancing. The balancing period is converted into digital value 360. Charge error from the conversion is stored on error correction circuit 320 and accumulated over multiple conversions until the accumulate charge error is converted to digital value 360.

In one embodiment, capacitance-sensing circuit 101 performs capacitance sensing of an electrode (e.g., electrode 312 as part of sensed capacitance 313) of a capacitive sense array of electrodes (e.g., capacitive sense array 125). In performing the capacitance sensing, charge from the sensed capacitance (e.g., sensed capacitance 313) of the electrode (e.g., electrode 312) is integrated on the passive integrator circuit 310. The charge may be integrated on the self-capacitance of the electrode (e.g., self-capacitance of electrode 315). In another embodiment, charge may be integrated on a separate capacitor, such as a discrete capacitor or a capacitor on capacitance-sensing circuit 101. The capacitance-sensing circuit 101 may convert the charge from the sense capacitance into a digital value 360.

In one embodiment, error correction circuit 320 accumulates quantization error from the conversion of the charge from the sensed capacitance (e.g., sensed capacitance 313) of the electrode into the digital value 360. In another embodiment, error correction circuit 320 samples the quantization error from the current conversion and stores the quantization error from the current conversion at error correction circuit 320. The quantization error of the current conversion is added to the quantization error of the previous conversion. In another embodiment, the error correction circuit 320 accumulates quantization error over successive conversion cycles and converts the accumulated quantization error into the digital value 360. The conversion cycle may be one cycle of integrating charge from the sensed capacitance (e.g., sensed capacitance 313) and converting the charge into a digital value 360.

In another embodiment, error correction circuit 320 corrects errors from prior conversions. When the accumulated charge error adds up to one count, the accumulated charge error may be converted into a digital value 360. In another embodiment, the error correction circuit 320 is part or all an analog circuit. In another embodiment, the passive integrator circuit 310 and the error correction circuit 320 may be used during either mutual capacitance sensing mode or self-capacitance sensing mode. Self-capacitance sensing is discussed in more detail in regards to FIGS. 23-25.

In one embodiment, the comparator 330 compares an output voltage of the error correction circuit 320 to a reference voltage. The comparator produces a comparator output based on the comparison. The current generator 350 balances charge on the passive integrator circuit 310. The current generator 350 sinks or sources charge to the passive integrator circuit 310. Control unit 340 controls the current generator 350 based on at least one of the output of the comparator, the transmission (TX) signal, a blanking signal, a stop signal, or an end of a conversion. The control of the balancing is discussed in more detail in regards to FIGS. 36-41.

In one embodiment, during capacitance sensing of an electrode (e.g., electrode 312 of sensed capacitance 313) charge is integrated on passive integrator circuit 310. The passive integrator circuit 310 may include an integrating capacitor (e.g., self-capacitance of electrode 315). In another embodiment, the integrating capacitor may be an external discrete capacitor or an internal capacitor of capacitance-sensing circuit 101. In one embodiment, part of capacitive sense array 125 may be used as the passive integrator circuit 310. In one embodiment, passive integrator circuit 310 may be a discrete circuit such as an external capacitor. In another embodiment, passive integrator circuit may be located internal to capacitance-sensing circuit 101. In still another embodiment, passive integrator circuit 310 may be external to capacitance-sensing circuit 101. In another embodiment, passive integrator circuit 310 may be any combination of the aforementioned.

In one embodiment, the passive integrator circuit 310 uses no active components. The passive integrator circuit 310 may perform an integration function that is executed on one or more passive elements, such as an external self-capacitance. Charge may be held on an integration capacitor (e.g., self-capacitance of electrode 315) of the passive integrator circuit 310 for a certain period of time. The integration capacitor may be charged, balanced, and compared.

In one embodiment, the integration capacitor (e.g., self-capacitance of electrode 315) may be part of capacitive sense array 125. In another embodiment, the integration capacitor may be the parasitic line capacitance of the sensed electrode (e.g., electrode 312). In one embodiment, the parasitic line capacitance may be the parasitic capacitance of an RX line of the capacitive sense array 125. The parasitic line capacitance may include the total parasitic self-capacitance of the electrode 312. The total parasitic self-capacitance of electrode 312 includes all the parasitic self-capacitance from the electrode plate along the signal path to the external connection of the capacitive sense array 125 for said electrode plate (e.g., output terminal of electrode 312). In FIG. 3, the parasitic capacitance of electrode 312 is represented by capacitor Csrx (e.g., self-capacitance of electrode 315). In another embodiment, the parasitic line capacitance may also include parasitic capacitance in the signal path external to capacitive sense array 125 (e.g., from electrode plate of electrode 312 to error correction circuit 320).

In one embodiment, passive integrator circuit 310 may be used when capacitance-sensing circuit is performing capacitance sensing in self-capacitance measurement mode as illustrated by sensed capacitance 318, or in mutual capacitance sensing mode as illustrated by sensed capacitance 313. Mutual capacitor (e.g., sensed capacitance 313) is illustrated by electrode 311 and electrode 312, which together form an electrode pair for mutual capacitance sensing.

In one embodiment, designing a simple touch screen sensing channel may minimize channel area on an integrated circuit. Channel area may be minimized by using the self-capacitance (e.g., self-capacitance of electrode 315) capacitive sense array 125 as an integrator (e.g., passive integrator circuit 310) and implementing error correction circuit 320 to turn the charge balancing converter 120 into a charge balancing accumulation converter. Additionally, implementing an error correction circuit 320 in a charge balancing accumulation converter may lead to greater overall accuracy for the converted signal.

Figure 4:
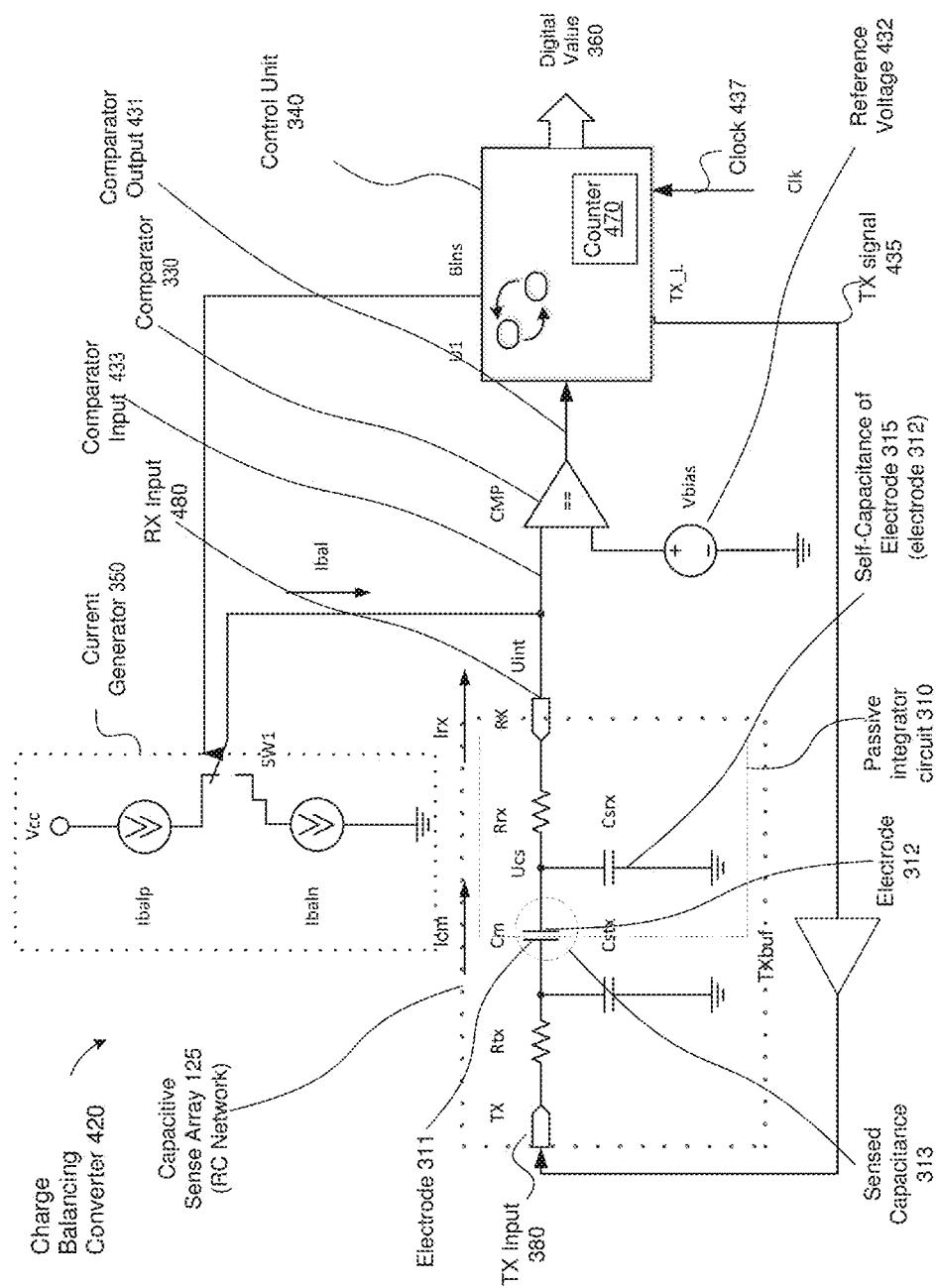
FIG. 4 is a circuit diagram of a charge balancing converter and a passive integrator circuit, according to another embodiment.

FIG. 4 is a circuit diagram of a charge balancing converter and a passive integrator circuit, according to one embodiment. A simplified scheme of a charge balancing converter (e.g., charge balancing converter 420) is depicted in FIG. 4. Capacitive sense array 125 is represented by an equivalent scheme. This scheme contains an RC network on the excitation side that is represented by the TX line resistance Rtx and its self-capacitance Cstx, the RC network on the RX side that is represented by the RX line resistance Rrx and its self-capacitance Csrx (e.g., passive integrator circuit 310). A mutual capacitance Cm (sensed capacitance 313) connects both sides and is the measured capacitance. In addition, charge balancing converter 420 includes a transmission signal, TX signal 435, from control unit 340. Control unit 340 includes counter 470. Additionally, an input of comparator 330 is connected to reference voltage 432, and produces an output based on a comparison at comparator 330. Additional features illustrated in FIG. 4 are described in the previous figures, FIGS. 1-3.

The RX output of capacitive sense array 125 is coupled to the comparator input 433. Moreover, an integrating capacitor (e.g., self-capacitance of electrode 315 of passive integrator circuit 310) and balancing current source (e.g., current generator 350) are connected to the RX node (e.g., RX input 480). The opposite input of the comparator is connected to a bias voltage (e.g., reference voltage 432). The comparator output 431 is sensed by control unit 340. The control unit U1 (e.g., control unit 340) generates the sensor excitation TX (e.g., TX signal 435) and connects the balancing current sources (e.g., current generator 350) to the comparator input 433 until the charge at RX Input 40 is balanced. In one embodiment, balance means crossing the tripping voltage threshold as the current source or sink attempts to pull the RX input 480 towards (and eventually beyond) the tripping voltage (e.g., reference voltage 432). The control unit U1 (e.g., control unit 340) is synchronized by clock pulses Clk (e.g. clock 437) that are used to determine the duration of the balancing period. The result of counting the clock pulses during balancing period is the conversion result (digital value 360).

In one embodiment, an on-chip integrating capacitor can be absent and its role can be played by the sensor parasitic capacitance (e.g., passive integrator circuit 310). Removing the on-chip integrating capacitor may reduce the sensing channel size.

Figure 5:
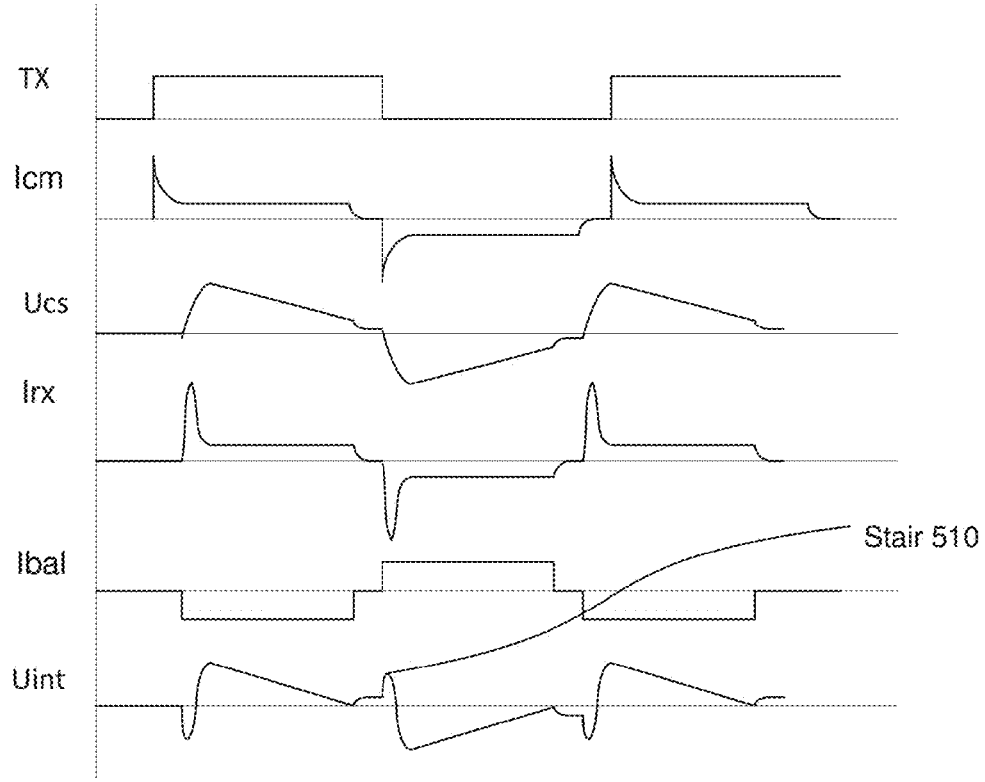
FIG. 5 is an illustration of operational waveforms of a circuit such as shown in FIG. 4, according to one embodiment.
Figure 6:
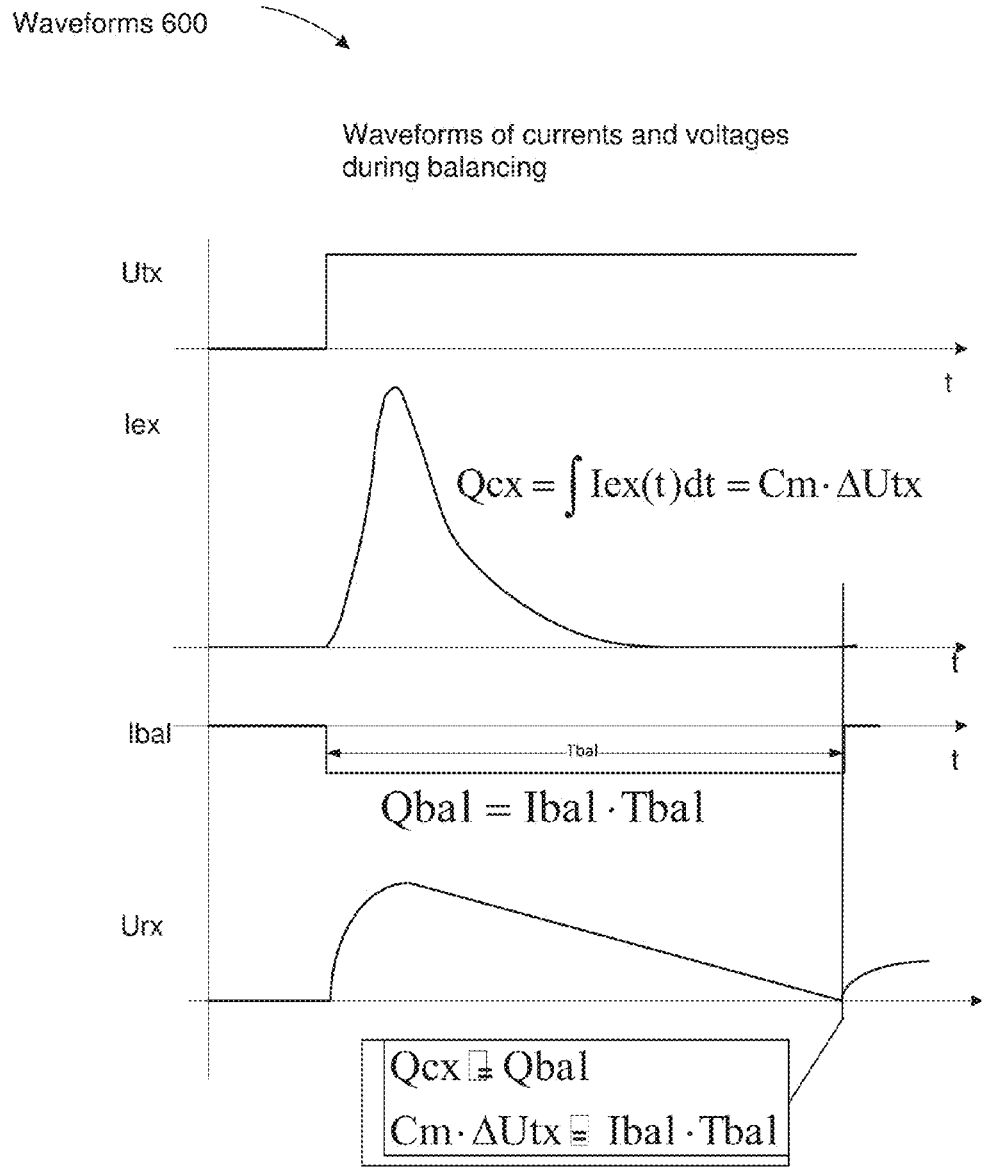
FIG. 6 is an illustration of operational waveforms of currents and voltages during the balancing operation, according to one embodiment.
Figure 7:
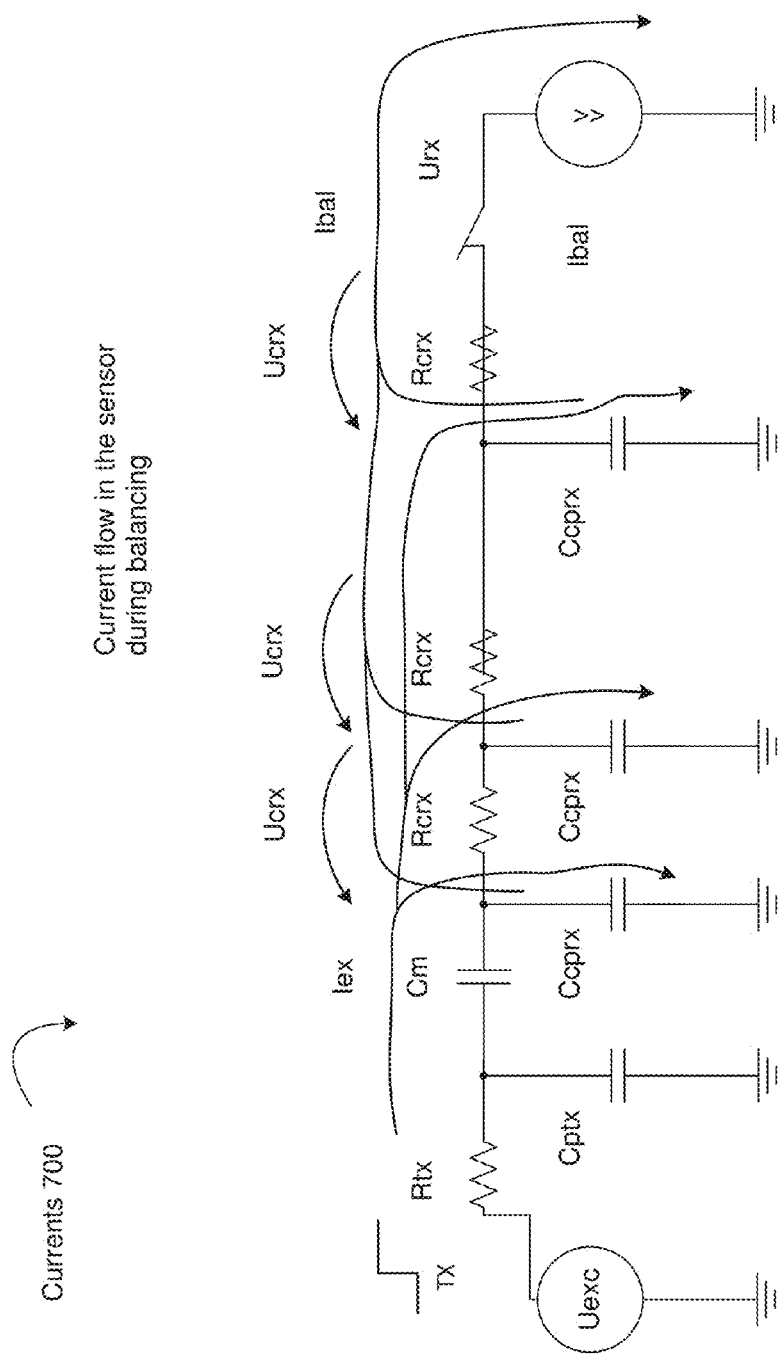
FIG. 7 is an illustration of current flow during the balancing operation, according to one embodiment.

FIG. 5 is an illustration of operational waveforms of a circuit such as shown in FIG. 4, according to one embodiment. Operational waveforms 500 illustrate the operation of charge balancing converter 420 in FIG. 4. FIG. 6 is an illustration of operation waveforms of currents and voltages during the balancing operation, according to one embodiment. FIG. 7 is an illustration of current flow during the balancing operation, according to one embodiment. FIGS. 5, 6, and 7 will be used to illustrate the operation of charge balancing converter 420 in FIG. 4. In one embodiment, the TX signal edge (e.g., TX signal 435) generates a current flow, Icm, via the mutual capacitance Cm. At the same time or after a short pause control unit U1 (e.g., control unit 340) connects the balancing current source Ibal (e.g., from current generator 350) to the RX input (e.g., RX input 480). The balancing current Ibal polarity is defined by the TX edge direction. It is possible to define the balancing current direction using the comparator output 431, but a pause after the TX edge may be necessary to pre-charge the RX line self-capacitance (e.g. self-capacitance of electrode 315) and find the correct balancing current direction. Balancing current, Ibal, flows to the RX input (e.g., RX input 480) till the RX voltage reaches the triggering voltage (e.g., reference voltage 432) and comparator 330 toggles state.

The charge balancing converter 420 measures the mutual capacitance (e.g., sensed capacitance 313) using the charge transfer method. This method presupposes whole capacitances recharge after the TX edge. As illustrated in FIG. 6 waveforms 600, if the sensor RX line has a constant potential, then the charge transferred through the Cm (e.g., sensed capacitance 313) is equal to: $Qcm=\Delta Utx \cdot Cm$, where $\Delta Utx$ is the excitation TX voltage (e.g., TX signal 435) swing. If the excitation signal has a rectangular pattern and a following TX edge is generated after recharging all the sensor capacitances (e.g., capacitive sense array 125), then the current flow into the RX input (e.g., RX input 480) is equal to 0 before the following TX edge. Most of charge is transferred during a short period after the TX edge. This allows charge balancing converter 420 to balance the incoming charge simultaneously while the RX input (e.g., RX input 480) returns to the operational point. In this case, the balance equation is: $\Delta Utx \cdot Cm = Ibal \cdot Tx$ where Ibal is the balancing current value and Tx is the balancing duration. The balancing duration is proportional to the mutual capacitance Cm (e.g., sensed capacitance 313). A stair (e.g., stair 510) in the RX voltage waveform Uint is produced after the balancing current is turned off. This stair (e.g., stair 510) is caused by a flow of currents from the excitation source Iex and from the balancing current source Ibal through the sensor RX line resistance during balancing, as illustrated in FIG. 7. Further illustrated in FIG. 7 currents 700, Iex and Ibal currents generate a voltage drop on the line resistances Ucrx. The voltages on the RX line parasitic capacitances Ccprx differ from the voltage on the comparator input 433 at the moment when the balancing current is turned off. After turning off the balancing current the voltages on the all RX line nodes become even.

Figure 8:
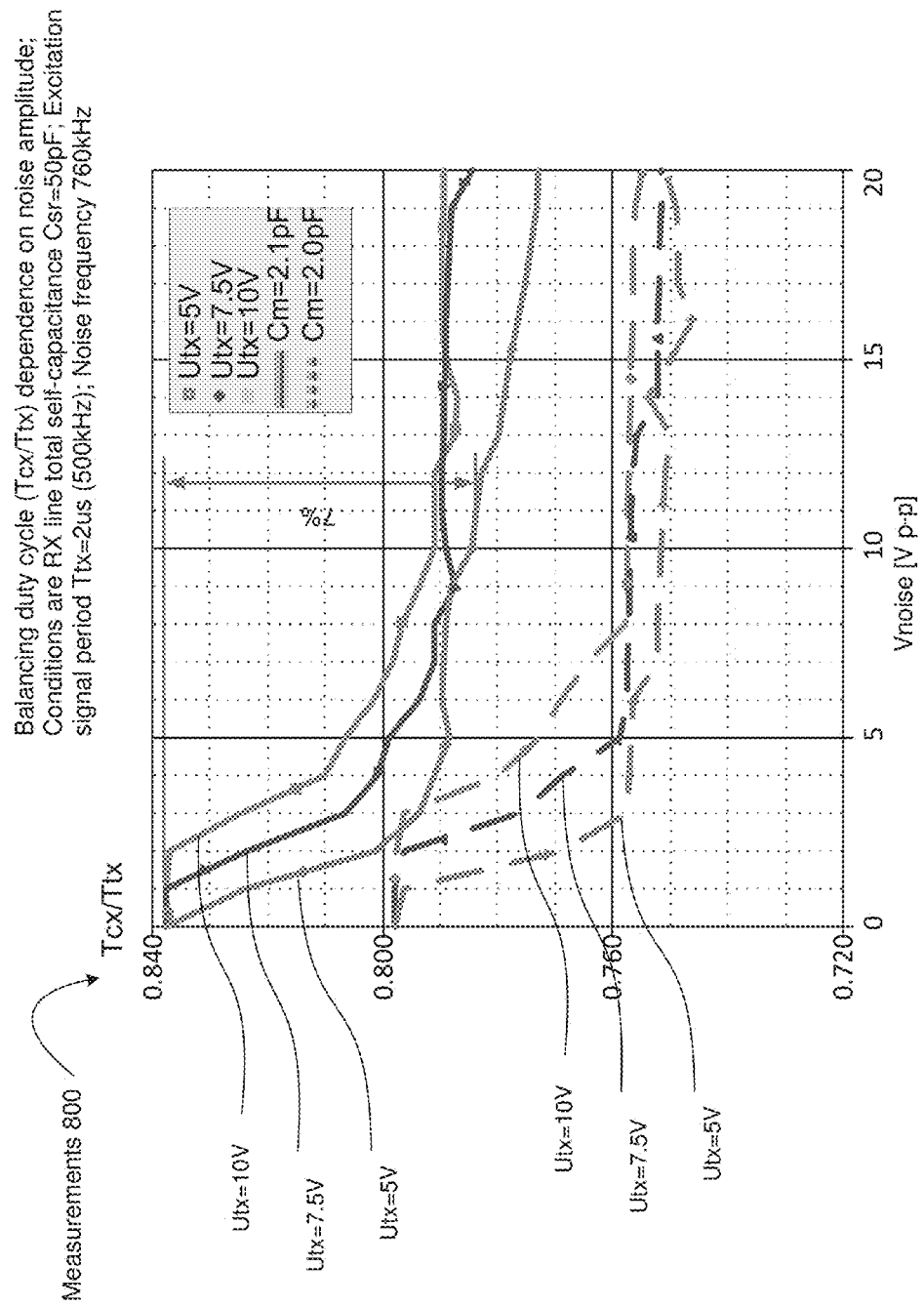
FIG. 8 is a graph illustrating the influence of noise on a circuit such as shown in FIG. 4, according to one embodiment.

FIG. 8 is a graph illustrating the influence of noise on a circuit such as shown in FIG. 4, according to one embodiment. Measurements 800 illustrate the influence of noise on the output of the charge balancing converter 420.

Figure 9:
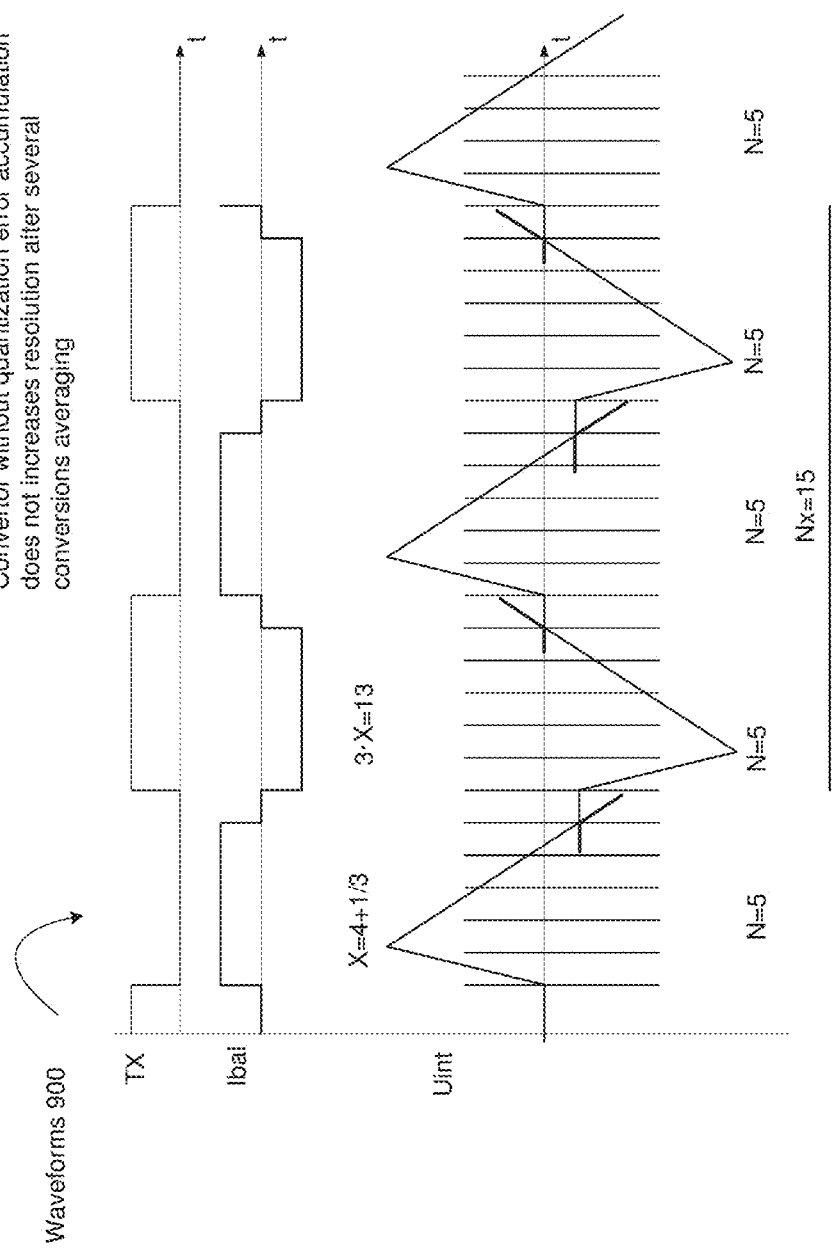
FIG. 9 is an illustration of waveforms of the operation of a charge balancing circuit without quantization error accumulation, according to one embodiment.

FIG. 9 is an illustration of waveforms of the operation of a charge balancing circuit without quantization error accumulation, according to one embodiment. In one embodiment, the relaxation converter (e.g., charge balancing converter 420) may operate with or without the comparator (e.g., comparator 330) synchronization to the clock pulses (e.g. clock 437). When the comparator (e.g., comparator 330) is synchronized to the clock (e.g. clock 437) the balancing stops after the comparator trips. This means that the voltage (e.g., Uint) on the integrating capacitor (e.g., passive integrator circuit 310) at the end of a conversion is not equal to the initial operating point and the following conversion begins from this voltage. But at the end of the conversion the voltage (e.g., Uint) on the integrating capacitor (e.g., passive integrator circuit 310) returns to the operation point. This feature of the relaxation converter (e.g., charge balancing converter 420) behavior makes it sensitive to a small noise. Some small noise, which may be several times less than the quantization step, can cause one least significant bit (LSB) dithering of the conversion results. This dithering may help increase the converter resolution by averaging some the conversions result.

Figure 10:
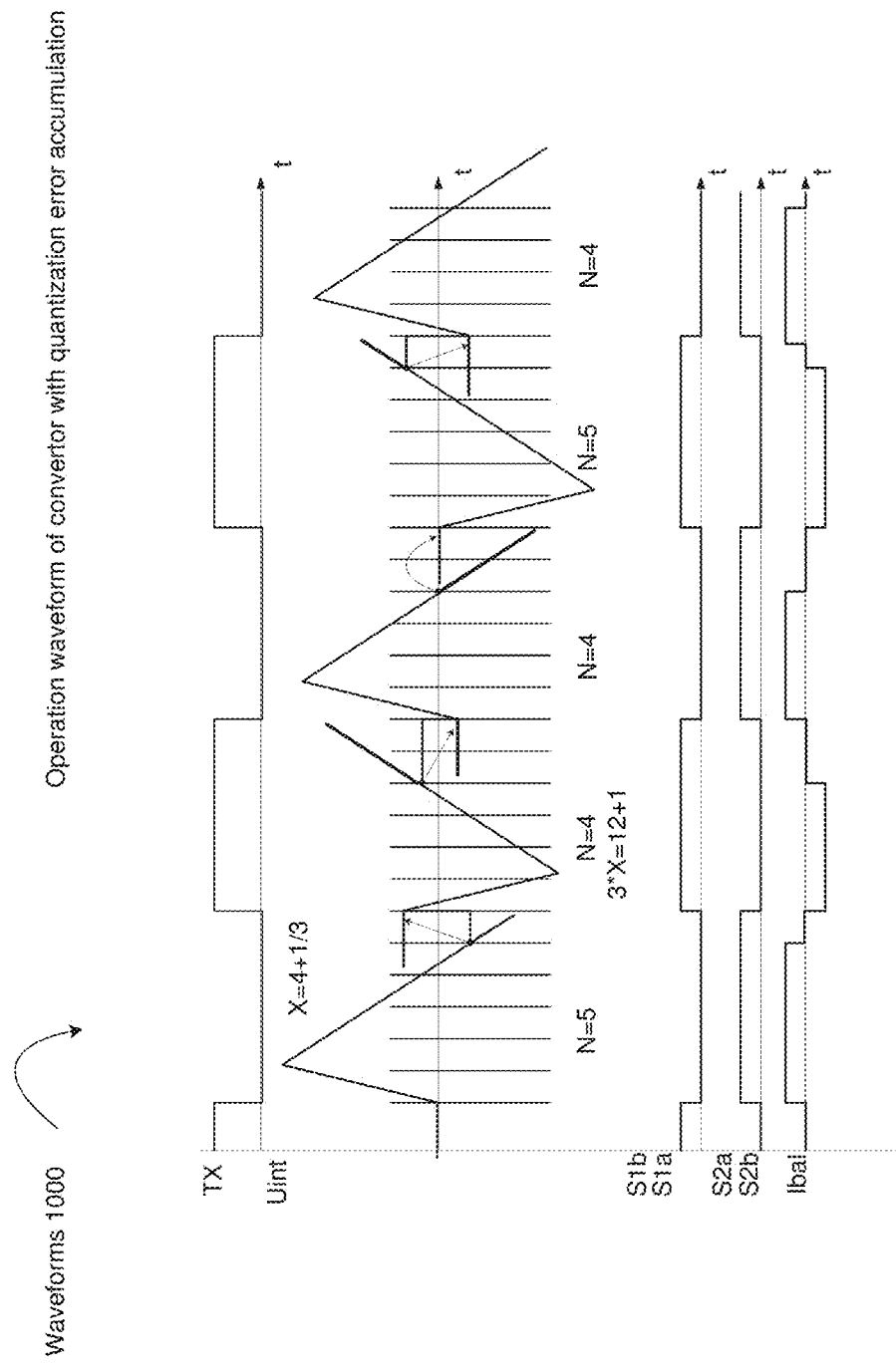
FIG. 10 is an illustration of waveforms of the operation of a charge balancing circuit with quantization error accumulation, according to one embodiment.

FIG. 10 is an illustration of waveforms of the operation of a charge balancing circuit with quantization error accumulation, according to one embodiment. In one embodiment, averaging of the conversion results with a random quantization error allows increasing the resolution proportionally to the square root of the number of the averaged results. For example, 100 results of a conversion are used to increase the resolution by 10 times by using the average of the random quantization error. In contrast to the averaging of a random or randomized quantization error is quantization error accumulation. In quantization error accumulation, the quantization error of the current conversion is stored and added to previous quantization error.

In one embodiment, quantization error accumulation is implemented by a charge balancing converter (e.g., charge balancing converter 420) using the integrating capacitor (e.g., self-capacitance of electrode 315) to store the quantization error. A charge balancing converter (e.g., charge balancing converter 420) may start and stop the routine of signal integration and balancing with some reference voltage at the same operation point that is defined by the comparator tripping voltage. The conversion may be synchronized with the clock pulses from clock 437. The result of a conversion may be defined, in one embodiment, by counting the clock pulses beginning from when control unit 340 senses comparator 330 has been tripped until the comparator (e.g., comparator 330) again changes state. The comparator output switch may not align with the clock edges of the clock (e.g. clock 437). This mismatch may cause a quantization error. If the comparator tripping is synchronized with the clock pulses edge, at the end of balancing, the integrating capacitor (e.g., sensed capacitance 313) will contain a quantization error value.

Quantization error may be illustrated in the following example. For example, for 1.0V at the input voltage, the converter (e.g., charge balancing converter 420) outputs (e.g., at RX input 480, Uin) a value of 10. When the voltage at RX input is 1.025V, a conventional conversion gives us a result equal to 10. If the converter (e.g., charge balancing converter 420) can store its quantization error (e.g., q) and add it to the following conversion, the results would look similar to the results in the table 1 below. The sum of 4 conversions is 41 and the average value of these conversions is 10.25. The converter resolution increases proportionally to the number of the averaged conversions.

TABLE 1

Result of conversions

| Uin+q | 1.025 V | 1.05 V | 1.075 | 1.1 |
|---|---|---|---|---|
| Digital Value | 10 | 10 | 10 | 11 |
| Q | 0.0 V | 0.025 V | 0.05 | 0.075 V |

In capacitance sensing systems (e.g., electronic system 100) measured capacitance of capacitive sense array 125 is charged with an AC signal in order to obtain an output response. When performing a balancing conversion with the quantization error accumulation every half-period of the excitation (e.g., defined by TX signal 435), the quantization error may be reversed before each subsequent conversion. Waveforms 1000 of FIG. 10 illustrate the above described balancing conversion.

Figure 11:
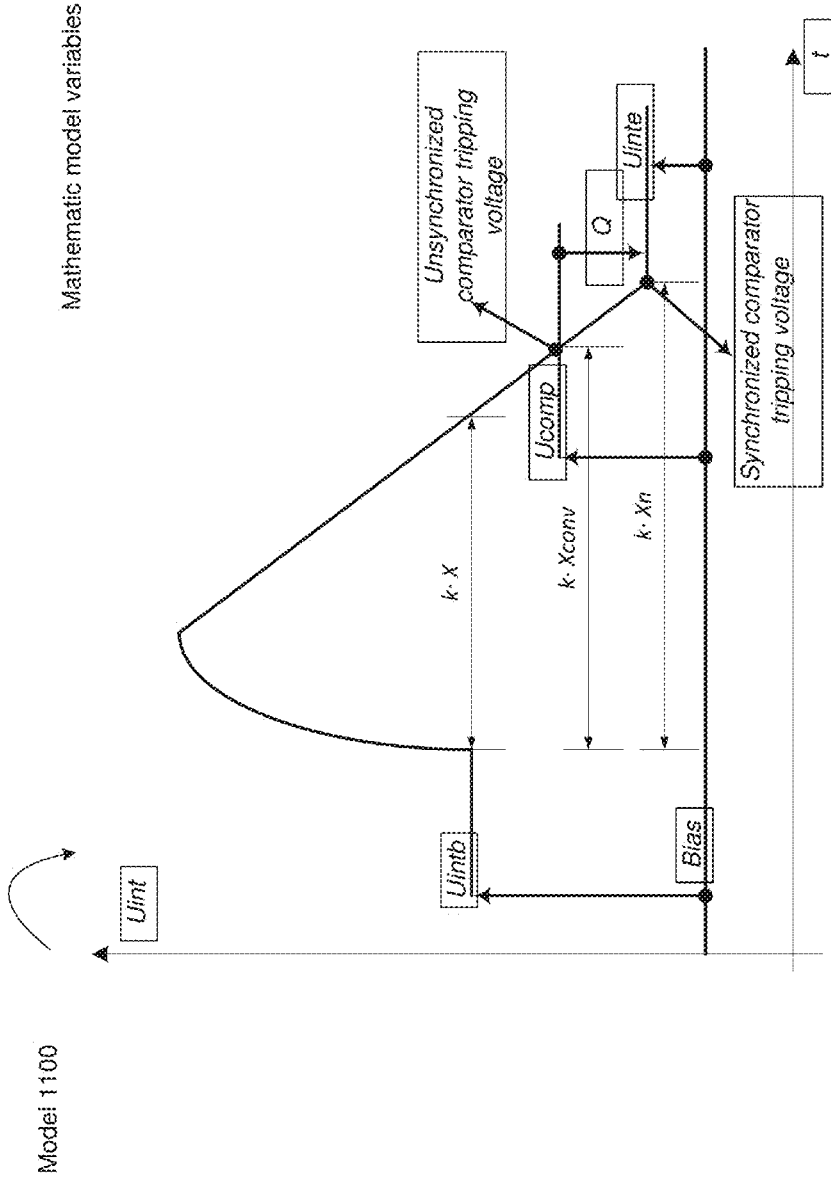
FIG. 11 is an illustration of a mathematical model describing the processes of a charge balancing converter with the quantization error accumulation, according to one embodiment.

FIG. 11 is an illustration of a mathematical model describing the processes of a charge balancing converter with quantization error accumulation, according to one embodiment. Model 1100 illustrates a physical interpretation of the model parameters, according to one embodiment. All the integrator voltages are defined relative to the integrator tripping voltage, Vbias (e.g., reference voltage 432). The incoming signal X integration begins from voltage Vintb. The time until balancing the integrator output voltage returns back to the start level or to Vintb gives a nominal conversion result k·X. The comparator (e.g., comparator 330) tripping voltage, (e.g., Ucomp in FIG. 11), may be different than the voltage level at the start of integration. The time until till the comparator trips gives the conversion result k·Xconv without quantization. The comparator's synchronization with the clock (e.g., clock 437) may produce longer balancing times because the following clock edge controls the state change of the comparator, and a delay in turning off the current source (e.g., current generator 350). The integrator output voltage in this case is Uinte and represents quantization error Q=Uinte-Ucomp. The conversion result is equal to integer number k·Xn.

The mathematical model has several additional parameters not illustrated in FIG. 11. The parameters are as follows: TX—the sensor excitation signal that defines the input signal polarity (it takes value+/−1); Ntx is the number of TX signal half-periods and defines the number of the averaged results; and Nx is the result of the digital accumulation. Factor k is set to 1 to simplify the model.

The mathematical model of a balancing converter with quantization error accumulation is described below. It should be noted the models are representative of Mathcad logic used therein. It illustrates a converter (e.g., charge balancing converter 420) with quantization error accumulation that is based on integration by reversing the signal on the integrating capacitor. TX is the sensor excitation signal; Nx is conversion result; Ntx is the number of conversions; Q is the conversion quantization error. The model is presented below:

NARn(X, σ):=Ucomp←0
   TX←1
   Nx←0
   for i∈1 ... Ntx
      Xconv←|TX·X+rnorm(1,0,σ)+Uintb−Ucomp| (1)
      Xn←ceil(Xconv) (2)
      Q←−TX·(Xn−Xconv) (3)
        Uinte←Ucomp−Q (4)
        Nx←Nx+Xn (5)
        Ucomp←0 (6)
        Uintb←−Unite (7)
        TX←−TX (8)
   Nx (1) Defines the value that is converted in the current cycle. The values of incoming signal X, integrator level before conversion Uintb, and comparator tripping voltage, Ucomp, are added to a noise value with normal distribution which is defined by a standard deviation σ that is reduced to r converter 1LSB. (2) Quantization of a converted value. The result is represented by an integer number. (3) Defines a fraction with a sign. (4) Defines the integrator output level at the end of balancing. (5) The conversion result accumulation. (6) The comparator tripping voltage is constant. (7) The following conversion will begin from the level whose magnitude is the same as the current conversion but the polarity is reversed. (8) Excitation signal TX changes the polarity to the opposite.

Figure 12:
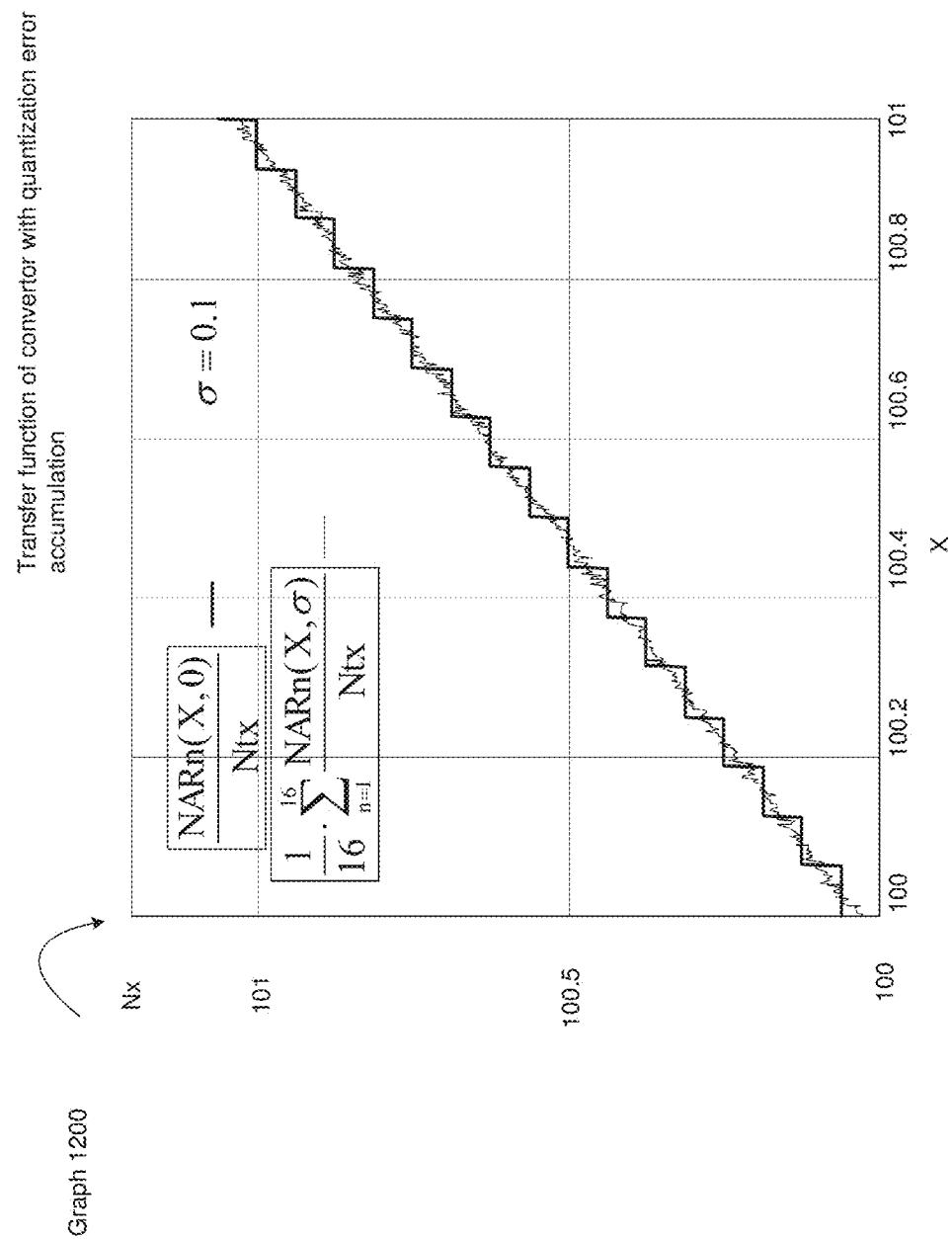
FIG. 12 is a graphical illustration of the operation of a charge balancing converter, according to one embodiment.

FIG. 12 is a graphical illustration of the operation of a charge balancing converter, according to one embodiment. In graph 1200, the number of averaged conversions is set to 16. The input signal variation, from 100 to 101, gives exactly 16 quantization steps (graphical stairs) instead of a single step, such as from a converter without the quantization error accumulation. The other line that appears to be rapidly fluctuating, demonstrates the converter (e.g., charge balancing converter 420) behavior in the presence of small noise. The noise has a standard deviation (STD) of 0.1LSB for a single conversion. The averaging of 16 results of the accumulated 16 half-period conversion results gives a resolution that is defined by noise. This occurs because the expected quantization error is approximately 1/180 while the noise energy is 0.1 LSB. The channel sensitivity in the above is defined by noise.

In one embodiment, an accumulating converter (e.g., charge balancing converter 420) is used in conjunction with a passive integrator circuit (e.g., passive integrator circuit 310). The charge balancing converter (e.g., charge balancing converter 420) based on the passive integrator circuit (e.g., passive integrator circuit 310) may be implemented with an integrating capacitor (e.g., self-capacitance of electrode 315) that is part of the capacitive sense array 125. The integrating capacitor may be permanently connected between the channel input and ground.

In one embodiment, an error correction circuit (e.g., error correction circuit 320) is used with a converter (e.g., charge balancing converter 420) based on a passive integrator circuit (e.g., passive integrator circuit 310) to implement a quantization error accumulation method. In one embodiment, quantization correction is performed by controlling the comparator (e.g., comparator 330) tripping voltage. The signals to perform the correction may be the voltage on the integrator (e.g., passive integrator circuit 310) before and after a conversion and the current comparator tripping voltage.

Figure 13:
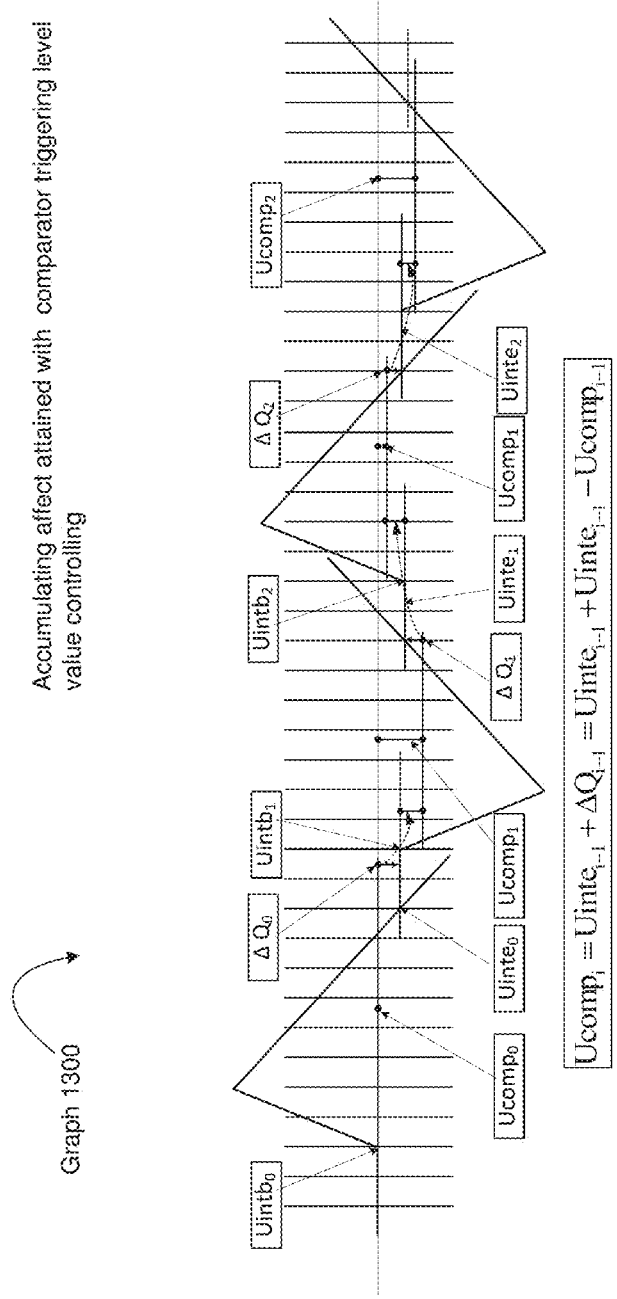
FIG. 13 is a graph illustrating comparator control in performing quantization error accumulation, according to one embodiment.

FIG. 13 is a graph illustrating comparator control in performing quantization error accumulation, according to one embodiment. Graph 1300 demonstrates the control of the comparator tripping voltage to obtain the quantization error accumulation behavior. The quantization remainder may be added to the incoming signal of the following conversion. The quantization remainder (error) is the difference between the voltage on the integrating capacitor (e.g., self-capacitance of electrode 315) and comparator tripping voltage (e.g., reference voltage 432). The remainder is illustrated by ΔQx. The arrow direction shows the polarity of the remainder. Because of the timing of comparator, the integrating capacitor (e.g., self-capacitance of electrode 315) may be overly discharged by the balancing current from the current source (e.g., current generator 350). Therefore, the remainder may be subtracted from the following conversion. The arrows pointing away from $\Delta Qx$ show the comparator tripping voltage defined as the integrator output voltage plus the remainder. Defined as such allows for the subtraction of the extra charge collected on the integrating capacitor (e.g., self-capacitance of electrode 315) in the subsequent conversion. The comparator tripping voltage is defined as: $Ucmp[i+1]=Uinte[i]+\Delta Q[i]=2 \cdot Uinte[i]—Ucomp[i]$ (Equation 1).

The mathematical model above (associated with FIG. 11) may be modified to consider the passive integrator circuit. It should be noted the models are representative of Mathcad logic used therein. The model is presented below:

$Nxn(X,\sigma):=TX \leftarrow 1$
   $Nx \leftarrow 0$
   for $i \in 1 \ldots Ntx$
     $Xconv \leftarrow |TX \cdot X + rnorm(1,0,\sigma) + Uintb - Ucomp|$ (1)
     $Xn \leftarrow ceil(Xconv)$ (2)
     $Q \leftarrow TX \cdot (Xn - Xconv)$ (3)
     $Uinte \leftarrow Ucomp - Q$ (4)
     $Nx \leftarrow Nx + Xn$ (5)
     $Ucomp \leftarrow Uinte - Ucomp$ (6)
     $Uintb \leftarrow Uinte$ (7)
     $Uintb \leftarrow -TX$ (8)
$Nx$ Line (6) contains a correction of the comparator tripping voltage. Line (7) describes that the integrator begins operation from a voltage level reached in the previous conversion. Sweeping the input parameter shows that the quantization step number is equal to the accumulated conversion number (see FIG. 14, the range Cx=100 . . . 101 contains 16 stairs when Ntx=16). The noise with 0.1LSB of STD makes the same impact on the conversion results as was observed in the previous model (see FIG. 11). Both models have the same behavior.

Figure 14:
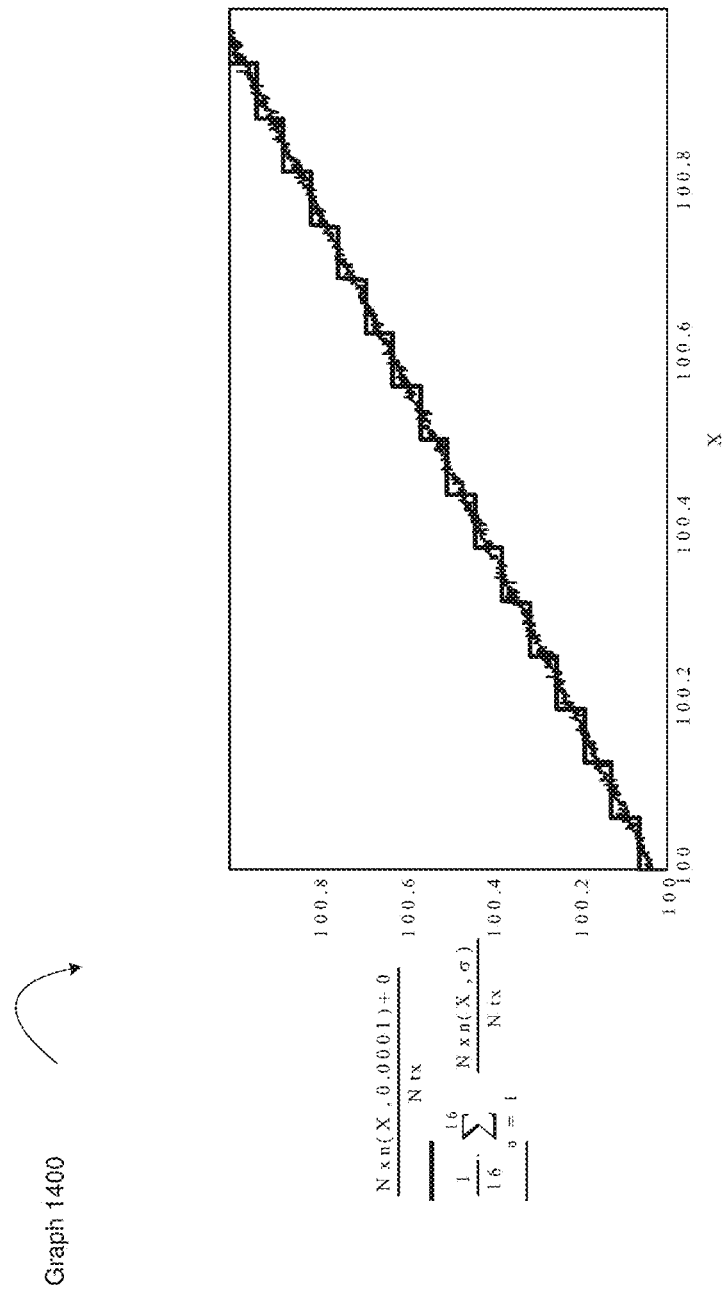
FIG. 14 is a graph illustrating the transfer function of an accumulating structure based on a passive integrator circuit, according to one embodiment.

FIG. 14 is a graph illustrating the transfer function of an accumulating structure based on a passive integrator circuit, according to one embodiment. A charge balancing converter (e.g., charge balancing converter 420) with quantization error accumulation is based on the relaxation converter with a passive integrator (see FIG. 4). The error correction circuit (e.g., error correction circuit 320) changes the relaxation converter to the converter with the quantization error accumulation. This circuit is connected between the RX input (e.g., RX input 480) and the comparator input (e.g., comparator input 433). The error correction circuit (e.g., error correction circuit 320) controls the comparator tripping voltage in accordance with Equation 1.

Figure 15:
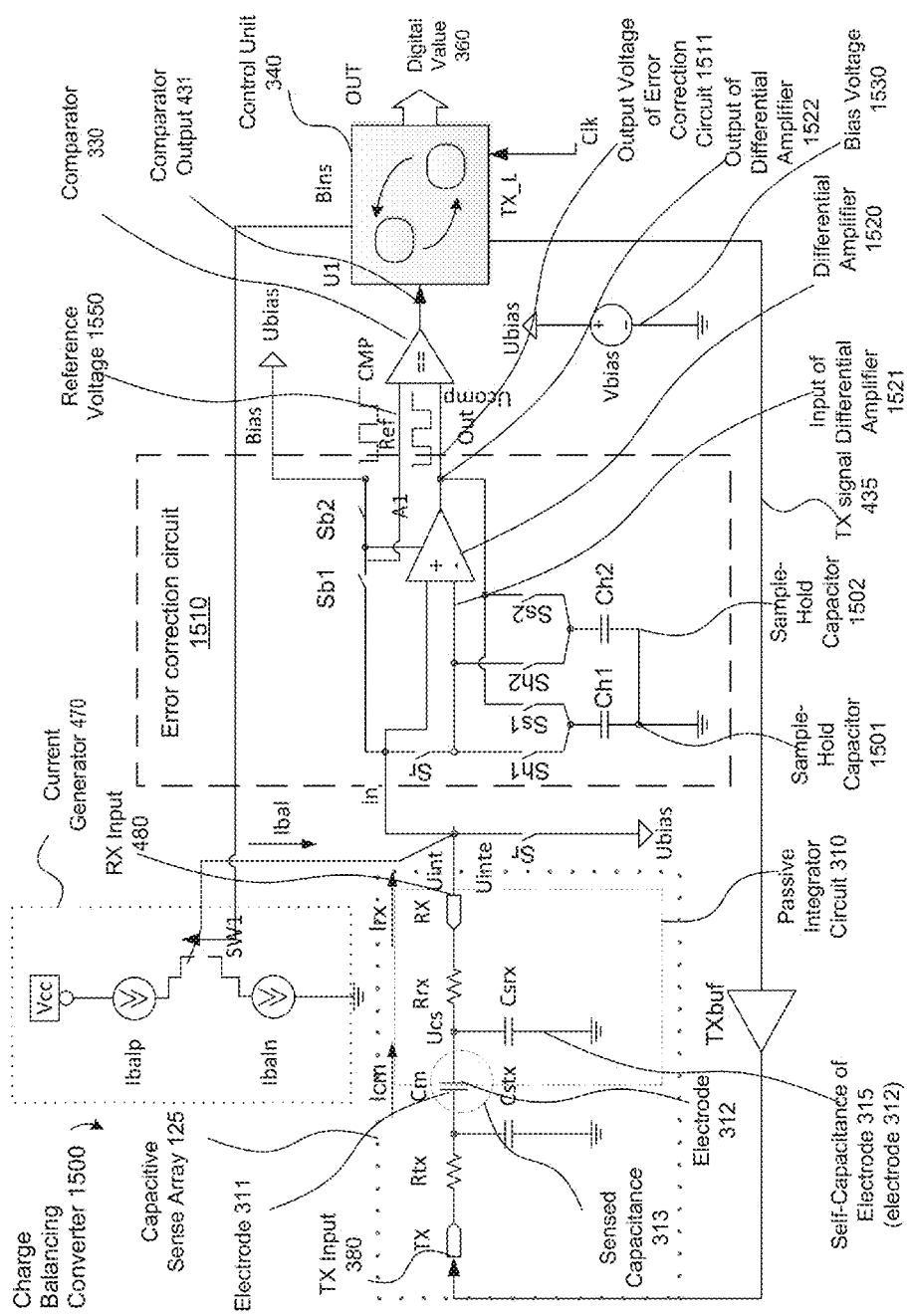
FIG. 15 illustrates a circuit implementation of a charge balancing circuit with an error correction circuit, according to one embodiment.
Figure 16:
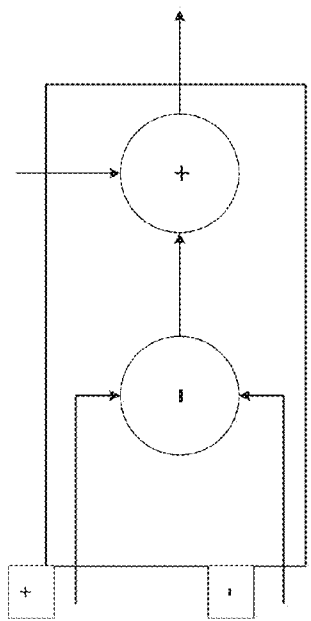
FIG. 16 illustrates a functional scheme of a differential amplifier, according to one embodiment.

FIG. 15 illustrates a circuit implementation of a charge balancing circuit with an error correction circuit, according to one embodiment. Error correction circuit 1510 contains a differential amplifier A1 (e.g., differential amplifier 1520) with bias (e.g., bias voltage 1530); two sample-hold capacitors (e.g., sample-hold capacitor 1501 (Ch1) and sample-hold capacitor 1502 (Ch2)) whose terminals on one side are grounded and terminals on the other side are connected to switches Ss1 and Ss2 that connect the sample-hold capacitors Ch1, Ch2 to the differential amplifier A1 output (e.g., output of differential amplifier 1522) and the switches Sh1 and Sh2 that connect the sample-hold capacitors Ch1, Ch2 to the inverting input of differential amplifier A1 (e.g., input of differential amplifier 1521). In one embodiment, differential amplifier A1 is a unity-gain differential amplifier. The bias input of differential amplifier A1 is connected to the bias source (e.g., bias voltage 1530) via switch Sb2 and to its non-inverting input via switch Sb1. The non-inverting input of differential amplifier A1 (e.g., differential amplifier 1520) is connected to the RX terminal (e.g., RX input 480). FIG. 16 illustrates a functional scheme of a differential amplifier, according to one embodiment. Differential amplifier 1600 represents one implementation of differential amplifier 1520. Returning to FIG. 15, two additional switches (Sr) are dedicated to initializing the converter (e.g., charge balancing converter 1500) before a conversion. Initialization means that the sensor self-capacitance (e.g., self-capacitance of electrode 315) and the sample-hold capacitances (e.g., sample-hold capacitor 1501 (Ch1) and sample-hold capacitor 1502 (Ch2)) charge up to the bias voltage level (e.g., bias voltage 1530) to set this circuit to the operation point. The converter operation begins with a reset stage when switches Sr and Shx are closed and the circuit sets to the operation point (see the marked stage in FIG. 17).

In one embodiment, the sampling and storing of the quantization error is performed by a first sample-hold capacitor (e.g., sample-hold capacitor 1501) and a second sample-hold capacitor (e.g., sample-hold capacitor 1502) of the error correction circuit 1510.

In one embodiment, accumulating quantization error includes selectively coupling one of a first sample-hold capacitor or a second sample-hold capacitor (e.g., sample-hold capacitor 1501 or sample-hold capacitor 1502) to an input of a differential amplifier 1521 while coupling the other one of the first sample-hold capacitor or the second sample-hold capacitor to an output of the differential amplifier 1520, wherein the error correction circuit 1510 includes the first sample-hold capacitor, the second sample-hold capacitor, and the differential amplifier 1520.

Figure 17:
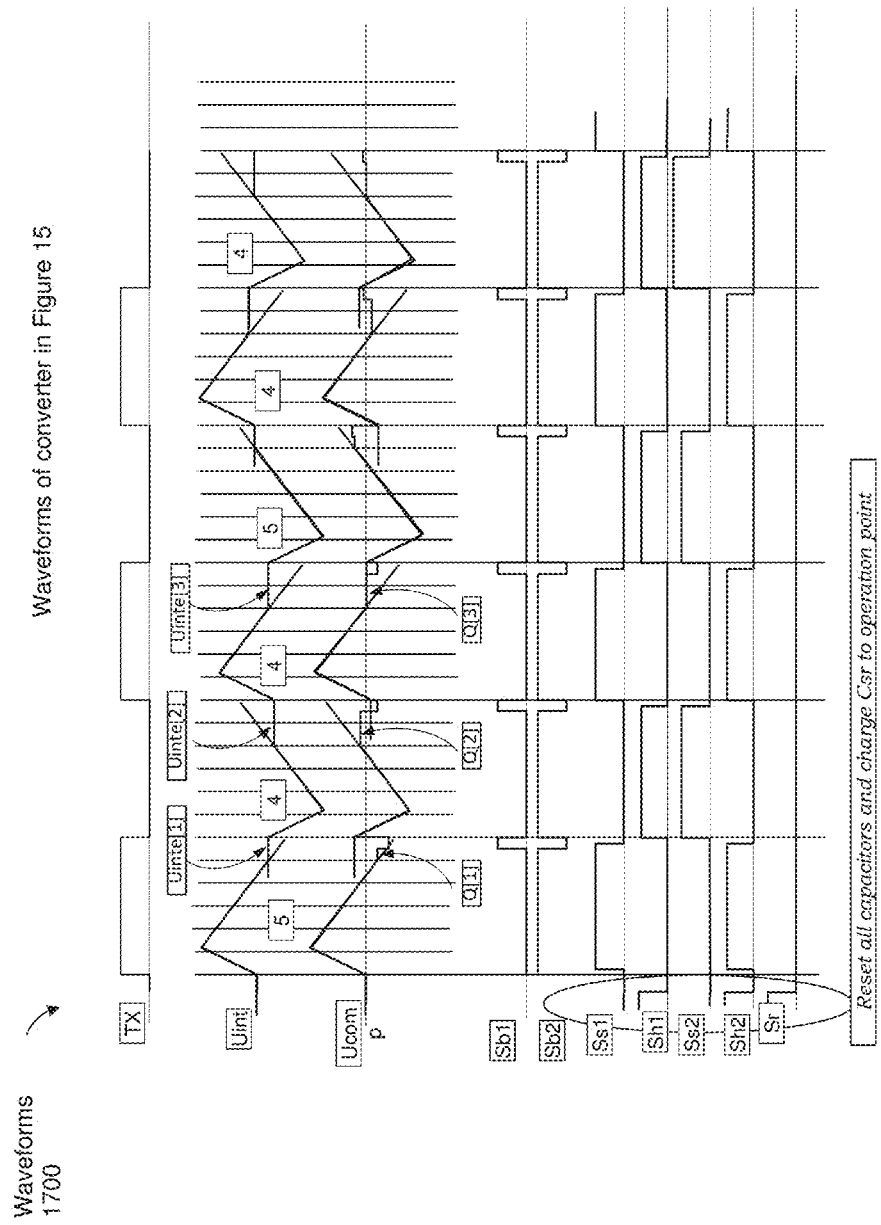
FIG. 17 illustrates waveforms of the operation of charge balancing converter with an error correction circuit, according to one embodiment.

FIG. 17 illustrates waveforms of the operation of charge balancing converter with an error correction circuit, according to one embodiment. Waveforms 1700 illustrate the operation of the charge balancing circuit 1500 in FIG. 15. Sample-hold capacitors Ch1 and Ch2 (e.g., sample-hold capacitor 1501 (Ch1) and sample-hold capacitor 1502 (Ch2)) may be connected to differential amplifier A1 (e.g., differential amplifier 1520) in the opposite phase with switches Shx and Ssx. In one embodiment, differential amplifier A1 is a unity gain differential amplifier. When one sample-hold capacitor is connected to differential amplifier A1 input (e.g., input of differential amplifier 1521), the other is connected to the differential amplifier A1 output (e.g., output of differential amplifier 1522). Capacitor switching is synchronous with the TX signal (e.g., TX signal 435).

Differential amplifier A1 (e.g., differential amplifier 1520) operates with a bias equal to the circuit bias (e.g., bias voltage 1530). But at the end of a conversion its bias changes to level Uinte, reached at the end of balancing. This behavior satisfies the requirements of Equation 1. The waveforms of the control signals of switches Sb1 and Sb2 that change the differential amplifier bias voltage are also illustrated in FIG. 17. The simplified waveform of balancing (Uint) demonstrates the procedure of balancing the incoming signal that causes nominal response (output code 5, 4, 4, 5, 4, 4, etc.) averaging to output code 4.333. In this example, every third conversion reports 1 extra bit due to error accumulation.

Figure 18:
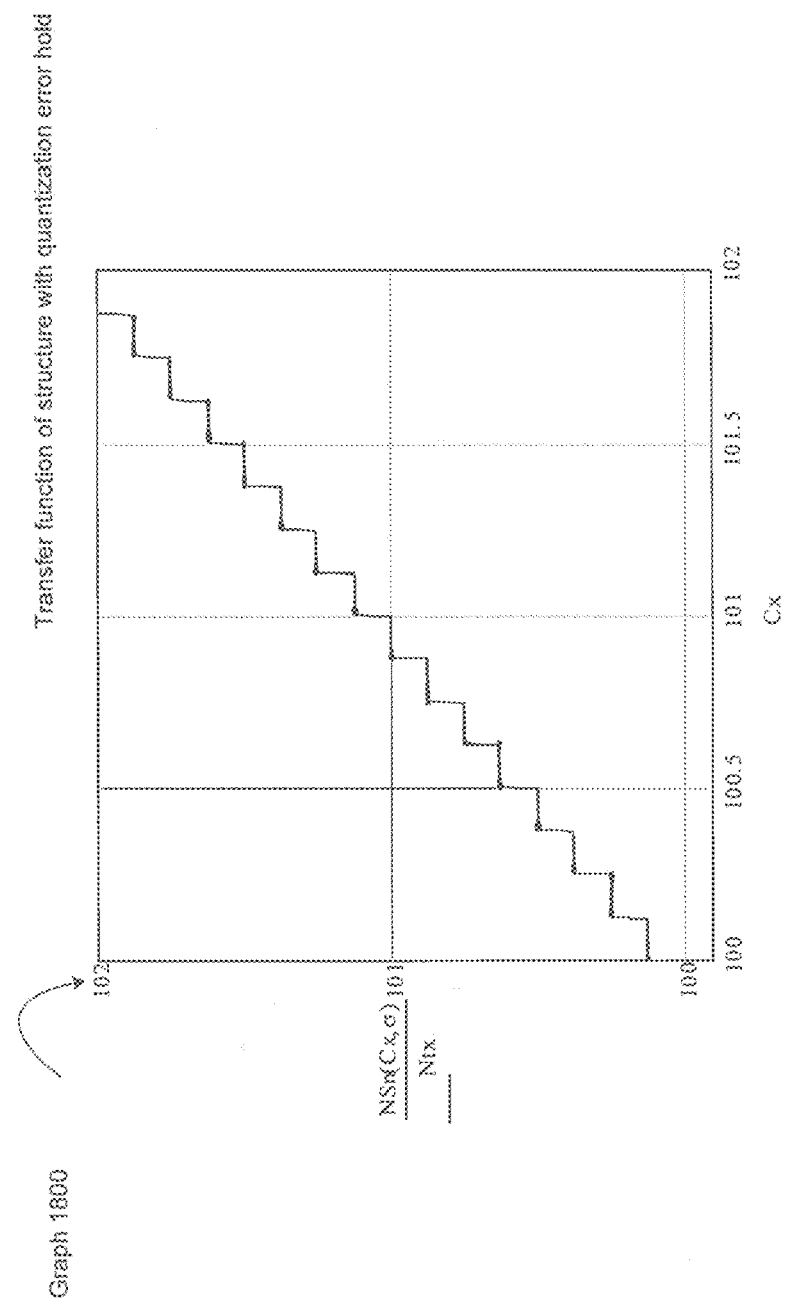
FIG. 18 is a graph illustrating a transfer function obtained with a simplified model of a charge balancing converter with error correction circuit, according to one embodiment.

FIG. 18 is a graph illustrating a transfer function obtained with a simplified model of a charge balancing converter with error correction circuit, according to one embodiment. It should be noted the models are representative of Mathcad logic used therein. Using superposition principles, the mathematical model may be created for the converter with the quantization error accumulation (see model associated with FIG. 14) as an implementation of the relaxation converter model (see model associated with FIG. 11) that holds the integrator output voltage and a model a holding only the quantization error (Ucomp←Uinte+(Uinte−Ucomp) where Uinte−Ucomp is the quantization error). In the mathematical model below, a Uinte value is excluded to leave only the quantization error. The comparator tripping voltage is set equal to the quantization error. The mathematical model for holding the quantization error is below (simplified model of a charge balancing converter with error correction circuit, aka—simplified accumulation structure):

NSn(X, σ):=Ucomp←0
TX←1
Nx←0
for i∈1 . . . Ntx
    Xconv←|TX·X+rnorm(1,0,σ)+Uintb−Ucomp|
    Xn←ceil(Xconv)
    Q←TX·(Xn−Xconv)
    Uinte←Ucomp−Q
    Nx←Nx+Xn
    Ucomp←Uinte−Ucomp+0
    Uintb←Uinte
    TX←−TX
Nx Graph 1800 illustrates the transfer function obtained with a simplified model of a charge balancing converter with an error correction circuit. This simplification causes the resolution to be degraded by a factor of 2.

Figure 19:
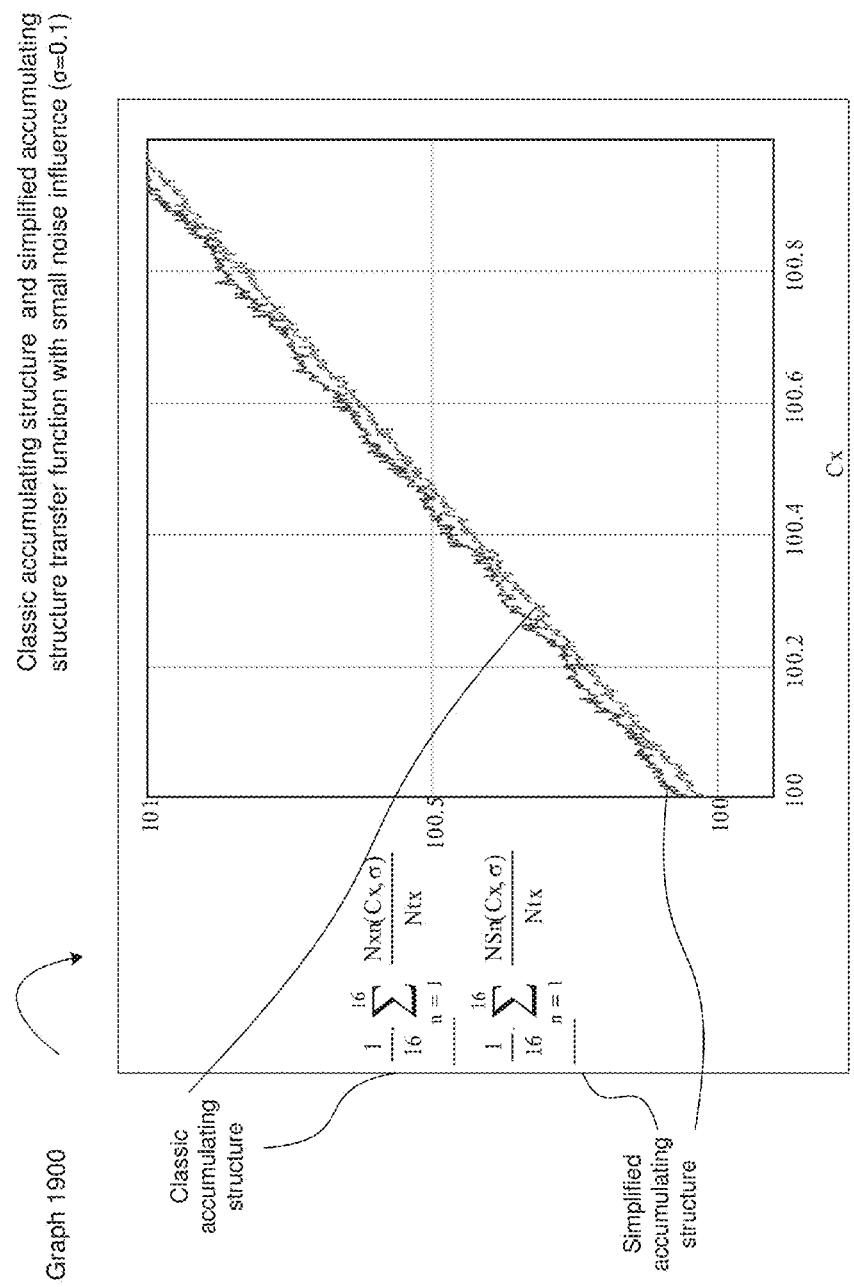
FIG. 19 is a graph comparing the transfer function of a classic accumulating structure with a simple accumulating structure with a small noise influence, according to one embodiment.

FIG. 19 is a graph comparing the transfer function of a classic accumulating structure with a simple accumulating structure with a small noise influence, according to one embodiment. As shown in graph 1900, when a small noise influence with magnitude around 0.1 of a single conversion quantization step is introduced, the simplified and conventional accumulating structures behave similarly. The difference is in the presence of an additive shift of conversion results obtained with a simplified accumulating structure relatively to the results of the conventional accumulating structure.

Figure 20:
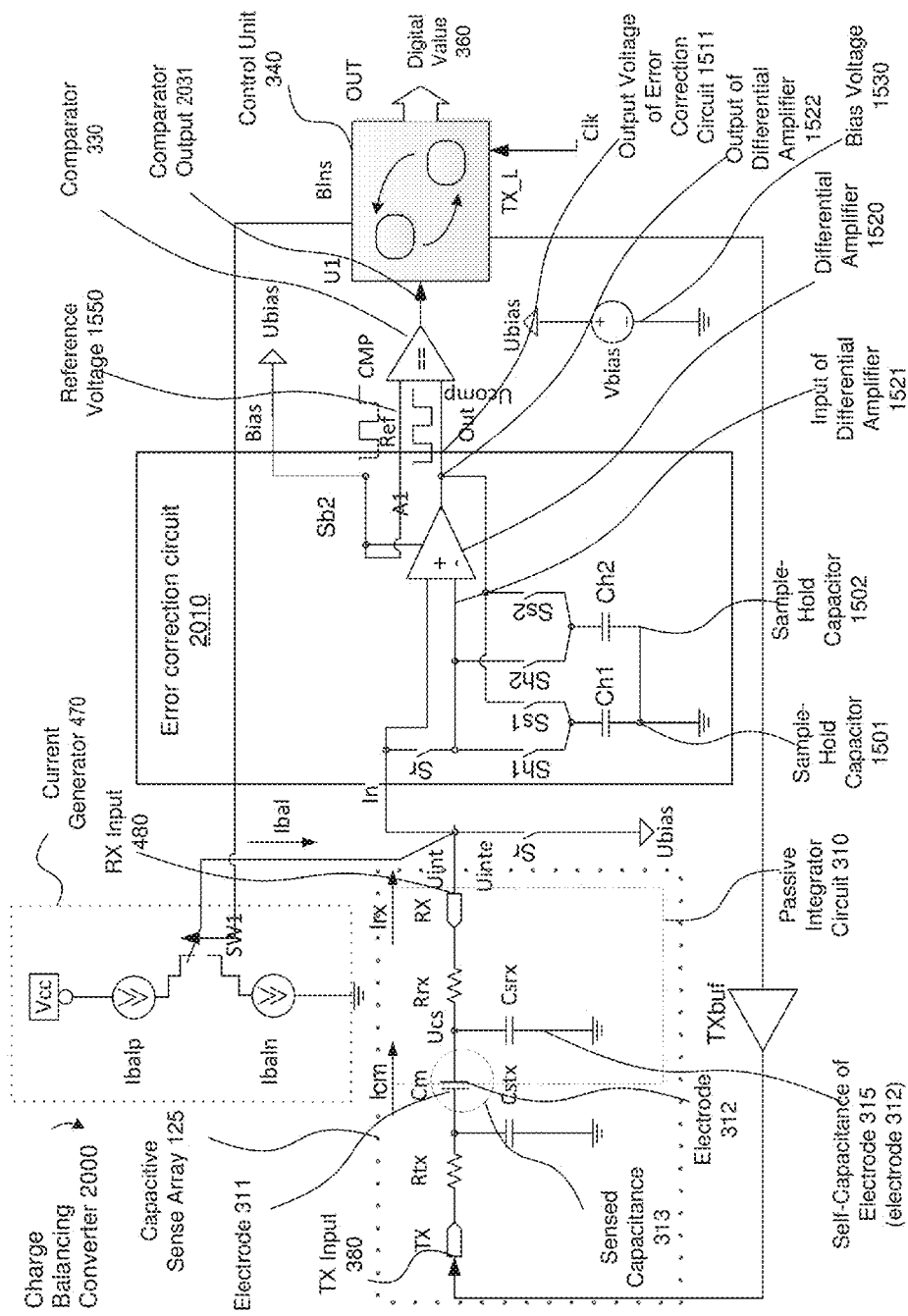
FIG. 20 illustrates a circuit implementation of a charge balancing circuit with an error correction circuit, according to another embodiment.

FIG. 20 illustrates a circuit implementation of a charge balancing circuit with an error correction circuit, according to another embodiment. Charge balance converter 2000 illustrates one version of the hardware implementation of the simplified accumulation structure. Similar to previous converter structure (e.g., FIG. 15) the proposed converters use two sample and hold capacitors (e.g., sample-hold capacitor 1501 (Ch1) and sample-hold capacitor 1502 (Ch2)) to store a quantization error and hold it as the comparator tripping voltage. The error voltage is formed as a difference between the voltage at the end of a conversion and the voltage used as the comparator tripping voltage. In FIG. 20, the model simplification allows for the removal of two switches (Sb1, Sb2) from error correction circuit 2010 that change the bias voltage (e.g., bias voltage 1530) of differential simplifier A1 (e.g., differential amplifier 1520). In this case, differential amplifier A1 bias voltage is constant and equal to the converter bias. The switch control logic is the same as in the previous case and is depicted in FIG. 17.

Figure 21:
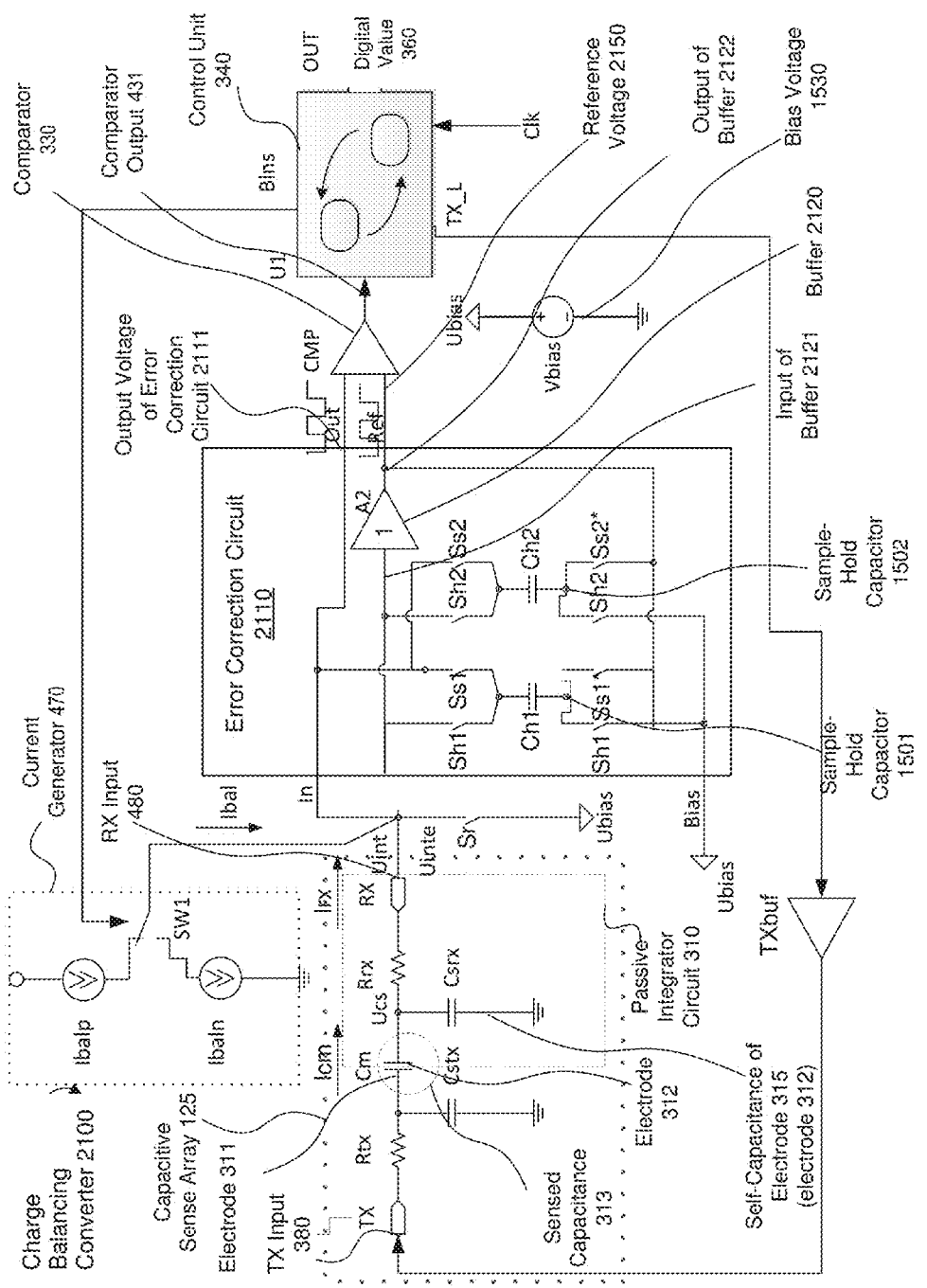
FIG. 21 illustrates a circuit implementation of a charge balancing circuit with an error correction circuit, according to another embodiment.

FIG. 21 illustrates a circuit implementation of a charge balancing circuit with an error correction circuit, according to another embodiment. Charge balance converter 2100 illustrates another version of the hardware implementation of the simplified accumulation structure. Similar to previous converter structure (e.g., FIG. 15) the proposed converters use two sample and hold capacitors (e.g., sample-hold capacitor 1501 (Ch1) and sample-hold capacitor 1502 (Ch2)) to store a quantization error and hold it as the comparator tripping voltage. The error voltage is formed as a difference between the voltage at the end of a conversion and the voltage used as the comparator tripping voltage. The error correction circuit contains a buffer 2120. The input of buffer 2121 is alternately connected to the two sample and hold capacitors (Ch1 and Ch2). The output of buffer 2122 is the reference voltage 2150 for comparator 330. The other input of comparator 330 is connected to output voltage of error correction circuit 2111.

Charge balancing converter 2100 contains switched capacitors (e.g., sample-hold capacitor 1501 (Ch1) and sample-hold capacitor 1502 (Ch2)) to implement equation Ucomp[n+1]=Uinte[n]−Ucomp[n]. Since the comparator tripping voltage is stored in small capacitors (e.g., sample-hold capacitor 1501 (Ch1) and sample-hold capacitor 1502 (Ch2)) the difference may be difficult to sample by connecting a sample capacitor directly to the comparator inputs which in turn have additional input capacitance. In this case, some amount of charge is stored on the holding capacitor (Ch1 or Ch2) and shared with the sampling capacitor (Ch2 or Ch1) and the remains of the voltage on the integrator (e.g., passive integrator circuit 310) or quantization error will be defined with a significant error. A buffer (e.g., buffer 2120) may be used to separate these nodes. The buffer 2120 may be a unity gain buffer. The switches marked * have common control with switches without this mark but with the same name. The switch control logic is the same as in the previous case and is depicted in FIG. 17.

In one embodiment, accumulating quantization error includes selectively coupling one of a first sample-hold capacitor or a second sample-hold capacitor (e.g., sample-hold capacitor 1501 or sample-hold capacitor 1502) to an input of buffer 2121 while coupling the other one of the first sample-hold capacitor or the second sample-hold capacitor to an output of the buffer 2122, wherein the error correction circuit 2110 includes the first sample-hold capacitor, the second sample-hold capacitor, and the buffer 2120.

Figure 22:
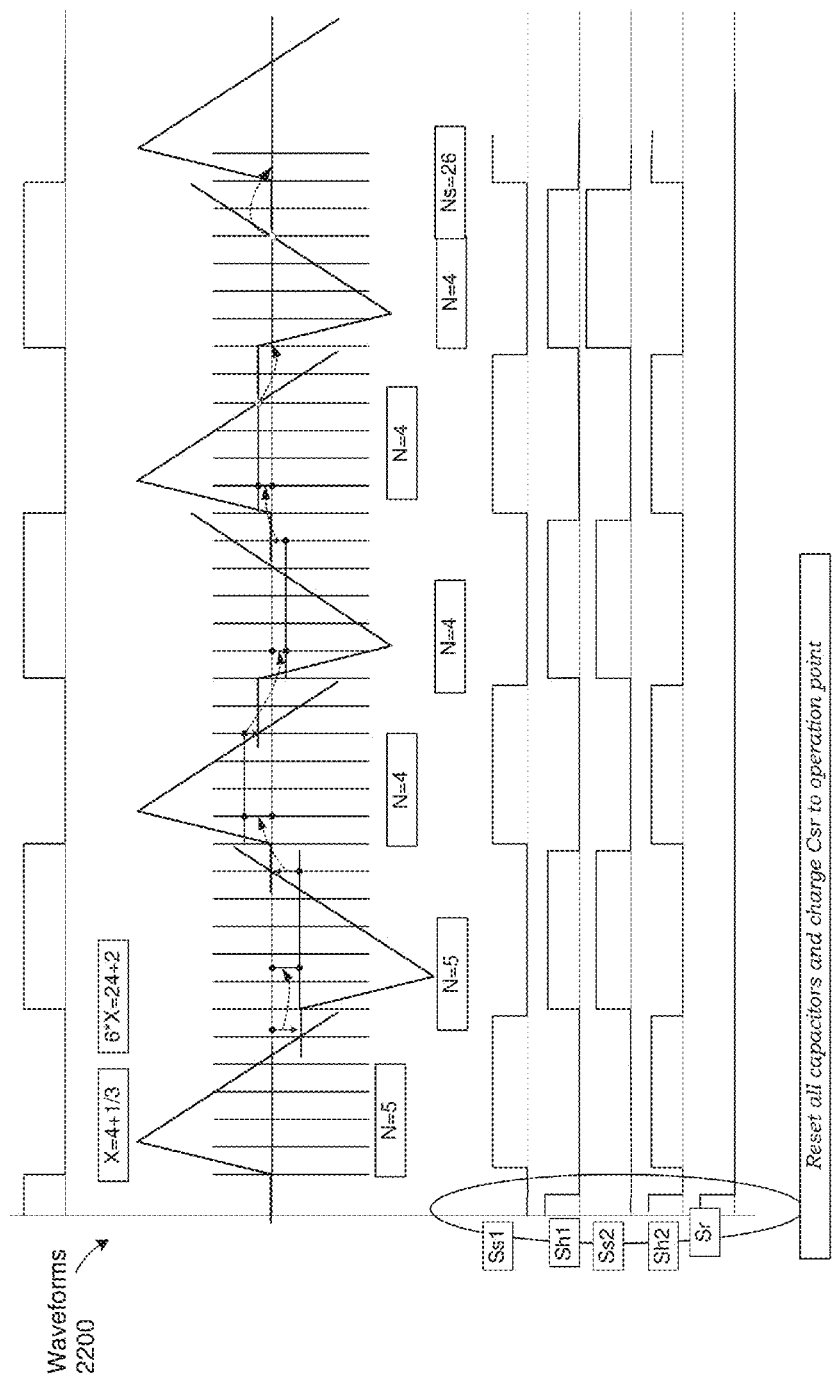
FIG. 22 shows waveforms illustrating the operation of the charge balancing converters depicted in FIGS. 20 and 21, according to another embodiment.

FIG. 22 shows waveforms illustrating the operation of the charge balancing converters depicted in FIGS. 20 and 21, according to another embodiment. Both converters have an initiation state named "Reset" before a conversion begins. The control of the sample-hold switches (e.g., sample-hold capacitor 1501 (Ch1) and sample-hold capacitor 1502 (Ch2)) is the same as in the converter depicted in FIG. 17. The second waveform in FIG. 22 shows the difference of the simplified architecture of the converter with the quantization error accumulation. The quantization error is accumulated separately for the conversion correlated with the positive and negative TX pulses edge. As a result, the simplified converter (e.g. charge balancing converter 2000 and 2100) needs two times more conversions to obtain a the same resolution as a conventional converter with accumulation.

Figure 23:
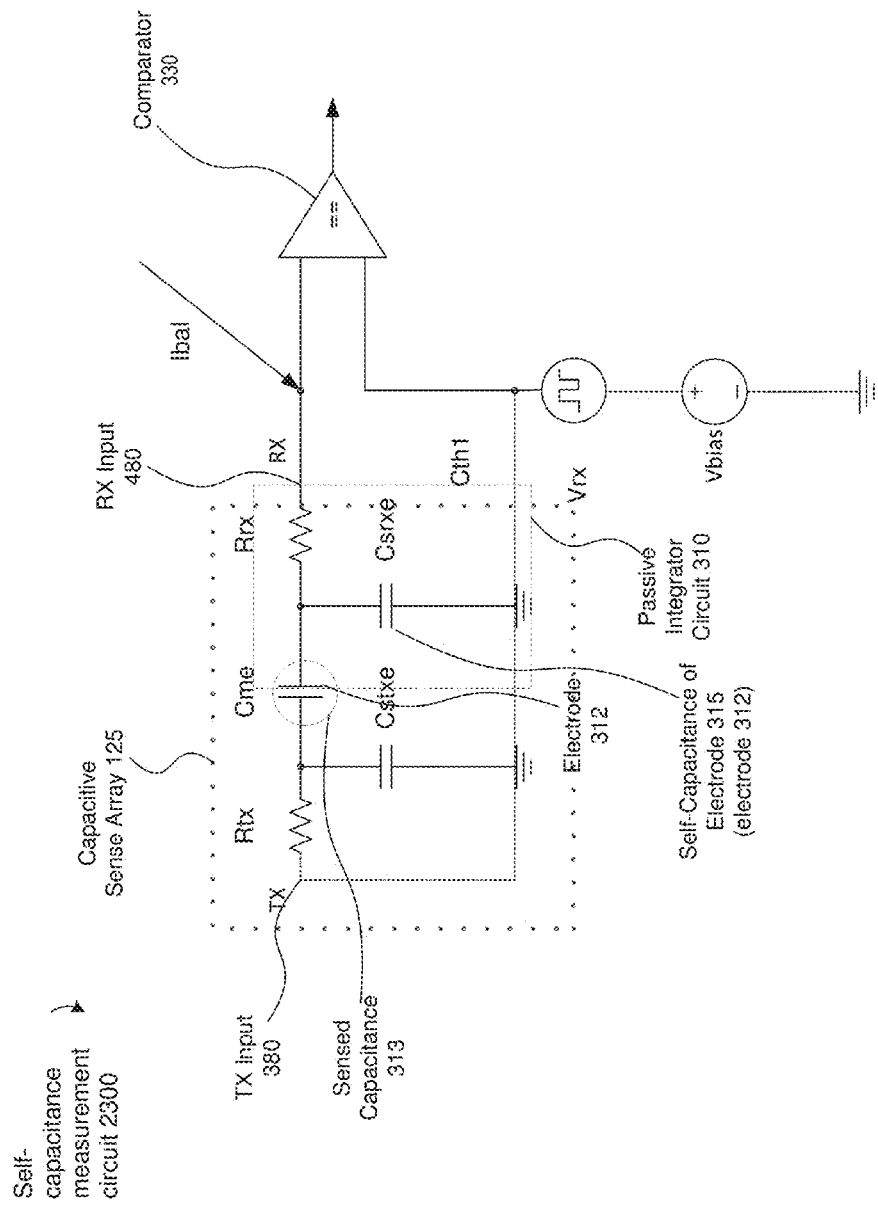
FIG. 23 illustrates an implementation of self-capacitance measurement with a passive integrator circuit, according to one embodiment.

FIG. 23 illustrates an implementation of self-capacitance measurement with a passive integrator circuit, according to one embodiment. The self-capacitance of a touch screen sensor (e.g., capacitive sense array 125) may be measured by measuring the charge received by the sensor capacitance when the voltage on the sensor capacitance increments. If the sensor RX node voltage changes on ΔUrx, then the charge stored in the sensor changes by ΔQrx=ΔUrx·(Cme+Csrxe), where Cme (e.g., sensed capacitance 313) is the total mutual capacitance connected to the RX node; Csrxe is the self-capacitance of the whole sensor RX line (e.g., self-capacitance of electrode 315). The mutual capacitance may be removed from measuring by applying to the TX node (e.g., TX input 380) the same voltage as in the RX node (e.g., RX input 480). The current flow through the Cm is absent in this case and no extra charge is stored in this capacitance. Self-capacitance measurement circuit 2300 illustrates an implementation of self-capacitance measurement (self-capacitance mode) of a channel with passive integrator circuit 310, where the self-capacitance of capacitive sense array is used as the integrating capacitor. The Vrx source of pulses varies the comparator tripping voltage. The comparator 330 turns on the balancing current source (Ibal) with a direction that allows recharging the sensor capacitance to the direction of the comparator tripping voltage variation. The balancing current flows till the sensor RX voltage reaches the comparator tripping voltage. Thereby the sensor RX node voltage changes by ΔUrx by recharging the sensor capacitance with balancing current Ibal during time Tbal or ΔUrx·(Cme+Csrxe)= Ibal·Tbal. If Urx and Ibal are known, then measuring Tbal allows for the detection of sensor capacitance.

Figure 24:
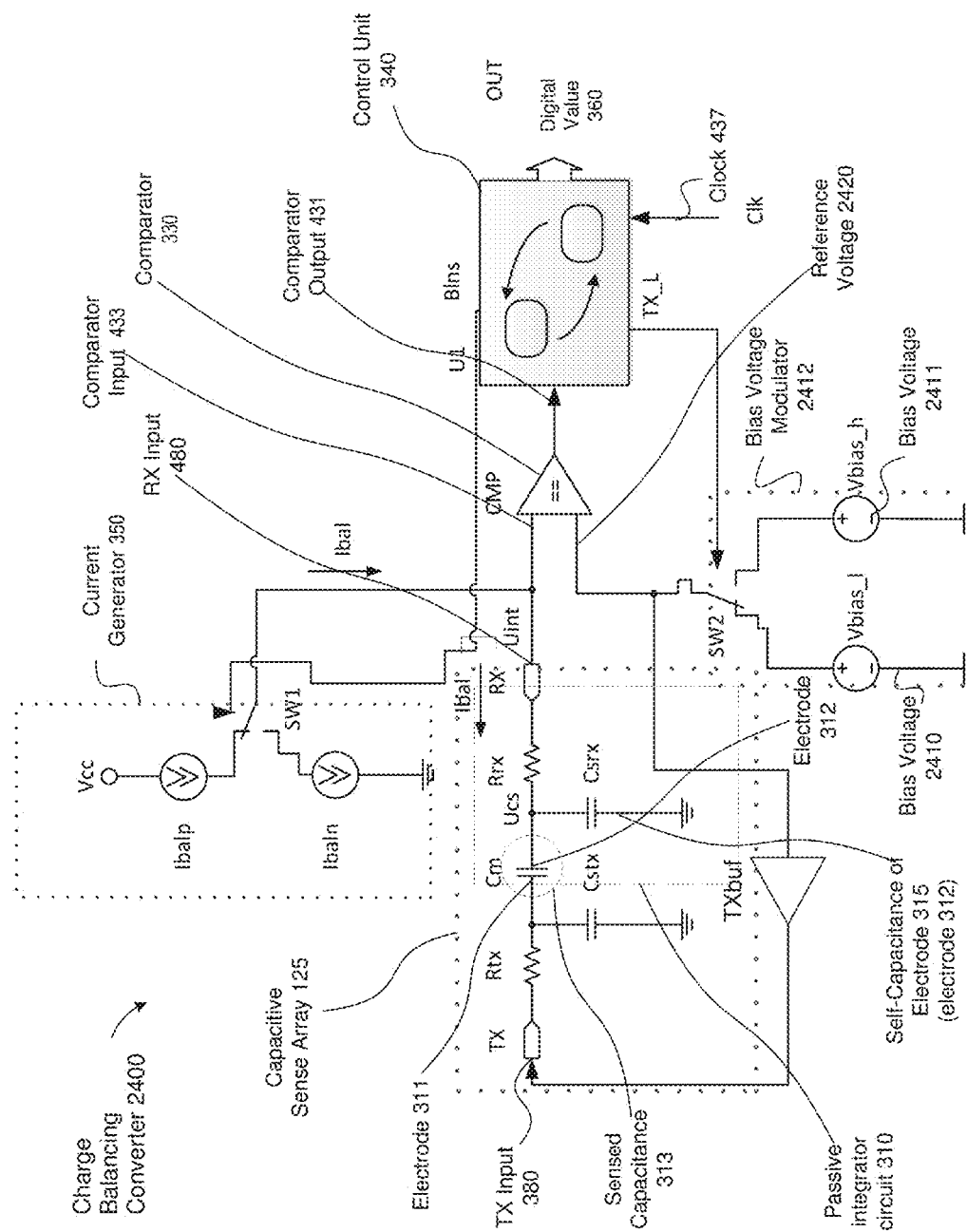
FIG. 24 illustrates an implementation a charge balancing converter in self-capacitance measurement mode, according to one embodiment.

FIG. 24 illustrates an implementation a charge balancing converter in self-capacitance measurement mode, according to one embodiment. Charge balancing converter 2400 shows the implementation of self-capacitance measurement into the relaxation channel depicted in FIG. 4. The comparator tripping voltage (e.g., reference voltage 2420) modulation is implemented by switching between the two bias voltages (e.g., bias voltage 2410 and bias voltage 2411) by bias voltage modulator 2412 in a synchrony with the TX logic signal. The difference between these voltages gives RX modulating voltage ΔUrx. The comparator modulated bias is applied directly to the sensor TX electrode through buffer TXbuf to eliminate sensitivity to the sensor mutual capacitance.

In one embodiment, the bias voltage of the error correction circuit is varied (e.g., bias voltage modulator 2412 modulates between bias voltage 2410 and bias voltage 2411) when the capacitance-sensing circuit measures the electrode of the capacitive sense array 125 in self-capacitance measuring mode.

Figure 25:
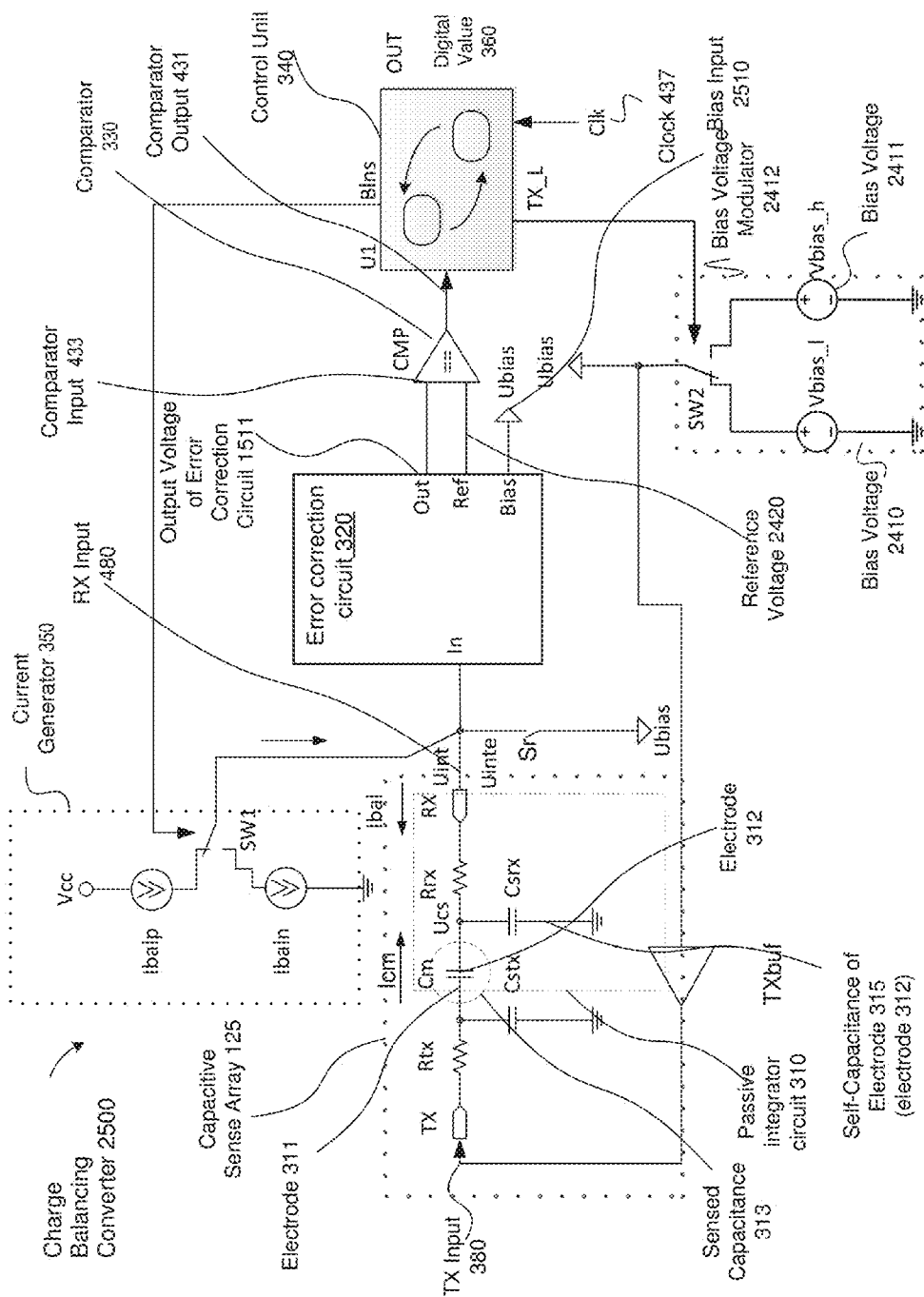
FIG. 25 illustrates an implementation a charge balancing converter in self-capacitance measurement mode, according to another embodiment.

FIG. 25 illustrates an implementation a charge balancing converter in self-capacitance measurement mode, according to another embodiment. Charge balancing converter 2500 shows a charge balancing converter with passive integrator circuit 310 and an error correction circuit 320 to accumulate quantization error. The charge balancing converter 2500 may be implemented in self-capacitance measuring mode by applying modulation to the bias node. The error correction circuit 320 is inserted between the sensor RX output (e.g., RX input 480) and comparator input (e.g., comparator input 433). Error correction circuit bias input (e.g., bias input 2510) is connected to bias voltage modulator (e.g., bias voltage modulator 2412 output SW2. It should be noted that error correction circuit 320 may be implemented by at least any error correction circuit described in this document.

In one embodiment, the bias voltage (e.g., Ubias that is switched by bias voltage modulator 2412) is coupled to the error correction circuit 320 and a transmission (TX) input (e.g., TX input 380) of the capacitive sense array.

Figure 26:
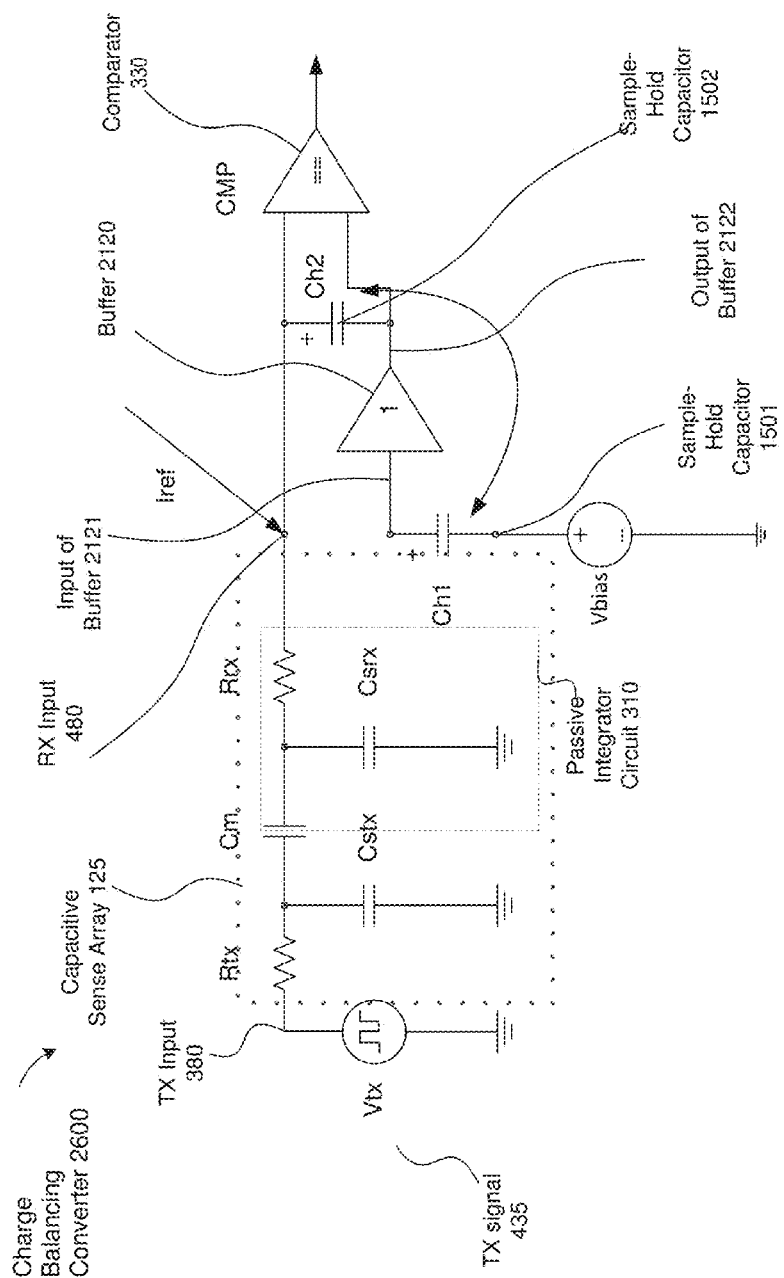
FIG. 26 illustrates a simplified representation a charge balancing converter with an error correction circuit, according to one embodiment.

FIG. 26 illustrates a simplified representation of a charge balancing converter with an error correction circuit, according to one embodiment. Charge balancing converter 2600 shows a simplified representation of a converter with the error correction circuit that is based on switched capacitors (e.g., sample-hold capacitor 1501 (Ch1) and sample-hold capacitor 1502 (Ch2)) and a buffer (e.g., buffer 2120). Buffer 2120 may be a unity gain buffer. This figure explains the capacitor switching procedure. Capacitor Ch1 plays the role of the holding capacitor and capacitor Ch2 plays the role of the sampling capacitor. At the end of the TX half-period, before the following TX edge, these capacitors interchange. With a converter based on a passive integrator (e.g., passive integrator circuit 310), the voltage on the comparator input does not stay at the comparison level after the comparator changes state and the balancing current is off. A voltage drop on the RX line resistance causes an unbalanced charge presence in the RX cells. This charge goes back to the voltage on the RX input to the value equal to a voltage drop on the RX line caused by the balancing current flow. As a result, a stair after balancing occurs (see FIG. 27). Theoretically, this stair may be compensated by the error correction circuit. But the buffer (e.g., buffer 2120) and comparator (e.g., comparator 330) have some input capacitance. Therefore, the switching of the track and hold (T&H) capacitors (e.g., sample-hold capacitor 1501 (Ch1) and sample-hold capacitor 1502 (Ch2)) of the error correction circuit lead to charge sharing with these input capacitances.

Figure 27:
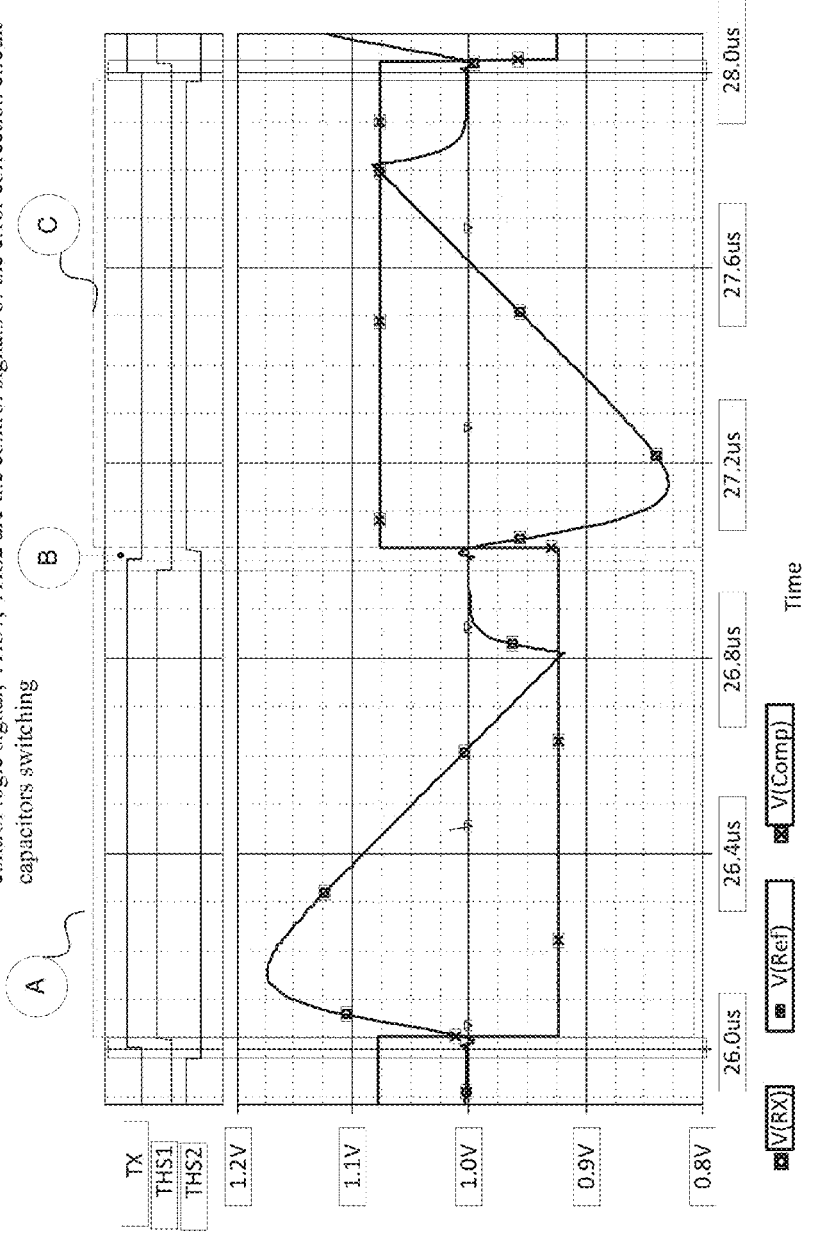
FIG. 27 shows waveforms illustrating a charge balancing converter with an error correction circuit and a passive integrator circuit, according to one embodiment.

FIG. 27 shows waveforms illustrating a charge balancing converter with an error correction circuit and a passive integrator circuit, according to one embodiment. Waveforms 2700 show the influence of the unity gain buffer input (e.g., input of buffer 2121) capacitance. FIG. 27 shows the waveforms of operation of the quantization error accumulation balancing converter based on a passive integrator circuit (e.g., passive integrator circuit 310). A high RX resistance (4 kOhm) was chosen. V(Ref) shows the integrator operation point. V(RX) shows the voltage on the RX input (e.g., RX input 480) (the integrating capacitor voltage (Csrx) applied to the first comparator input). V(Comp) shows the voltage on the second comparator input (comparator response level). TX is the excitation control logic signal. THS1 and THS2 are the control signals for the error correction circuit switching capacitors.

Figure 28:
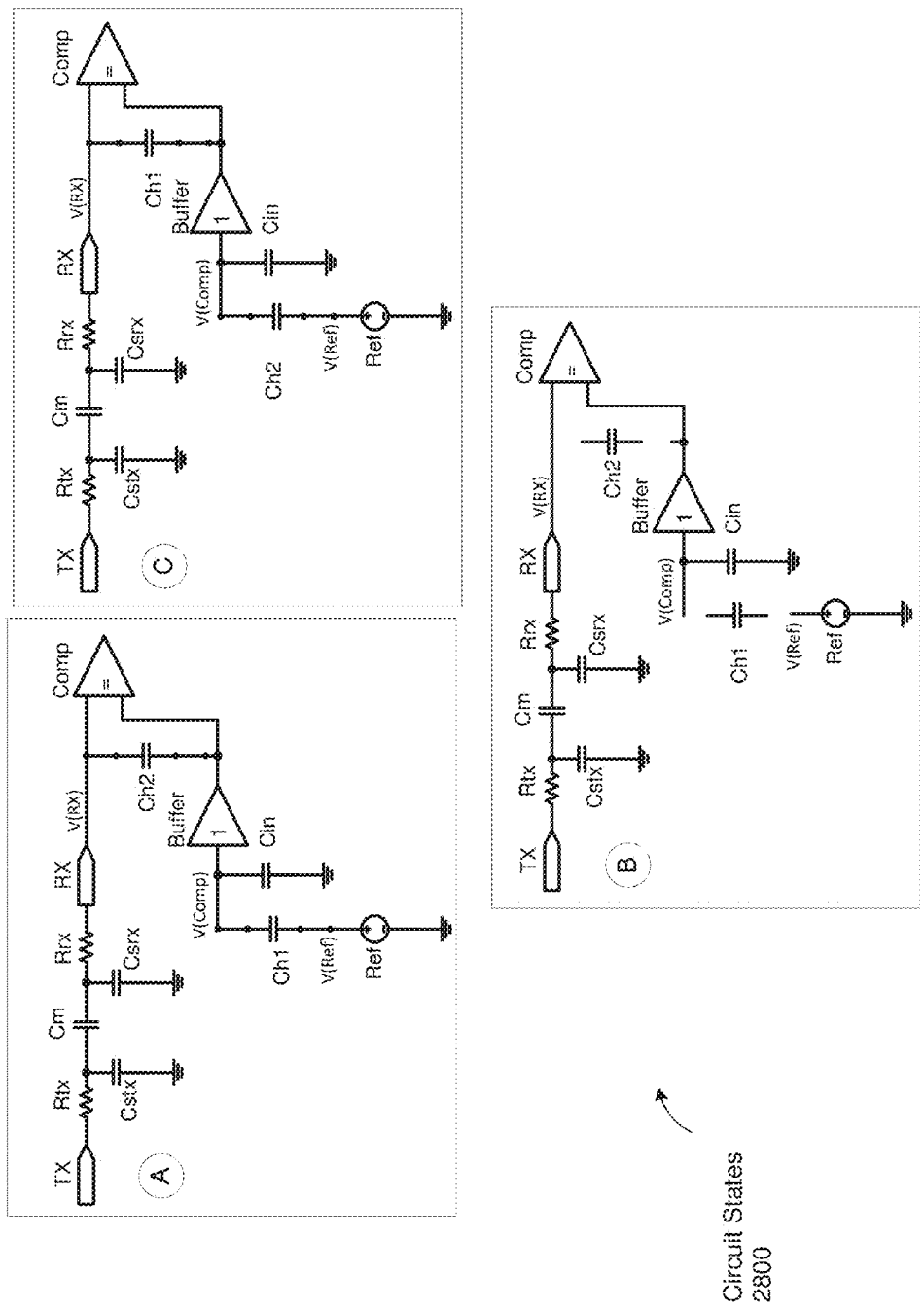
FIG. 28 illustrates the circuit configuration of different states of a charge balancing converter with an error correction circuit and a passive integrator circuit, according to one embodiment.

The comparator response level is defined by the voltage on the T&H capacitors (e.g., sample-hold capacitor 1501 (Ch1) and sample-hold capacitor 1502 (Ch2)). Every TX half period the capacitors position rearranges (one capacitor replaces another capacitor). The switching of the T&H capacitors is controlled by signals THS1 and THS2. The area marked A represents the operation in the first TX half period. The area marked C represents the operation in the second TX half period. During the full TX period (as represented by areas A and C), the T&H capacitors are connected to the circuit (e.g., charge balancing converter 2600) but they are in the alternately coupled. In area B, both T&H capacitors are disconnected from the circuit. FIG. 28 shows the converter configurations in these three states. The nodes where the voltage waveforms are observed are pointed in this FIG. 28. Areas A, B, and C may also be referred to as states and/or stages.

FIG. 28 illustrates the circuit configuration of different states of a charge balancing converter with an error correction circuit and a passive integrator circuit, according to one embodiment. Circuit states 2800 shows charge balancing converter 2600 in states A, B, and C, as described in FIG. 27.

Figure 29:
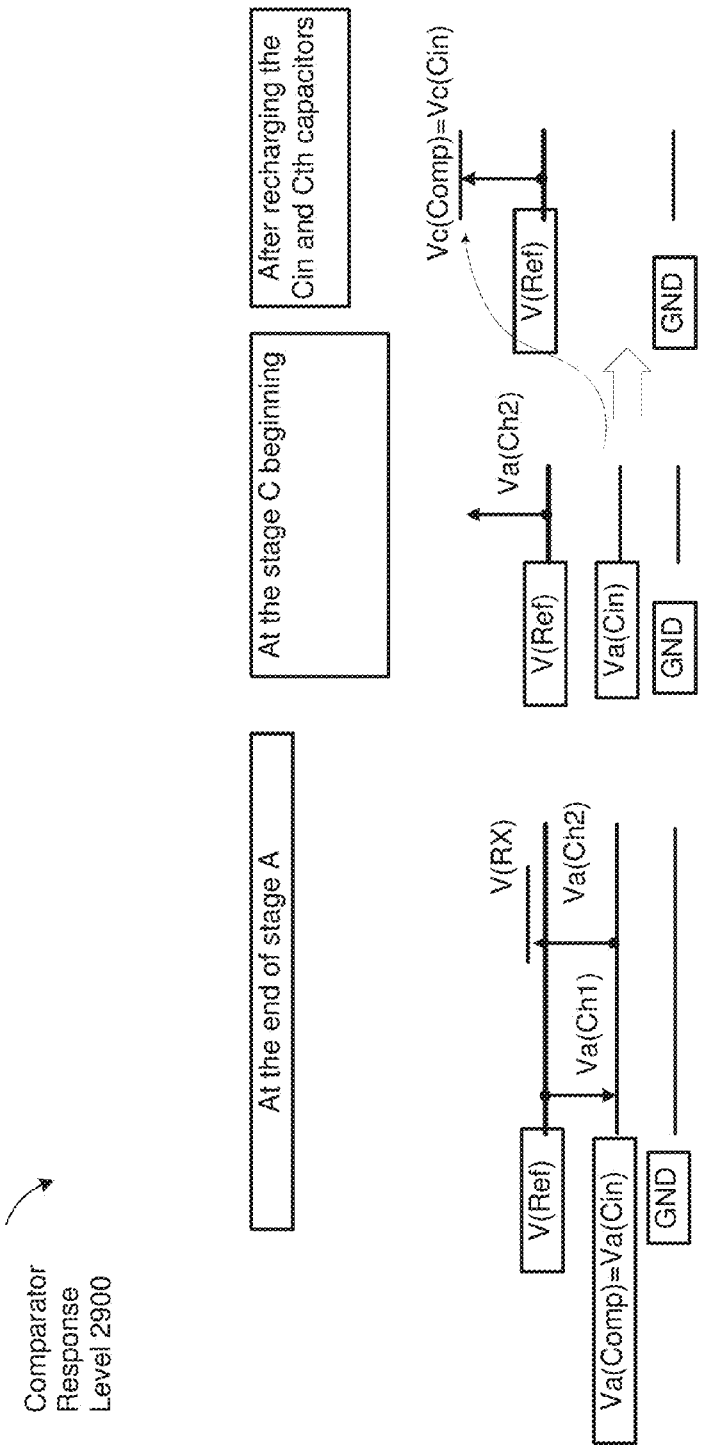
FIG. 29 illustrates the response level of the comparator of a charge balancing converter with an error correction circuit and a passive integrator circuit during a conversion, according to one embodiment.

FIG. 29 illustrates the response level of the comparator of a charge balancing converter with an error correction circuit and a passive integrator circuit during a conversion, according to one embodiment. Comparator response level 2900 shows that at the end of stage A, capacitors Ch1 and Ch2 are charged to voltage Va(Ch1) and Va(Ch2). The vectors in this figure show the voltage polarity on those capacitors (e.g., sample-hold capacitor 1501 (Ch1) and sample-hold capacitor 1502 (Ch2)). The voltages on these capacitors are in opposite polarity.

At the stage C beginning, capacitor Ch2 is reconnected to the position of capacitor Ch1 and is connected in parallel with the buffer input capacitance. This causes an equalization of the voltage on the capacitors, Ch1 and the input capacitance. If both of the T&H capacitors have the same value then Ch1=Ch2=Ch. The charges collected on the capacitances are $$Q_{ACh1} = \overline{V}a(Ch1) \cdot Ch1; \quad Q_{ACh2} = \overline{V}a(Ch2) \cdot Ch2; \quad Q_{ACin} = \overline{V}a(Ch1) \cdot Cin.$$

$\overline{V}a$ represents the voltage vector at stage A. The charge collected on Ch2 and Cin after being connected in parallel is $$Q_{C\,Ch2\&Cin} = \overline{V}a(Ch2)\cdot Ch2 + \overline{V}a(Ch1)\cdot Cin = |\overline{V}a(Ch2)\cdot Ch2| - |\overline{V}a(Ch1)\cdot Cin|.$$

The voltage on the comparator input in Stage C is $$Vc(Comp) = \frac{Va(Ch2)\cdot Ch - Va(Ch1)\cdot Cin}{Ch + Cin} + Vref$$

where Vref is the reference voltage for the converter operation. The T&H capacitors store stair voltage Vstair and quantization error voltage in the normal operation condition. Taking into account that the quantization error voltage is much smaller than the stair voltage, the following equation $\Delta Urx\cdot(Cme+Csrxe)=Ibal\cdot Tbal$ may be written as:

$$Vc(Comp) = \frac{Ch - Cin}{Ch + Cin}\cdot Vsair + Vref\Box\left(1 - \frac{2\cdot Cin}{Ch}\right)\cdot Vstair +$$

$$Vref\Box\Box\left(1 - \frac{2\cdot Cin}{Ch}\right)\cdot Iref\cdot Rrx + Vref =$$

$$\left(1 - \frac{2\cdot Cin}{Ch}\right)\cdot\frac{2\cdot Cm\cdot Ftx\cdot Vtx}{0.8}\cdot Rrx + Vref$$

where Cm is the sensor mutual capacitance; Ftx is the TX frequency; Vtx is the TX voltage; Rrx is an equivalent RX line resistance; 0.8 is the balancing duty cycle (the ratio of the TX half-period time to the balancing time).

Increasing the ratio between the buffer input capacitance and the T&H capacitance increases the effect of the converter response degradation, proportionally. In addition, the charge sharing causes some noise rectification effect.

Figure 30:
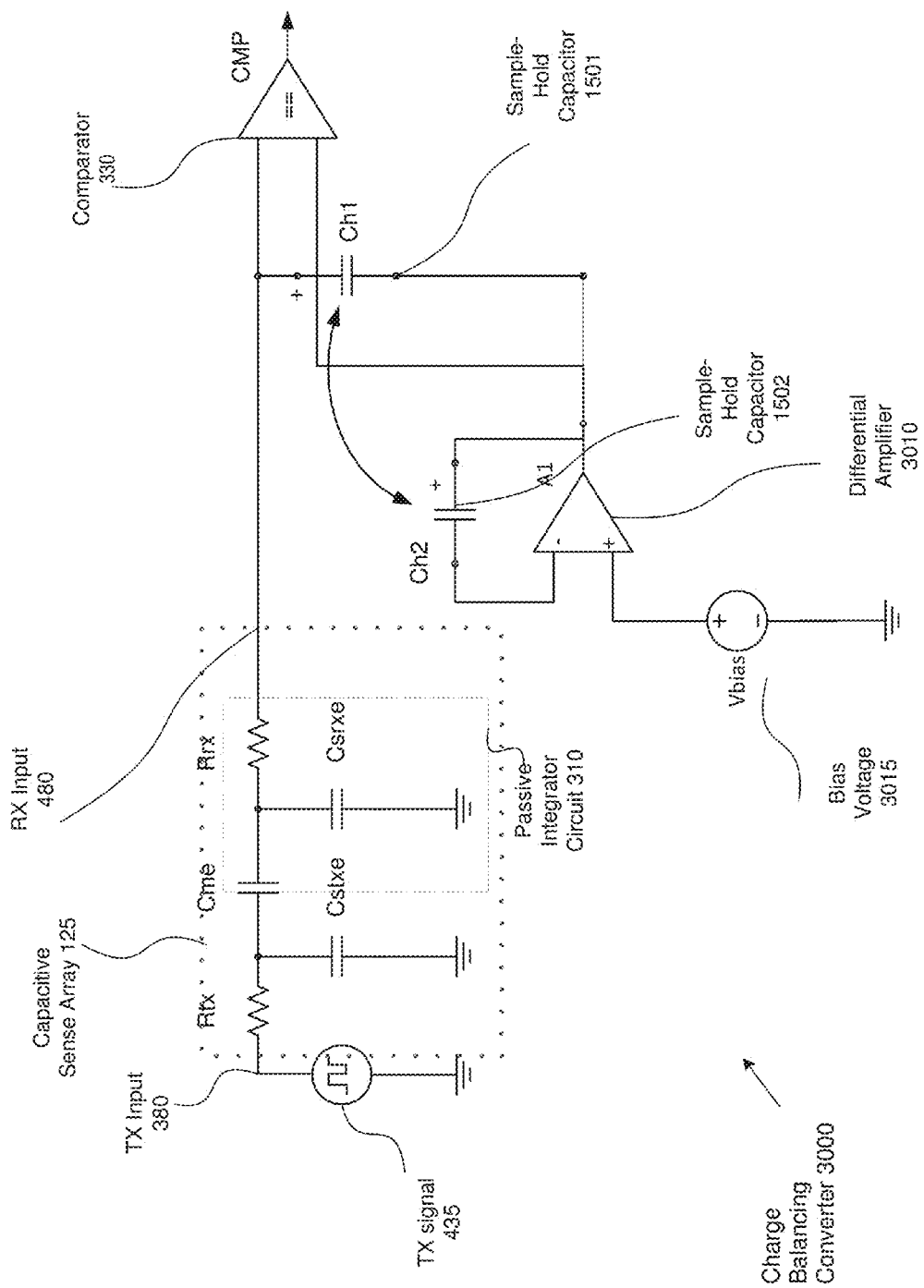
FIG. 30 illustrates a simplified representation of an error correction circuit with an differential amplifier, according to one embodiment.

FIG. 30 illustrates a simplified representation of an error correction circuit with an differential amplifier, according to one embodiment. The error correction circuit (e.g., error correction circuit 2110) depicted in FIG. 21 may be modified to eliminate the impact of the buffer input capacitance. Different from the circuit with a buffer as illustrated by the simplified scheme in FIG. 26, the proposed scheme (charge balancing converter 3000) contains an differential amplifier (e.g., differential amplifier 3010) instead of the buffer. In a one embodiment, a differential amplifier 3010 may be an operational amplifier.

In one embodiment, the holding capacitor (e.g., sample-hold capacitor 1502) is placed to the differential amplifier feedback loop. The sum of the voltage that is held on the holding capacitor and the bias voltage (e.g., bias voltage 3015) defines the comparator tripping voltage. The tracking capacitor (e.g., sample-hold capacitor 1501) is connected to the comparator input in parallel and stores the error that remains on the comparator output at the end of a conversion. This error is used as a new reference point of the comparator (e.g., comparator 330) in the next conversion. The voltage on the differential amplifier's inverting input is constant during an operation and the differential amplifier input capacitance doesn't recharge. This means that the value of the differential amplifier input capacitance does not impact the conversion result. In addition, the comparator reference input is always connected to the differential amplifier output and its parasitic capacitance is recharged by the differential amplifier output without disturbance of the holding voltage. All these factors allow reducing the requirements for the input capacitances of the differential amplifier and comparator.

Figure 31:
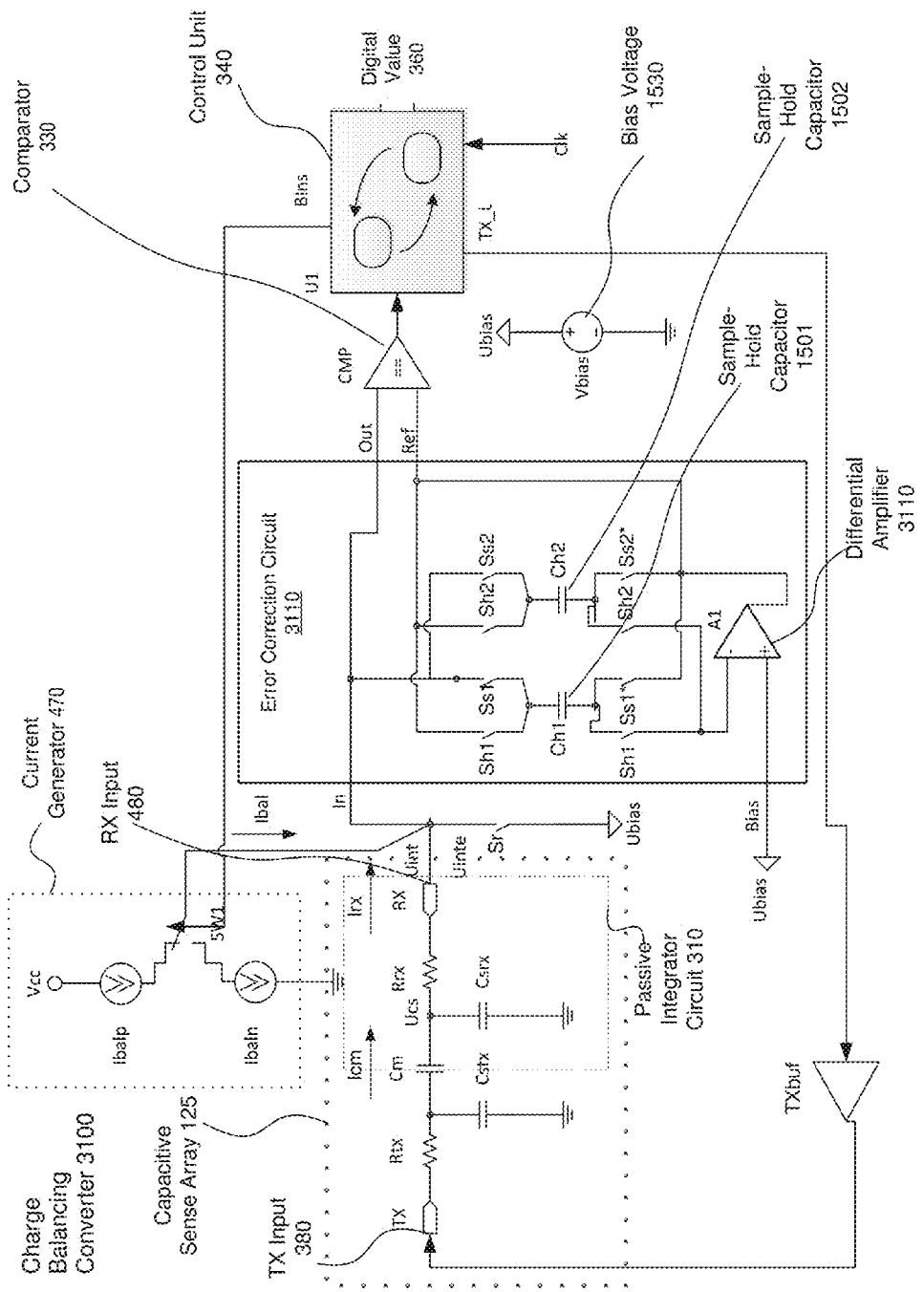
FIG. 31 illustrates an error correction circuit with an differential amplifier, according to one embodiment.

FIG. 31 illustrates an error correction circuit with an differential amplifier, according to one embodiment. Charge balancing converter 3100 implements an error correction circuit (e.g., error correction circuit 3110) with an differential amplifier (e.g., differential amplifier 3110) instead of buffer.

Error correction circuit 3110 may not remove the impact of the parasitic capacitance of the switches that connect the T&H capacitors (e.g., sample-hold capacitor 1501 (Ch1) and sample-hold capacitor 1502 (Ch2)) to the ground (Cp1 . . . Cp4 in FIG. 32).

In one embodiment, accumulating quantization error includes selectively coupling one of a first sample-hold capacitor or a second sample-hold capacitor (e.g., sample-hold capacitor 1501 or sample-hold capacitor 1502) in a feedback configuration between an input and an output of a differential amplifier (e.g., differential amplifier 3110) while coupling the other one of the first sample-hold capacitor or the second sample-hold capacitor to the output of the differential amplifier, wherein the error correction circuit 3110 includes the first sample-hold capacitor, the second sample-hold capacitor, and the differential amplifier.

Figure 32:
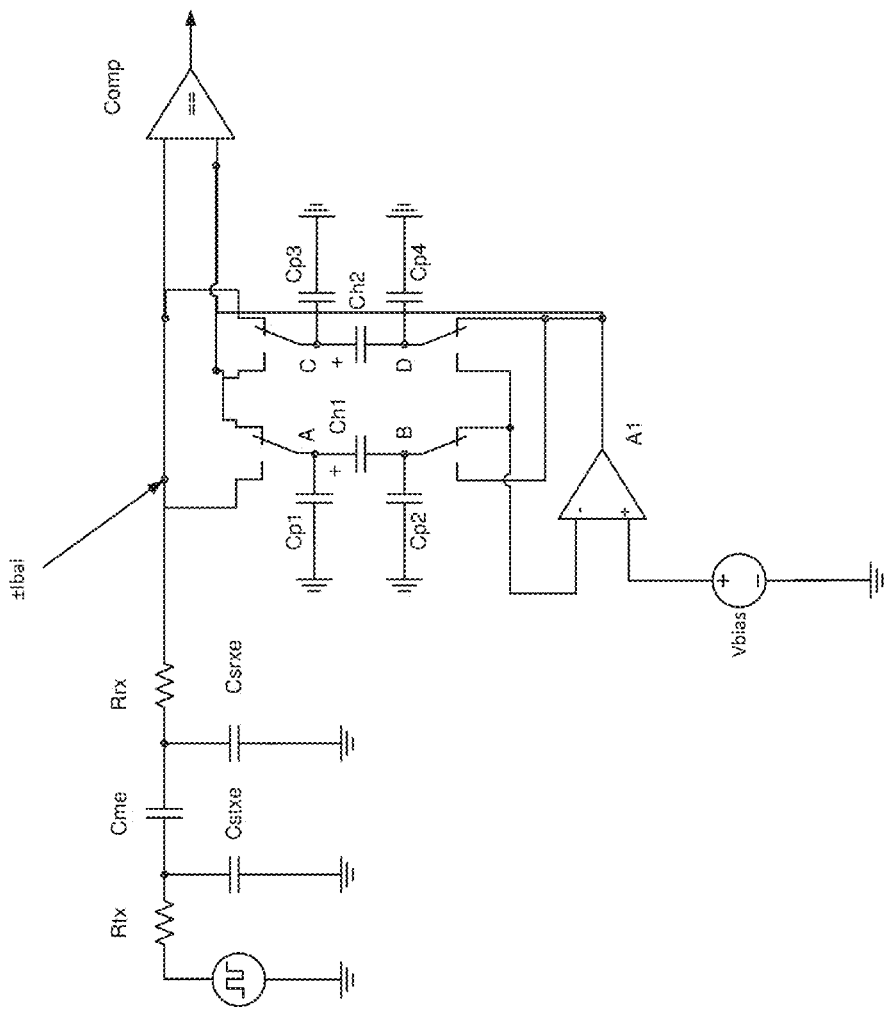
FIG. 32 illustrates an error correction circuit with parasitic capacitance of the switches, according to one embodiment.

FIG. 32 illustrates an error correction circuit with parasitic capacitance of the switches, according to one embodiment. In charge balancing converter 3200, the potentials of the T&H capacitors nodes (nodes A,B,C,D) change after the capacitor replacement because the voltage on the differential amplifier inverting input, the differential amplifier output, and the comparator input that connects to the sense array are different at the end of a conversion. These parasitic capacitances (Cp 1 . . . Cp4) define a minimal value of the T&H capacitances (e.g., sample-hold capacitor 1501 (Ch1) and sample-hold capacitor 1502 (Ch2)) that allows ignoring the charge sharing effect. Usually ratio Ch/Cp>100 is enough to ignore this effect. But on the other hand the big value of the T&H capacitors causes significant charge sharing of the sensor capacitance with the T&H capacitors. This effect may limit the maximum value of the T&H capacitors. In one embodiment, the design objective is to minimize the area that is occupied by the measuring channel. In this case a small value of the T&H capacitors may be desired, which is in conflict with the required ratio of Ch/Cp.

Figure 33:
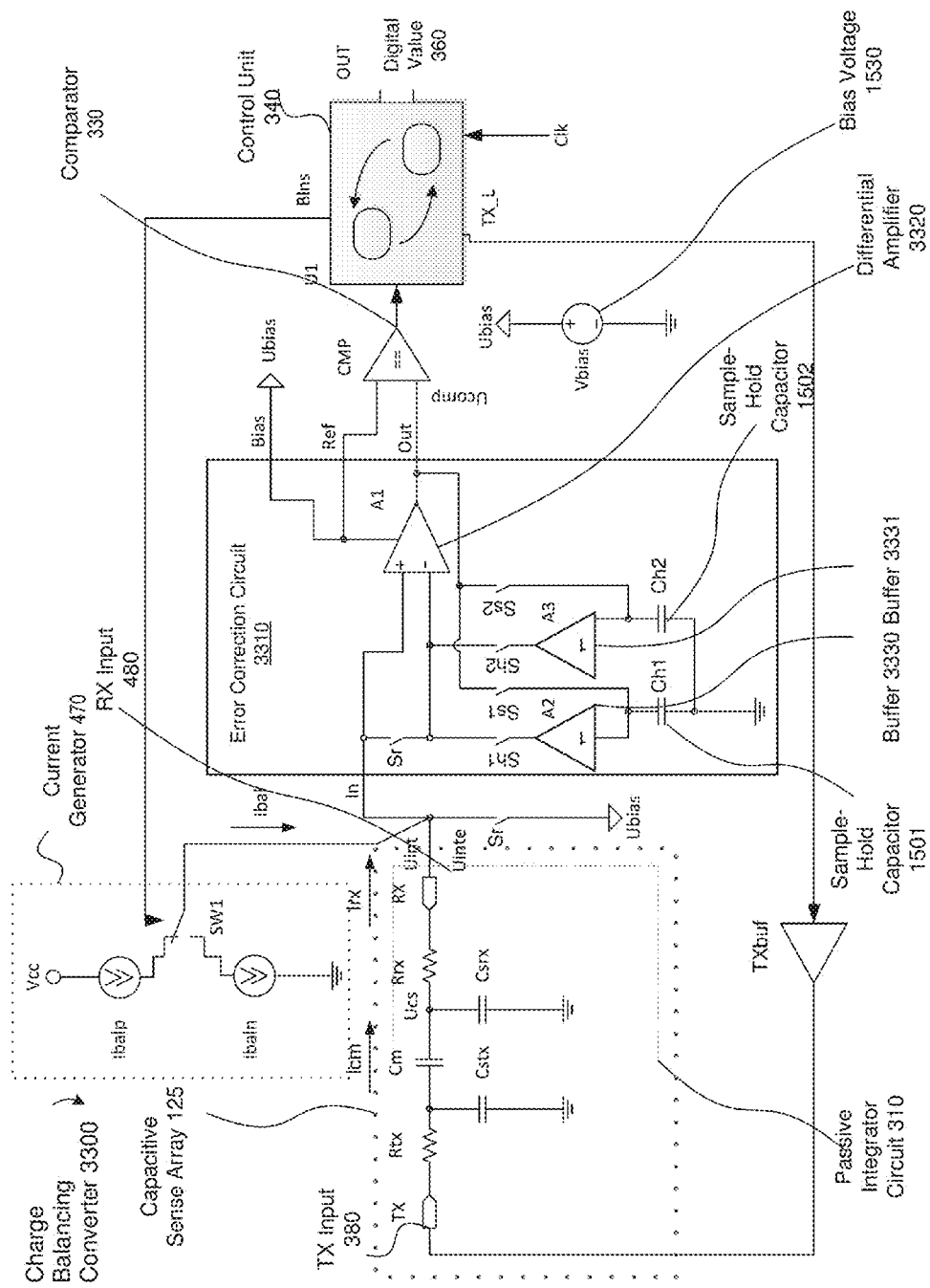
FIG. 33 illustrates an error correction circuit with a differential amplifier, according to one embodiment.

FIG. 33 illustrates an error correction circuit with a differential amplifier, according to one embodiment. Charge balancing converter 3300 includes error correction circuit 3310 that is based on the differential amplifier (e.g., differential amplifier 3320) on the comparator input. The configuration allows building an error correction circuit (e.g., error correction circuit 3310 that is insensitive to the parasitic capacitances. Two additional buffers A2, A3 (e.g., buffer 3330 and buffer 3331, respectively) are connected in a chain splitting configuration between the sample capacitors Ch1, Ch2 (e.g., sample-hold capacitor 1501 (Ch1) and sample-hold capacitor 1502 (Ch2)) and switches Sh1, Sh2 that connect the sampling capacitor to differential amplifier A1 (e.g., differential amplifier 3320).

The parasitic capacitances of switches Sh1 and Sh2 are always connected to the low impedance output of one of buffers A2, A3 (e.g., buffer 3330 and buffer 3331, respectively). Charge sharing is caused by the parasitic capacitances of switches Sh1 and Sh2. Sampling switches Ss1 and Ss2 are connected between the output of differential amplifier A1 and the node where the T&H capacitors are connected to the input of buffers A2, A3. During tracking the output voltage of the differential amplifier, all capacitances including the parasitic capacitances of the switch (Ss1 or Ss2), and buffer (A2 or A3) are connected to the low impedance output of differential amplifier A1. When the switch (Ss1 or Ss2) opens the voltage on the buffer (A2 or A3) does not change because the capacitance and charge collected on the capacitances that are connected to the buffer (A2 or A3) remain unchanged.

In one embodiment, accumulating quantization error includes selectively coupling one of a first sample-hold capacitor or a second sample-hold capacitor (e.g., sample-hold capacitor 1501 or sample-hold capacitor 1502) to an input of a buffer (e.g., buffer 3330) while coupling the other one of the first sample-hold capacitor or the second sample-hold capacitor to an output of a differential amplifier (e.g., differential amplifier 3320), wherein an output of the buffer is coupled to an input of the differential amplifier, wherein the error correction circuit 3310 comprises the first sample-hold capacitor, the second sample-hold capacitor, the buffer, and the differential amplifier.

Figure 34:
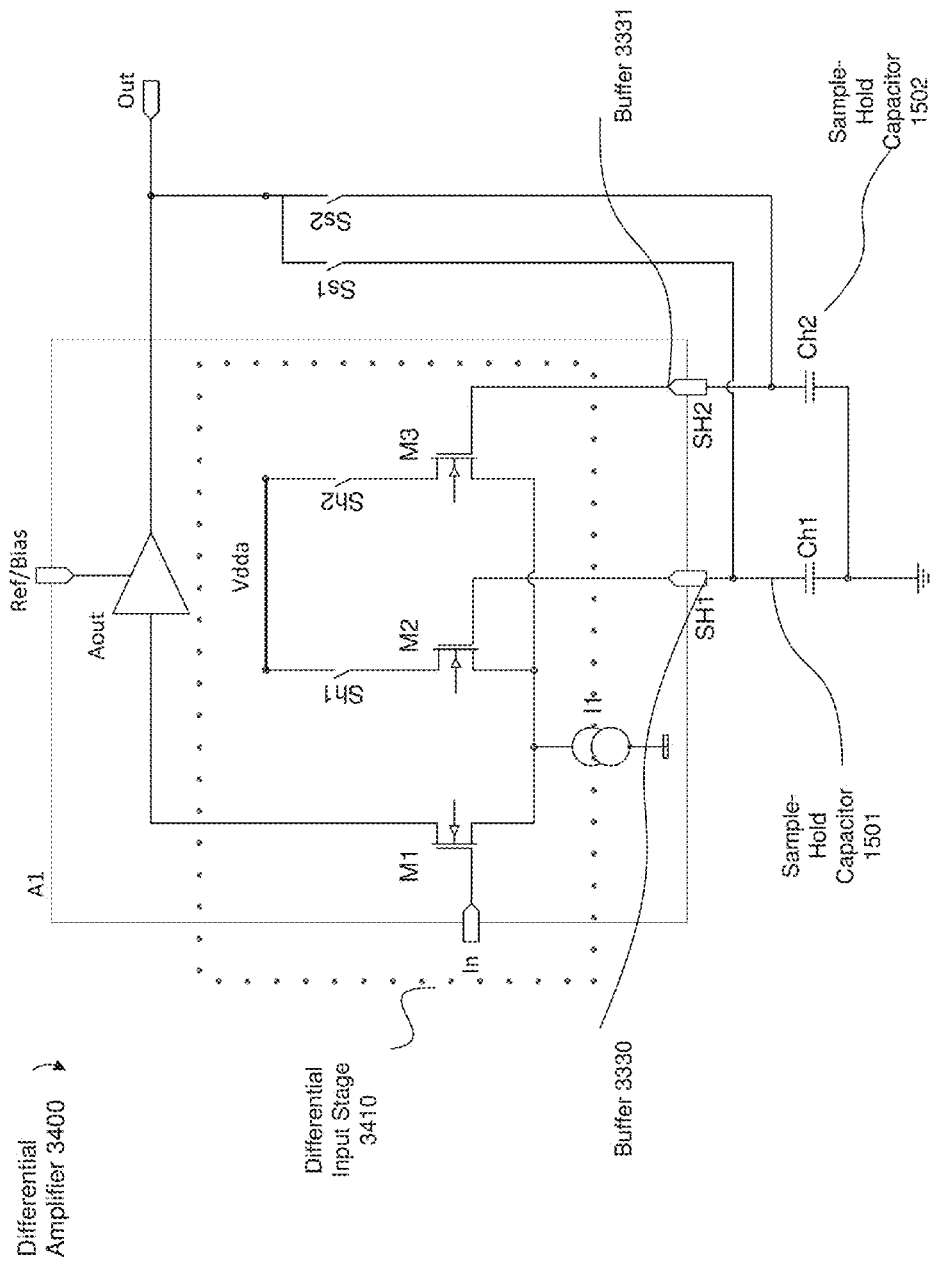
FIG. 34 illustrates an implementation of a buffer, according to one embodiment.

FIG. 34 illustrates an implementation of a buffer, according to one embodiment. Differential amplifier 3400 modifies the input state of a differential amplifier A1 (e.g., differential amplifier 3320) to implement the additional buffers (e.g., buffer 3330 and buffer 3331). Usually a differential amplifier contains a differential input stage with two inputs. Taking into account that buffers A2 and A3 alternate connecting to the input of differential amplifier A, one leg of amplifier A1 may be switched to form two time shared inputs.

In one embodiment, switches Sh1 and Sh2 connect transistors M2 and M3 to power source Vdda, synchronized with the excitation signal (not shown). As a result, an active differential input stage that is alternately connected to respective T&H capacitor Ch1 or Ch2. The transistor M1 in opposite leg of the amplifier A1 input stage forms the output current of the differential input stage. Transistor M1 is connected to the following stage, Aout, of amplifier A1 as it is in the original design. As such, amplifier A1 obtains split inverting inputs SH1 and SH2 that are connected to the T&H capacitors directly and switched to amplifier A1 differential input stage internally.

In one embodiment, the buffering of one of the first sample-sample hold capacitors or the second sample-hold capacitor (e.g., sample-hold capacitor 1501 or sample-hold capacitor 1502) with a differential input stage 3410 of the differential amplifier 3400.

Figure 35:
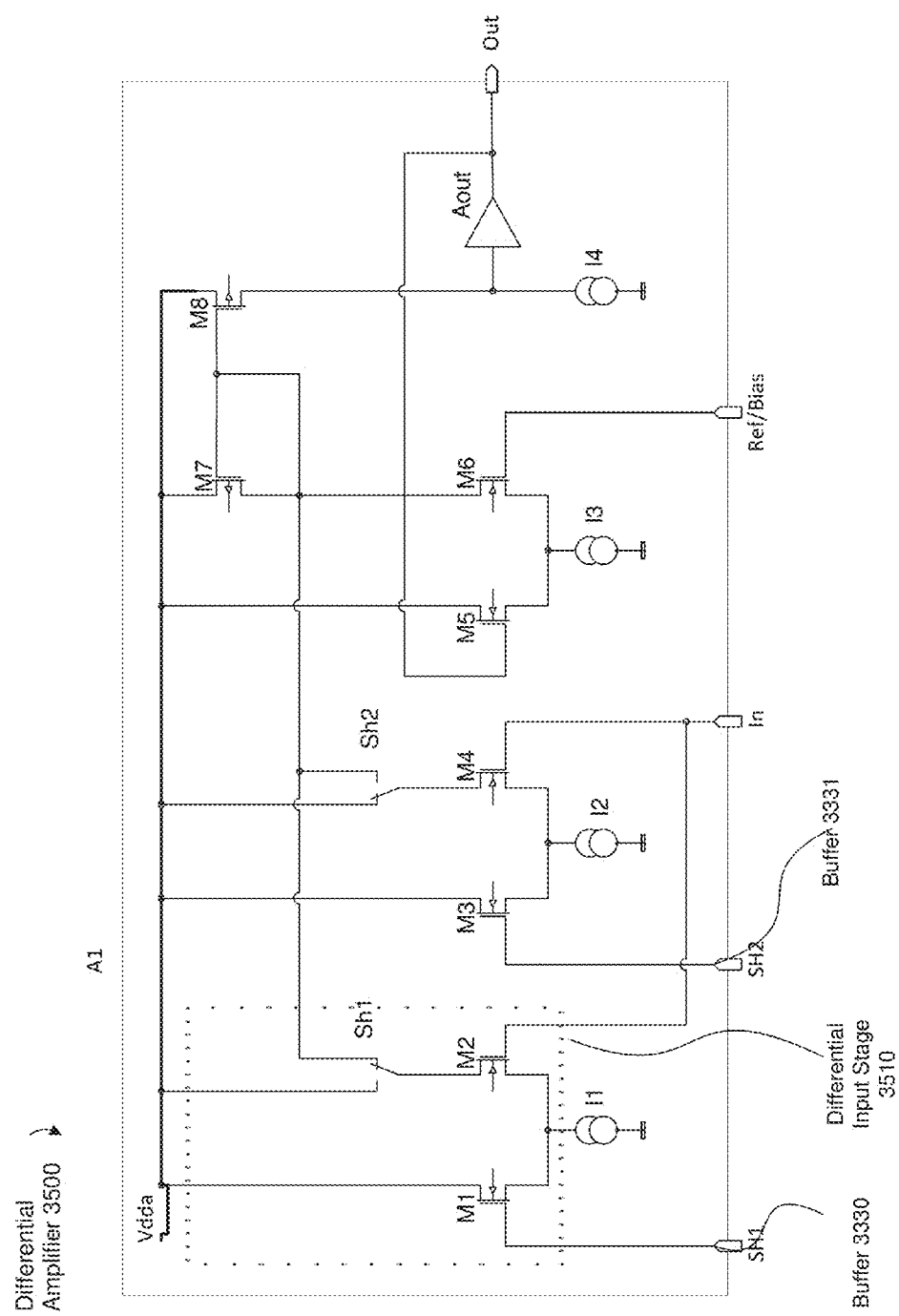
FIG. 35 illustrates an implementation of a buffer, according to another embodiment.

FIG. 35 illustrates an implementation of a buffer, according to another embodiment. Differential amplifier 3500 (A1) contains an additional differential stage. The inverting input of these differential input stages (the gate of transistors M1 and M3) forms the amplifier A1 sampling inputs SH1 and SH2. The transistor gates on the opposite legs of these stages (the gate of transistors M2 and M4) are connected to the amplifier non-inverting input, In. The drains of transistors M2 and M4 are the current output of the differential stage. The drains are connected to the supply or to the current mirror that is formed by transistors M7 and M8 through switches Sh1 and Sh2. Switches Sh1 and Sh2 alternately open and close, which allows connecting only one differential input stage to the current mirror when another stage is connected to supply voltage Vdda. This switching scheme allows for fast switching between the input stages because it prevents recharging of a parasitic capacitance in the transistor's drain node and keeps a continuous current flow via transistors.

In one embodiment, amplifier A1 contains a third differential stage. This stage keeps the amplifier A1 output offset equal to the voltage on the Ref/Bias input and performs a 100% feedback loop to guaranty the amplifier gain is equal to 1 by connecting the left leg transistor M5 gate to the amplifier output. The output current of this stage is applied to current mirror M7 and M8. As such, the output stage, Aout, transfers to the amplifier output a sum of signals of the difference between the incoming signal on the node In and the holding voltage on the T&H capacitor and of the difference between the offset voltage that is applied to Ref/Bias input and the amplifier A1 output voltage. Current sources I1 . . . I4 generate even currents. A mismatch of these currents leads to an offset of the voltage on the input (In).

In one embodiment, the buffering of one of the first sample-sample hold capacitors or the second sample-hold capacitor (not shown, e.g., sample-hold capacitor 1501 or sample-hold capacitor 1502) with a differential input stage 3510 of the differential amplifier 3500.

At least the following methods (method 3600, 3800, 4000, 4200, 4300, and 4400) may be performed by processing logic (e.g., processing logic 102) that may include hardware (circuitry, dedicated logic, etc.), software (such as is run on a general purpose computing system or a dedicated machine), firmware (embedded software), or any combination thereof. In one embodiment, the processing device 110 performs some or all of each method disclosed above. In another embodiment, charge balancing converter 120 performs some or all of each method. In another embodiment, the application processor 150 performs some or all of the operations each method. In another embodiment, processing core 109 performs some or all of each method. Alternatively, other components of the electronic system 100 or capacitive touch sensing system 200 perform some or all of the operations of each method.

It should be noted that on or more of differential amplifiers in the present disclosure may be unity gain differential amplifiers. It also should be noted that one or more of buffers in the present disclosure may be a unity gain buffer.

Figure 36:
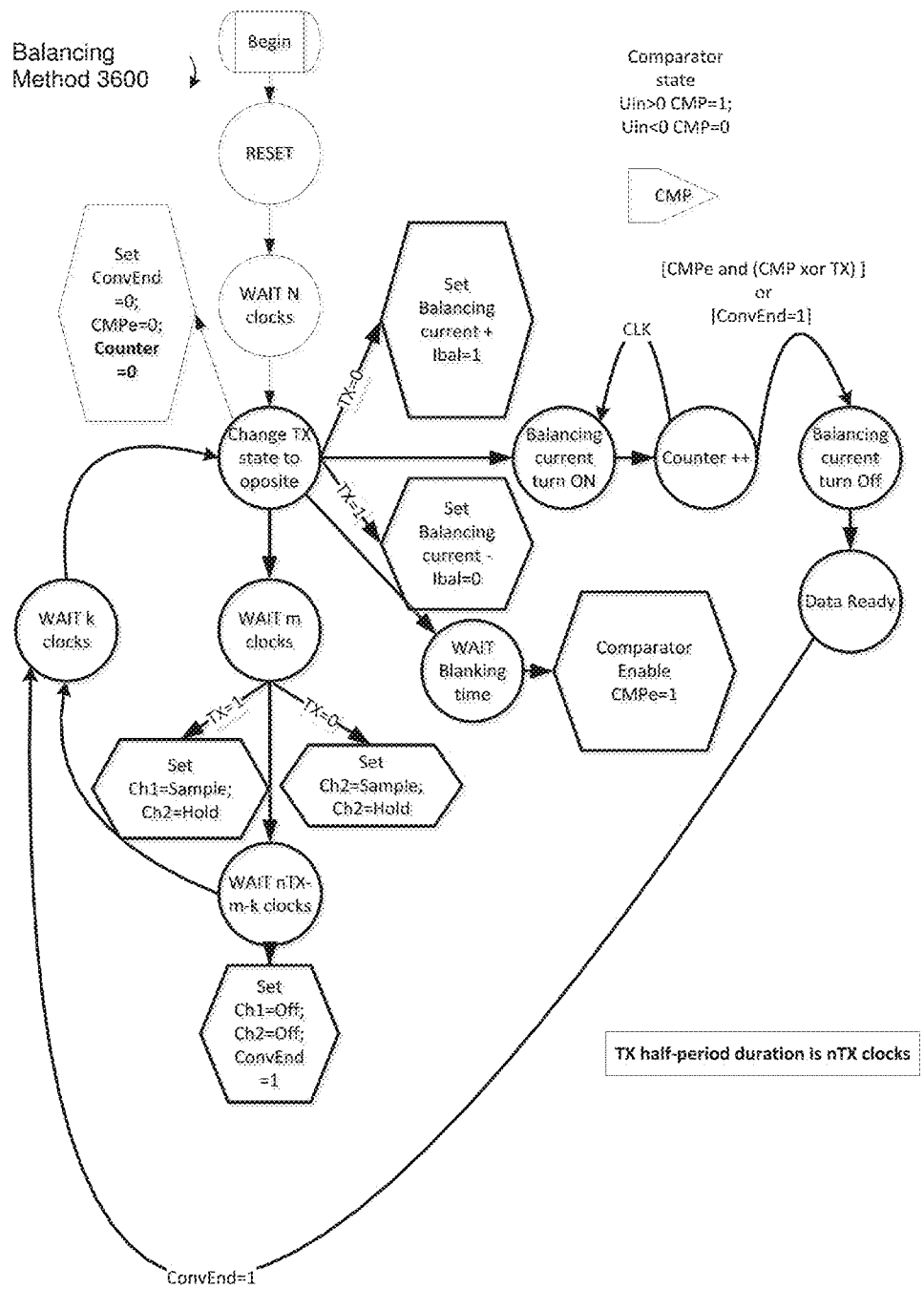
FIG. 36 is a flowchart illustrating a balancing method, according to one embodiment.

FIG. 36 is a flowchart illustrating a balancing method, according to one embodiment. Balancing method 3600 begins with processing logic 102 performing the channel operation at the Reset stage. The sample and hold capacitors (e.g., sample-hold capacitor 1501 (Ch1) and sample-hold capacitor 1502 (Ch2)) are reset and all the RX line parasitic capacitances (e.g., self-capacitance of electrode 315) are charged to the bias voltage during this stage. The reset stage continues for N system clocks (e.g., clock 437). After waiting N clock, balancing method 3600 moves to the subsequent block where control logic toggles the TX signal (e.g., TX signal 435). The algorithm branches at this point.

One branch shows the error correction circuit (e.g., error correction circuit 320) control procedure (the branch that is directed down). Another branch, whose direction is horizontal, shows the procedure of the balancing current direction control and the balancing duration counting (e.g., current generator 350 supplies the balancing current). Both branches may be performed by processing logic 102.

Figure 37:
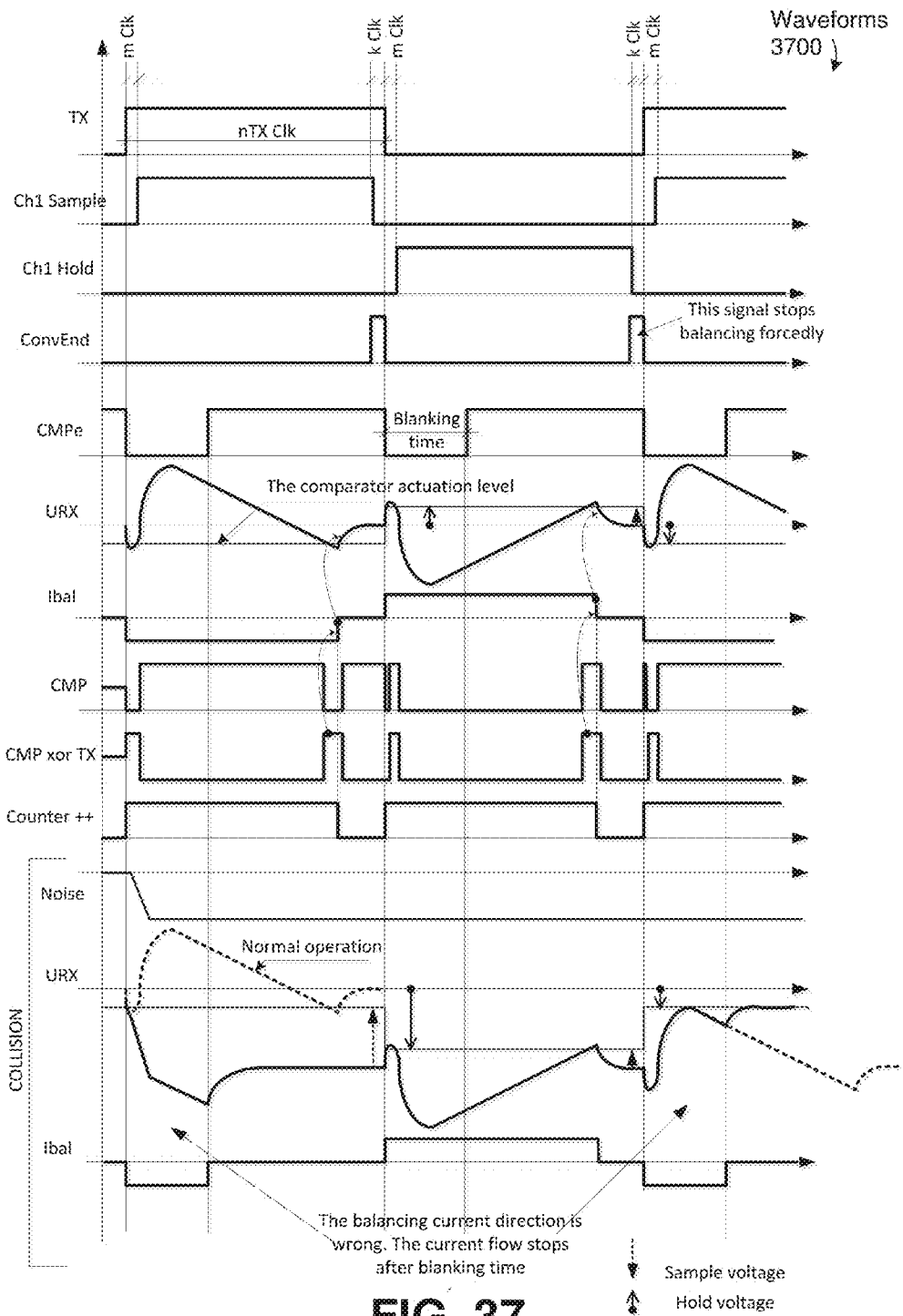
FIG. 37 shows waveforms illustrating the method in FIG. 36, according to one embodiment.

Processing logic 102 performs the error correction circuit control procedure. Error correction circuit control procedure switches capacitors Ch1 and Ch2 (e.g., sample-hold capacitor 1501 (Ch1) and sample-hold capacitor 1502 (Ch2)) between the Sample and Hold state in the opposite phase. The capacitors, Ch1 and Ch2, are switched on into the appropriate mode with a delay of m clocks after the TX edge, and turned off n clocks before the following TX edge (see FIG. 37). FIG. 37 shows waveforms illustrating the method in FIG. 36, according to one embodiment. Waveforms 3700 will be used to help describe FIG. 36. Signal ConvEnd indicates the end of a conversion and is activated simultaneously with turning off the sample and hold capacitors. The balancing is stopped forcibly when the ConvEnd signal becomes active. This logic is the same in all the balancing options.

The balancing current direction is defined by the TX signal (e.g., TX signal 435) state after the TX edge. The balancing current is turned on simultaneously with the TX edge. The first toggle of the comparator (e.g., comparator 330) state stops the balancing process and the balancing duration counting (e.g., performed by counter 470). As a result, the algorithm passes to the state where the balancing current (e.g. from current generator 350) is turned off. The conversion result is ready after that (e.g., digital value 360).

There is an additional branch that prevents a reaction to the comparator state after the TX edge during the Blanking time. Usually the Blanking time duration is around a quarter of the TX pulse duration. The waveforms of the Blanking signal (CMPe), voltage on the RX line (Urx), balancing current (Ibal), comparator output (CMP), the decision function to stop balancing (CMP xor TX), and counting duration in a normal operation are collected as illustrated in FIG. 37. The arrows on the Urx waveform show the sampled voltage at the end of a conversion (dashed line) and the voltage held after the following TX edge (the solid line).

The large amplitude noise which is in phase with the TX signal (e.g., TX signal 435) may require balancing the incoming charge for a longer time than the TX pulse duration. In this case, the balancing is forcibly stopped with ConvEnd signal. The unbalanced charge will be balanced in the following conversion cycles.

The direct relation of the balancing current direction and the decision to stop balancing based on the TX signal state can produce a collision. The collision appears when the large amplitude noise with a phase opposite to the TX signal occurs during a conversion (see the bottom waveforms on FIG. 37). The balancing current may actually increase the voltage swing caused by the noise. At the end of the Blanking time the comparator output state reports the balancing complete, so the balancing current is turned off. As a result, a large unbalanced voltage is present at the conversion end. Thus, the following conversion is executed with the operation point is shifted significantly. It should be noted however that this unbalanced charge will be balanced after several conversions. Collisions may cause variations of the operation point in noise operating conditions.

Figure 38:
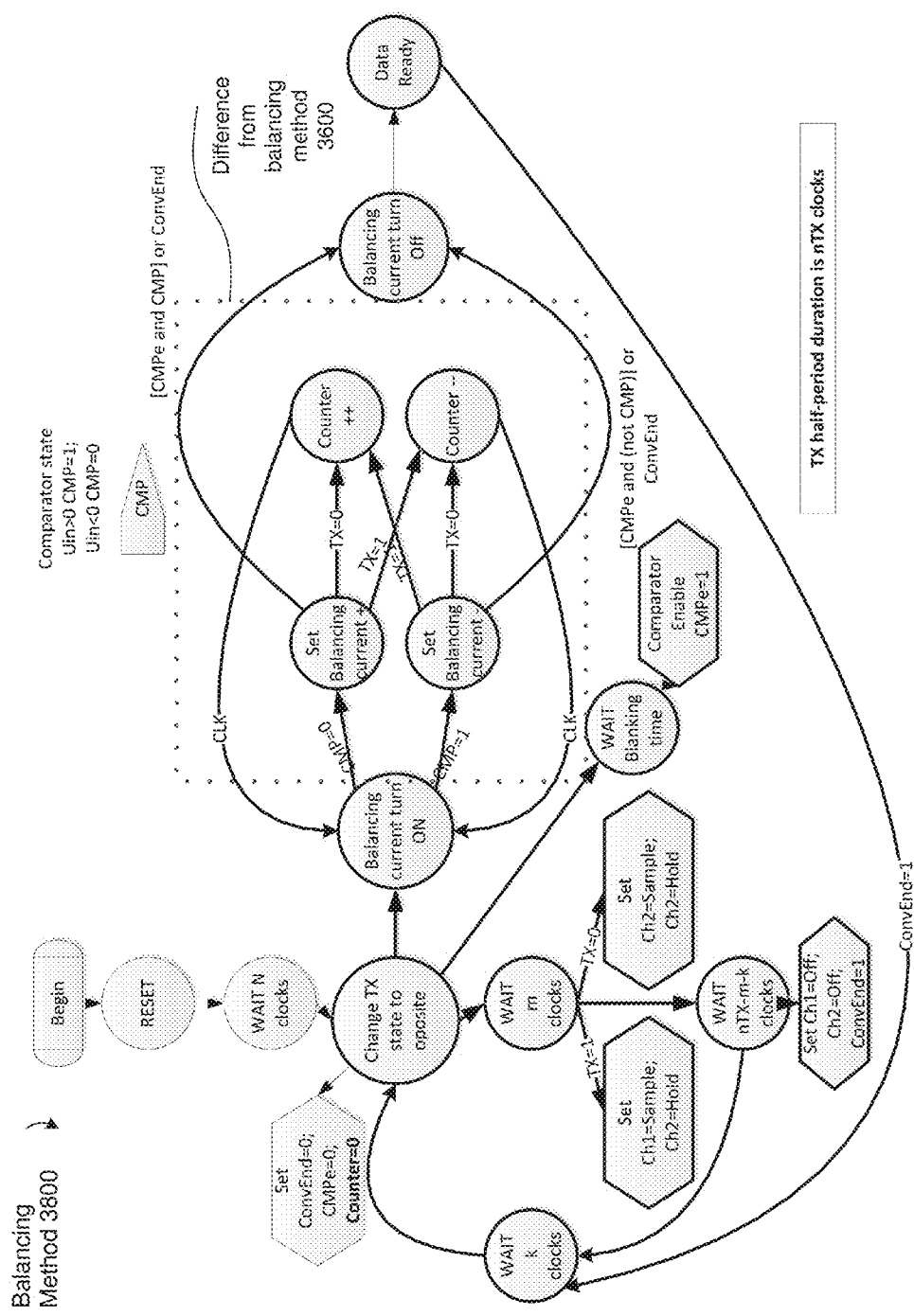
FIG. 38 is a flowchart illustrating a balancing method, according to another embodiment.

FIG. 38 is a flowchart illustrating a balancing method, according to another embodiment. Balancing method 3800 helps to solve the collision discussed in regards to FIG. 36 and FIG. 37. In balancing method 3600 of FIG. 36, collisions occur when the balancing current direction is improperly related to the voltage on the RX line. The collision may be avoided by having the balancing current (from e.g., current generator 350) direction defined by the comparator (e.g., comparator 330) output state, so the balancing logic (e.g., processing logic 102) should keep the voltage on the RX line close to the comparator tripping voltage. But in this case it is necessary for processing logic 102 to change the logic for counting the balancing time. When the balancing current direction matches with the direction that balances the incoming charge generated by the TX excitation (e.g., TX signal 435) (a normal operation), then the balancing time count should be increased. Otherwise the balancing time count should be decreased while the balancing current direction is opposite to the direction in normal operation. This procedure is named continuous balancing. When the incoming charge, which is collected on the sensor becomes close to zero, the balancing logic (e.g., processing logic 102) will generate bipolar balancing currents (e.g., bipolar current) to keep the average charge close to zero. It is possible for processing logic 102 to keep this balancing till the following TX edge. The error correction circuit (e.g., error correction circuit 320) samples a transient voltage at the moment when the balancing current is turned off. When continuously balancing during the whole TX pulse, the converter (e.g., charge balancing converter 120) may lose the opportunity to accumulate the quantization error. In order not to lose the opportunity to accumulate the quantization error, processing logic 102 may execute continuous balancing from the TX edge till the first comparator toggle after the Blanking time. The Blanking time may be less than the normal time for a balancing operation. This modified continuous balancing allows a channel to operate like the balancing as described in balancing method 3600 with no noise and still solve the balancing collision in noisy conditions. The elements in a dashed box indicate the differences between balancing method 3600 and balancing method 3800.

In one embodiment, in accordance with balancing method 3800 current generator 350 balances charge on the passive integrator circuit 310. Current generator 350 performs one of at least sinking or sourcing charge to the passive integrator circuit. Control unit 340 controls the current generator 350 based on a transmission (TX) signal and on at least one of the comparator output of the comparison, a blanking signal, an end of a conversion, or a stop signal.

In one embodiment, current generator 350 applies a bipolar current to the passive integrator circuit 310 for duration less than a half-period of a transmission (TX) signal.

Figure 39:
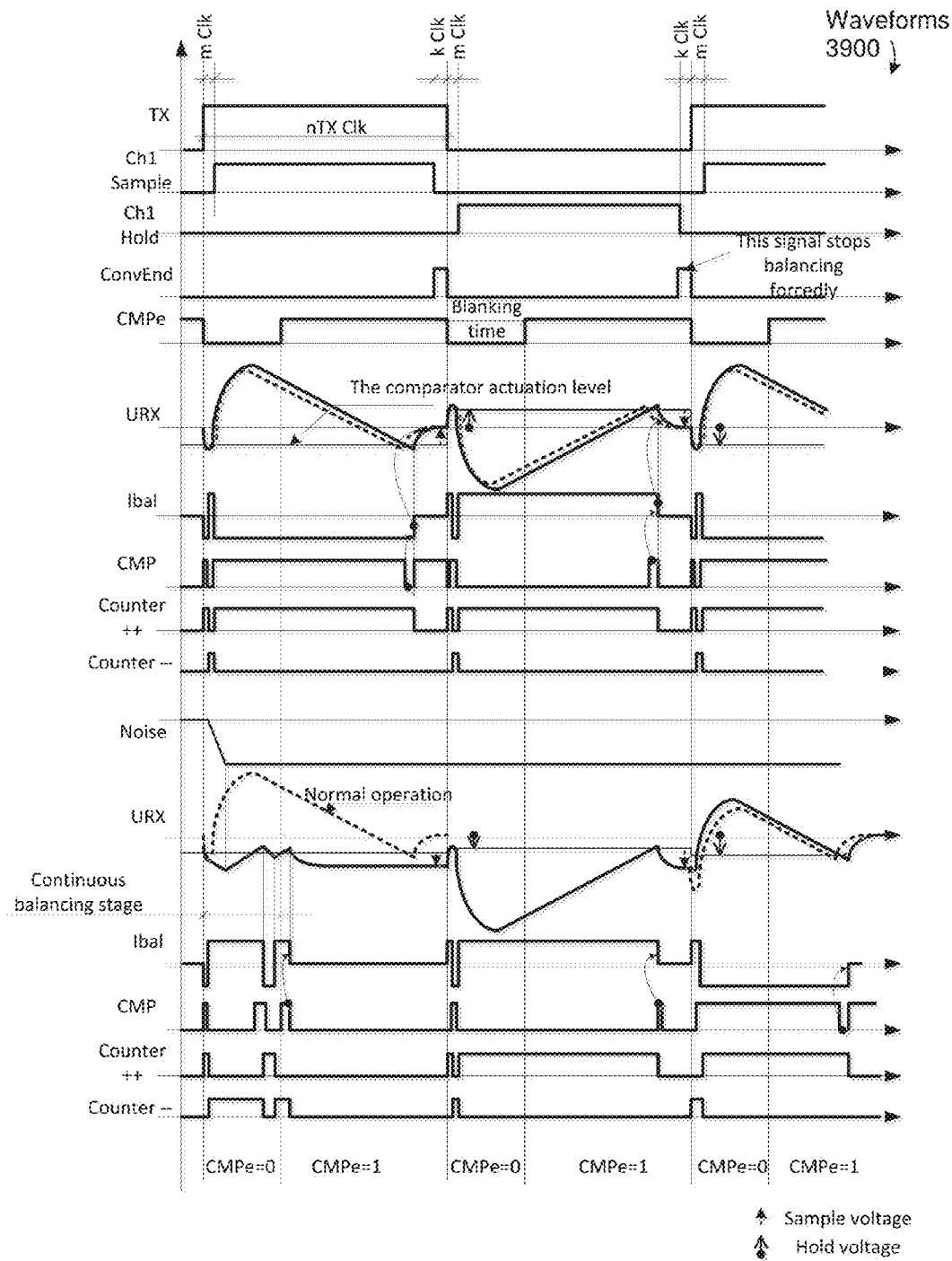
FIG. 39 shows waveforms illustrating the method in FIG. 38, according to one embodiment.

FIG. 39 shows waveforms illustrating the method in FIG. 38, according to one embodiment. Waveforms 3900 will be used to help describe FIG. 38. Balancing method 3800 may a converter based on a passive integrator circuit to suffer inaccuracies due to noise rectification. Noise rectification appears because the error correction circuit (e.g., error correction circuit 320) samples incomplete settling transient voltages caused by the balancing current turning off. However, noise rectification may be controlled if complete settling of the transient voltages under all the conditions is guaranteed. In view that the settling time of the voltage on the RX line after the balancing current turns off is defined by the RX line time constant, a minimal value of the pause before the sampling may be defined as three RX line time constants. This time will be name the RX line settling time. In view of the aforementioned, it becomes important to implement the ability to turn off the balancing current forcibly before sampling when the balancing process pauses.

Figure 40:
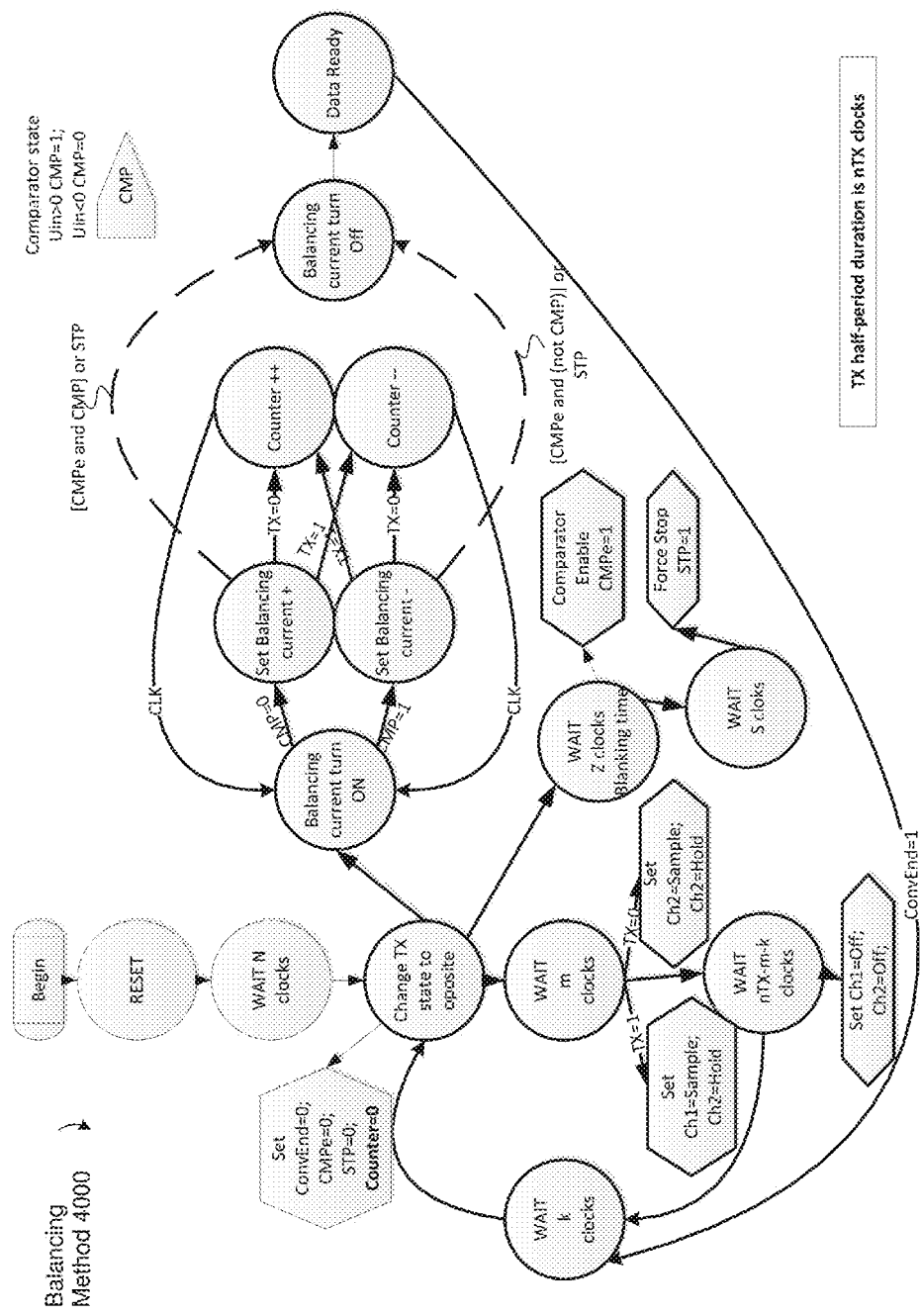
FIG. 40 is a flowchart illustrating a balancing method, according to another embodiment.

FIG. 40 is a flowchart illustrating a balancing method, according to another embodiment. The differences in balancing method 4000, marked with dashed lines, from the preceding methods enable balancing method 4000 to eliminate noise rectification. In balancing method 4000, an additional wait state during S clocks after the Blanking time and the modified condition of the balancing procedure stopping has been added. Balancing method 4000 allows processing logic 102 to forcibly stop balancing after a wait of Z+S clocks (the signal STP). In this case, processing logic 102 causes a pause before sampling for nTX-Z-S clocks. Processing logic 102 sets the balancing current value in such a way that the balancing procedure in normal conditions finishes earlier than the STP signal asserts.

In one embodiment, in accordance with balancing method 4000 current generator 350 balances charge on the passive integrator circuit 310. Current generator 350 performs one of at least sinking or sourcing charge to the passive integrator circuit. Control unit 340 controls the current generator 350 based on a transmission (TX) signal and on at least one of the comparator output of the comparison, a blanking signal, an end of a conversion, or a stop signal.

In one embodiment, current generator 350 applies a bipolar current to the passive integrator circuit 310 for duration less than a half-period of a transmission (TX) signal.

Figure 41:
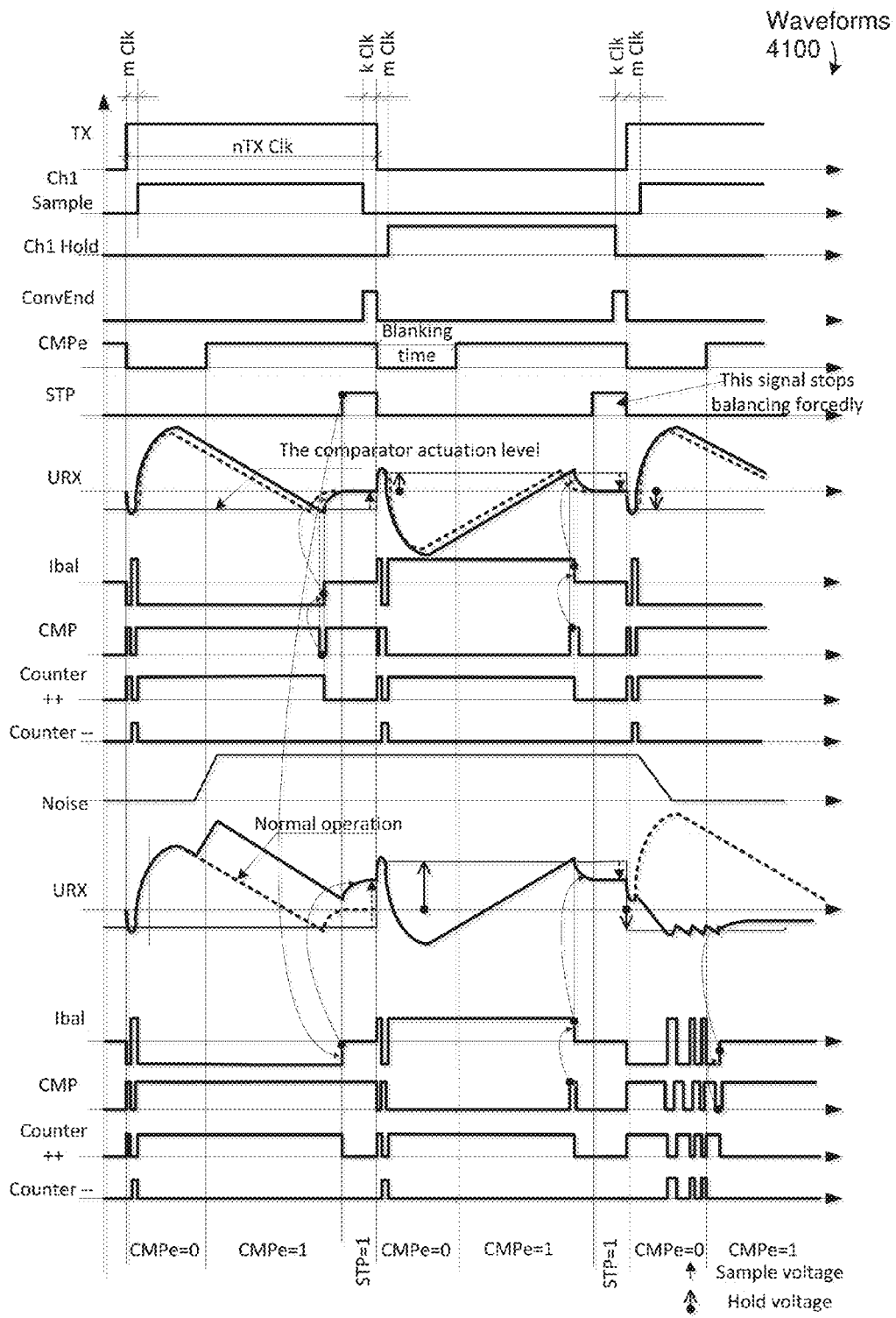
FIG. 41 shows waveforms illustrating the method in FIG. 40, according to one embodiment.

FIG. 41 shows waveforms illustrating the method in FIG. 40, according to one embodiment. Waveforms 4100 will be used to help describe FIG. 40 and balancing method 4000. As illustrated by waveforms 4100, the bottom waveforms that contain Urx shows the condition where noise in phase with the TX causes a forced stop to the balancing (first TX pulse), followed by a normal pulse (no noise), and then by noise that is out of phase with the TX, leading to an early end to balancing shortly after the Blanking time (third TX pulse).

Figure 42:
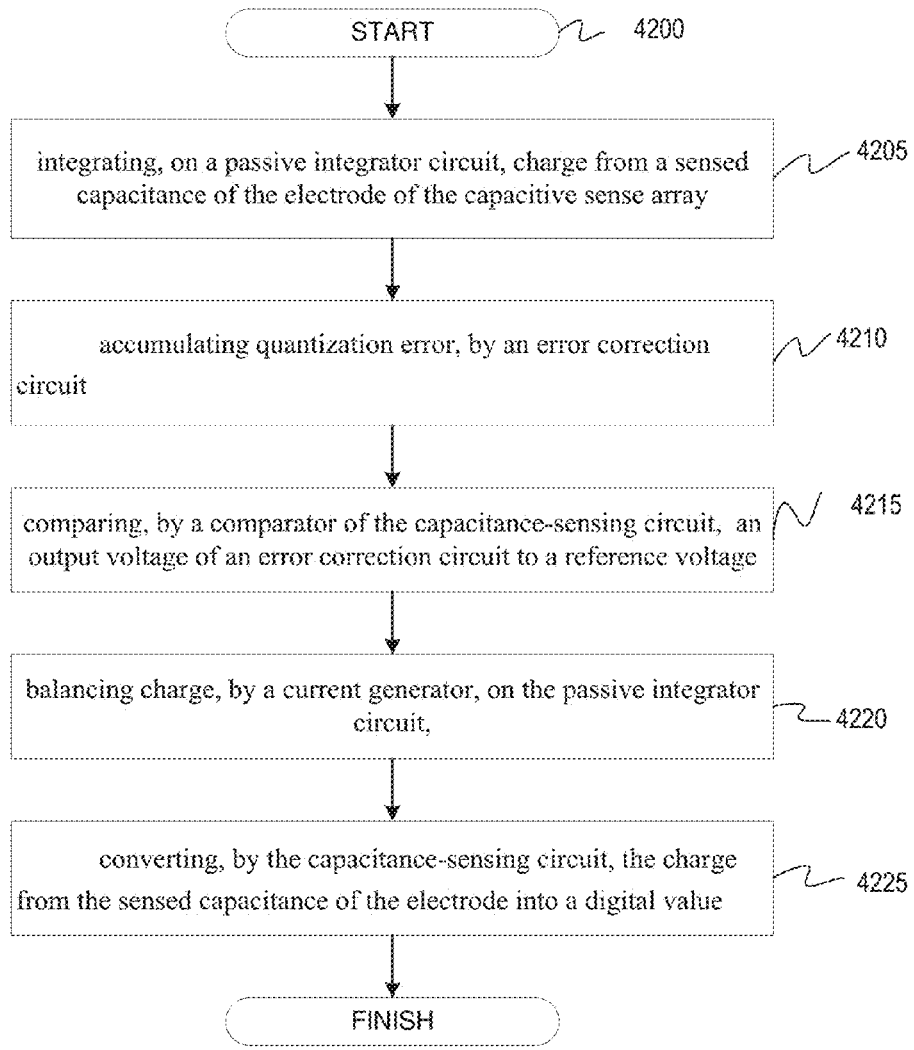
FIG. 42 is a flowchart illustrating a method of capacitance sensing, according to one embodiment.

FIG. 42 is a flowchart illustrating a method of capacitance sensing, according to one embodiment. Method 4200 starts at block 4205 where processing logic 102 performs, by capacitance sensing circuit 101, capacitance sensing of an electrode (e.g., electrode 312) of a capacitive sense array 125 of electrodes. In performing of capacitance sensing includes integrating, on a passive integrator circuit 310, charge from a sensed capacitance (e.g., sensed capacitance 313) of the electrode (e.g., electrode 312) of the capacitive sense array 125. As part of integration, the passive integrator circuit 310 integrates the charge on a self-capacitance of the electrode 315.

Method 4200 continues to block 4210 where processing logic 102 accumulates quantization error, by an error correction circuit (e.g., error correction circuit 320) of the capacitance-sensing circuit 101, from the conversion of the charge from the sensed capacitance (e.g., sensed capacitance 313) of the electrode (e.g., electrode 312) into the digital value 360. The accumulation of quantization error will be further discussed in FIGS. 43 and 44.

Method 4200 continues to block 4215 where processing logic 102 compares, by a comparator (e.g., comparator 330) of the capacitance-sensing circuit 101, an output voltage of an error correction circuit (e.g., error correction circuit 320) to a reference voltage. The comparator produces a comparator output based on the comparison. The comparator is coupled to the passive integrator circuit 310.

Method 4200 continues to block 4220 where processing logic 102 balances charge, by a current generator 350, on the passive integrator circuit 310. The current generator 350 performs one of at least sinking or sourcing charge to the passive integrator circuit 310. A control unit 340 controls the current generator 350 based on a transmission (TX) signal and on at least one of the comparator output of the comparison, a blanking signal, an end of a conversion, or a stop signal. A method of balancing is further discussed in FIGS. 36-41.

In one embodiment, balancing charge on the passive integrator circuit 310 includes applying a bipolar current to the passive integrator circuit 310 for a duration less than half-period of a transmission (TX) signal.

Method 4200 continues to block 4225 where processing logic 102 converts, by the capacitance-sensing circuit 101, the charge from the sensed capacitance of the electrode 315 into a digital value 360 representing the sensed capacitance of the electrode.

Figure 43:
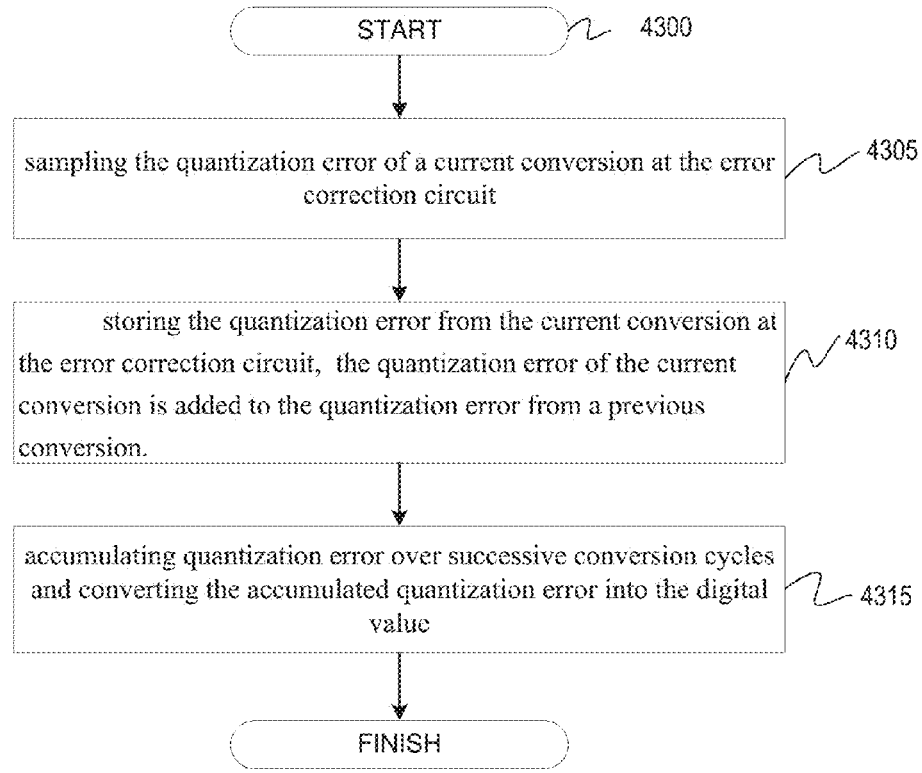
FIG. 43 is a flowchart illustrating a method of accumulating quantization error, according to one embodiment.

FIG. 43 is a flowchart illustrating a method of accumulating quantization error, according to one embodiment. Method 4300 starts at block 4305 where the error correction circuit (e.g., error conversion circuit 320) samples the quantization error of a current conversion. A conversion may be the conversion of the charge form a sensed capacitance 313 of the electrode into a digital value 360. Method 4300 continues to block 4310 where quantization error from the current conversion is stored at the error correction circuit (e.g., error conversion circuit 320). The quantization error of the current conversion is added to the quantization error from a previous conversion. Method 4300 continues to block 4315 where the quantization error is accumulated over successive conversion cycles. Processing logic 102 converts the accumulated quantization error into the digital value 360. Part or all of the above method 4300 may be performed by processing logic 102.

Figure 44:
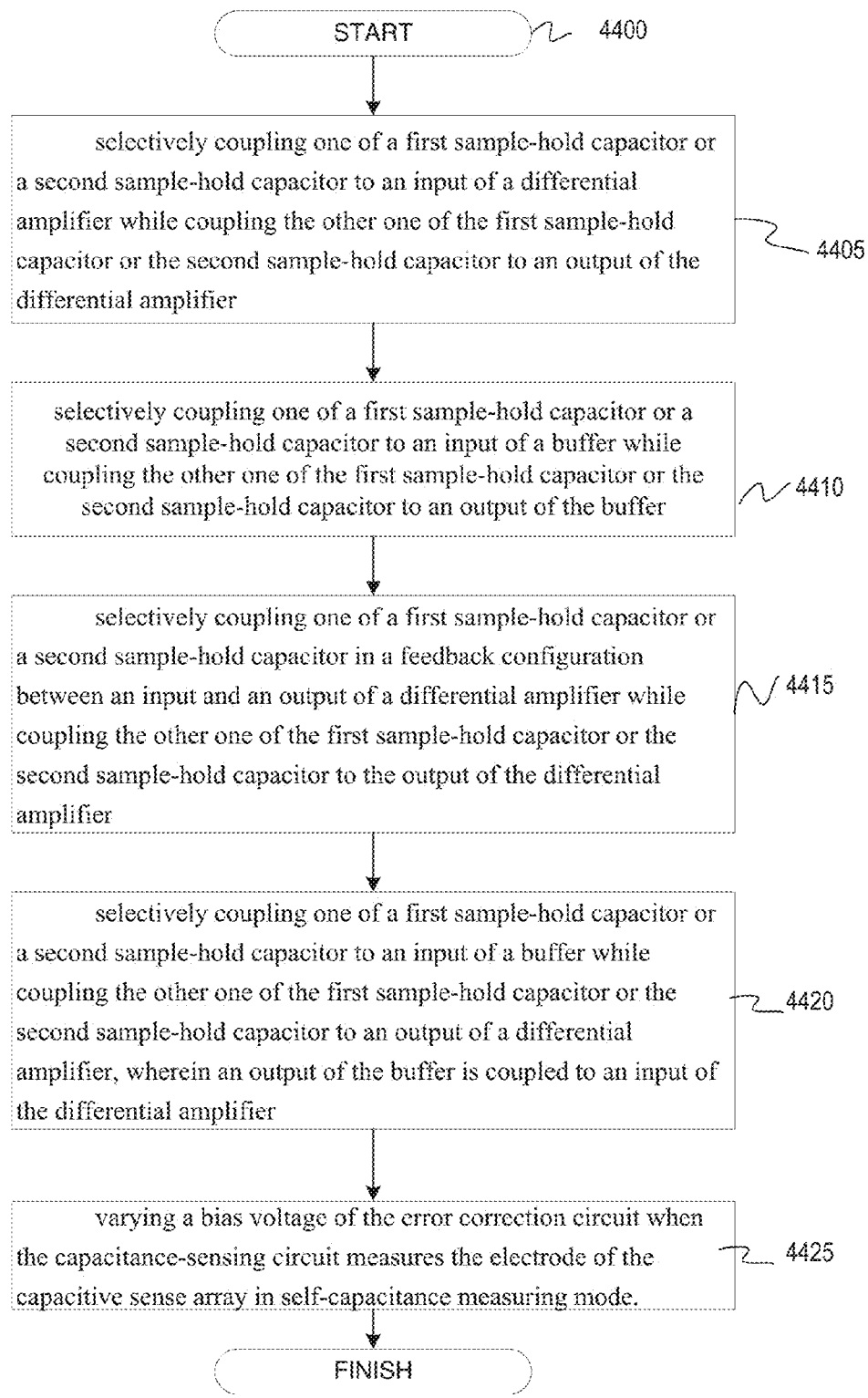
FIG. 44 is a flowchart illustrating a method of accumulating quantization error by an error correction circuit, according to another embodiment.

FIG. 44 is a flowchart illustrating a method of accumulating quantization error by an error correction circuit, according to another embodiment. Method 4400 starts at block 4405, where processing logic 102 selectively couples one of a first sample-hold capacitor or a second sample-hold capacitor (e.g., sample-hold capacitor 1501 or sample-hold capacitor 1502) to an input of a differential amplifier 1521 while coupling the other one of the first sample-hold capacitor or the second sample-hold capacitor to an output of the differential amplifier 1522. Block 4405 is described further in conjunction with the circuit in FIG. 15.

Method 4400 continues to block 4410 where processing logic 102 selectively couples one of a first sample-hold capacitor or a second sample-hold capacitor (e.g., sample-hold capacitor 1501 or sample-hold capacitor 1502) to an input of a buffer 2121 while coupling the other one of the first sample-hold capacitor or the second sample-hold capacitor to an output of the buffer 2122. Block 4410 is described further in conjunction with the circuit in FIG. 21.

Method 4400 continues to block 4415 where processing logic 102 selectively couples one of a first sample-hold capacitor or a second sample-hold capacitor (e.g., sample-hold capacitor 1501 or sample-hold capacitor 1502) in a feedback configuration between an input and an output of a differential amplifier (e.g., differential amplifier 3110) while coupling the other one of the first sample-hold capacitor or the second sample-hold capacitor to the output of the differential amplifier. Block 4415 is described further in conjunction with the circuit in FIGS. 30 and 31.

Method 4400 continues to block 4420 where processing logic 102 selectively couples one of a first sample-hold capacitor or a second sample-hold capacitor (e.g., sample-hold capacitor 1501 or sample-hold capacitor 1502) to an input of a buffer (e.g., buffer 3330) while coupling the other one of the first sample-hold capacitor or the second sample-hold capacitor to an output of a differential amplifier (e.g., differential amplifier 3320), wherein an output of the buffer is coupled to an input of the differential amplifier. Block 4420 is described further in conjunction with the circuit in FIG. 33.

Method 4400 continues to block 4420 where processing logic 102 varies a bias voltage (e.g., through bias voltage modulator 2412) of the error correction circuit (e.g., error correction circuit 320) when the capacitance-sensing circuit 101 measures the electrode (e.g., electrode 312) of the capacitive sense array 125 in self-capacitance measuring mode. It should be noted that different error correction circuits may be used. Block 4420 is described further in conjunction with FIGS. 23-25.

For simplicity of explanation, the above methods are depicted and described as a series of acts. Although the operations of the methods herein are shown and described in a particular order, such order does not mean that such operations are necessarily performed in that order. Operations in accordance with this disclosure can occur in various orders and/or concurrently, and with other acts not presented and described herein. Certain operations may be performed, at least in part, concurrently with other operations and certain operations may be performed in an inverse order to that shown or described.

The methods described above regarding capacitance to code conversion can be implemented by the charge to code converter 120, which may be implemented in a capacitive touch screen controller. In one embodiment, the capacitive touch screen controller is the TrueTouch® capacitive touch-screen controller, such as the CY8CTMA3xx family of True-eTouch® Multi-Touch All-Points touchscreen controllers, developed by Cypress Semiconductor Corporation of San Jose, Calif. The TrueTouch® capacitive touchscreen controllers sensing technology to resolve touch locations of multiple fingers and a stylus on the touch-screens, supports operating systems, and is optimized for low-power multi-touch gesture and all-point touchscreen functionality. Alternatively, the touch position calculation features may be implemented in other touchscreen controllers, or other touch controllers of touch-sensing devices. In one embodiment, the touch position calculation features may be implemented with other touch filtering algorithms as would be appreciated by one of ordinary skill in the art having the benefit of this disclosure.

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "integrating," "comparing," "balancing," "measuring," "performing," "accumulating," "controlling," "converting," "accumulating," "sampling," "storing," "coupling," "varying," "buffering," "applying," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   at a capacitance-sensing circuit electrically coupled to a capacitive sense array of electrodes and including a current generator:
   performing capacitance sensing of an electrode of the capacitive sense array of electrodes, including:
   configuring a passive integrator circuit to include a first capacitor associated with a self-capacitance of the electrode, wherein the first capacitor is formed between the electrode and a ground;
   balancing by the current generator charge integrated on the passive integrator circuit; and
   sensing the charge integrated on the passive integrator circuit, wherein the sensed charge is indicative of a sensed capacitance associated with at least one of the self-capacitance and a mutual capacitance of the electrode; and
   converting the sensed charge indicative of the sensed capacitance of the electrode into a digital value, wherein the digital value corresponds to a length of time for balancing the charge integrated on the passive integrator circuit and associated with the sensed capacitance of the electrode.

2. The method of claim 1, further comprising accumulating quantization error, by an error correction circuit of the capacitance-sensing circuit, from the conversion of the charge indicative of the sensed capacitance of the electrode into the digital value.

3. The method of claim 2, wherein the accumulating of quantization error further comprises
   accumulating quantization error over successive conversion cycles and converting the accumulated quantization error into the digital value, wherein a conversion cycle comprises one cycle of integrating charge indicative of the sensed capacitance.

4. The method of claim 2, wherein accumulating quantization error further comprises:
   sampling the quantization error of a current conversion at the error correction circuit; and
   storing the quantization error from the current conversion at the error correction circuit, wherein the quantization error of the current conversion is added to the quantization error from a previous conversion.

5. The method of claim 4, wherein the sampling and storing of the quantization error is performed by a first sample-hold capacitor and a second sample-hold capacitor of the error correction circuit.

6. The method of claim 2, wherein accumulating quantization error further comprises
   selectively coupling one of a first sample-hold capacitor or a second sample-hold capacitor to an input of a differential amplifier while coupling the other one of the first sample-hold capacitor or the second sample-hold capacitor to an output of the differential amplifier, wherein the error correction circuit comprises the first sample-hold capacitor, the second sample-hold capacitor, and the differential amplifier.

7. The method of claim 2, wherein accumulating quantization error further comprises
   selectively coupling one of a first sample-hold capacitor or a second sample-hold capacitor to an input of a buffer while coupling the other one of the first sample-hold capacitor or the second sample-hold capacitor to an output of the buffer, wherein the error correction circuit comprises the first sample-hold capacitor, the second sample-hold capacitor, and the buffer.

8. The method of claim 2, further comprising
   varying a bias voltage of the error correction circuit when the capacitance-sensing circuit measures the electrode of the capacitive sense array in self-capacitance measuring mode.

9. The method of claim 8, wherein the bias voltage is coupled to the error correction circuit and a transmission (TX) input of the capacitive sense array.

10. The method of claim 2, wherein accumulating quantization error further comprises
    selectively coupling one of a first sample-hold capacitor or a second sample-hold capacitor in a feedback configuration between an input and an output of a differential amplifier while coupling the other one of the first sample-hold capacitor or the second sample-hold capacitor to the output of the differential amplifier, wherein the error correction circuit comprises the first sample-hold capacitor, the second sample-hold capacitor, and the differential amplifier.

11. The method of claim 2, wherein accumulating quantization error further comprises
    selectively coupling one of a first sample-hold capacitor or a second sample-hold capacitor to an input of a buffer while coupling the other one of the first sample-hold capacitor or the second sample-hold capacitor to an output of a differential amplifier, wherein an output of the buffer is coupled to an input of the differential amplifier, wherein the error correction circuit comprises the first sample-hold capacitor, the second sample-hold capacitor, the buffer, and the differential amplifier.

12. The method of claim 1, wherein the capacitance-sensing circuit performs capacitance sensing of the electrode of the capacitive sense array in a mutual capacitance sensing mode.

13. The method of claim 1, wherein the performing the capacitance sensing further comprises:
    comparing, by a comparator of the capacitance-sensing circuit, an output voltage of an error correction circuit to a reference voltage, the comparator to produce a comparator output based on the comparison, wherein the comparator is coupled to the passive integrator circuit;
    balancing the charge, by the current generator, integrated on the passive integrator circuit, wherein the current generator performs one of at least sinking or sourcing charge to the passive integrator circuit; and
    controlling, by a control unit coupled to the comparator and the current generator, the current generator based on a transmission (TX) signal sent by the control unit to a TX input and on at least one of the comparator output of the comparison, a blanking signal, an end of a conversion, or a stop signal.

14. The method of claim 1, wherein balancing the charge integrated on the passive integrator circuit further comprises
    applying, by the current generator, a bipolar current to the passive integrator circuit for a duration less than a half-period of a transmission (TX) signal, wherein the TX signal is an periodic waveform.

15. The method of claim 1, wherein the passive integrator circuit is external to the capacitance-sensing circuit.

16. The method of claim 1, wherein the self-capacitance of the electrode comprises parasitic capacitance from an electrode plate of the electrode to an output terminal of the electrode.

17. An apparatus comprising
a capacitance-sensing circuit electrically coupled to capacitive sense array of electrodes and including a current generator, wherein the capacitance-sensing circuit is configured to:
  perform capacitance sensing of an electrode of the capacitive sense array of electrodes, including:
    configuring a passive integrator circuit to include a first capacitor associated with a self-capacitance of the electrode, wherein the first capacitor is formed between the electrode and a ground;
    balancing by the current generator charge integrated on the passive integrator circuit; and
    sensing the charge, integrated on the passive integrator circuit, wherein the sensed charge is indicative of a sensed capacitance associated with at least one of the self-capacitance and a mutual capacitance of the electrode; and
  convert the sensed charge indicative of the sensed capacitance of the electrode into a digital value, wherein the digital value corresponds to a length of time for balancing the charge integrated on the passive integrator circuit and associated with the sensed capacitance of the electrode.

18. The apparatus of claim 17, wherein the capacitance-sensing circuit further comprises
an error correction circuit to accumulate quantization error from the conversion of the charge indicative of the sensed capacitance of the electrode into the digital value, wherein the error correction circuit is to accumulate quantization error over successive conversion cycles, a conversion cycle comprises one cycle of integrating charge from a sensed capacitance and converting the charge into the digital value.

19. A system comprising:
a capacitive sense array, the capacitive sense array comprising a plurality of electrodes, wherein a first capacitor is formed between an electrode of the plurality of electrodes and a ground, associated with a self-capacitance of the electrode, and configured to become part of a passive integrator circuit, and wherein the passive integrator circuit is used to integrate charge indicative of a sensed capacitance associated with at least one of the self-capacitance and a mutual capacitance of the electrode; and
a capacitance-sensing circuit coupled to the capacitive sense array and including a current generator, wherein the capacitance-sensing circuit is configured to:
  balance by the current generator the charge integrated on the passive integrator circuit,
  sense the integrated charge on the passive integrator circuit, and
  convert the integrated charge into a digital value, wherein the digital value corresponds to a length of time for balancing the charge integrated on the passive integrator circuit and associated with the sensed capacitance of the electrode.

20. The system of claim 19, wherein the capacitance-sensing circuit comprises an error correction circuit to accumulate quantization error from the conversion of the charge into the digital value.

* * * * *